US008673672B2

(12) United States Patent
Ting et al.

(10) Patent No.: US 8,673,672 B2
(45) Date of Patent: Mar. 18, 2014

(54) METHOD FOR MAKING CU2-XSE NANOPARTICLES AND METHOD FOR MAKING DEPOSITED CU2-XSE THIN FILM BY ELECTROPHORESIS

(75) Inventors: Chu-Chi Ting, Minhsiung Township (TW); Wen-Yuan Lee, Minhsiung Township (TW)

(73) Assignee: National Chung Cheng University, Minhsiung Township (TW)

( * ) Notice: Subject to any disclaimer, the term of this patent is extended or adjusted under 35 U.S.C. 154(b) by 0 days.

(21) Appl. No.: 13/547,301

(22) Filed: Jul. 12, 2012

(65) Prior Publication Data

US 2014/0017884 A1 Jan. 16, 2014

(51) Int. Cl.
*B05D 5/12* (2006.01)
*H01L 31/0264* (2006.01)

(52) U.S. Cl.
USPC ............. 438/57; 257/E31.008; 257/E31.015; 257/E31.027; 438/95

(58) Field of Classification Search
USPC ................ 257/E31.015, E31.027, E31.008; 438/57, 95; 136/256
See application file for complete search history.

(56) References Cited

U.S. PATENT DOCUMENTS

| 6,821,559 | B2 * | 11/2004 | Eberspacher et al. | ....... | 427/226 |
| 8,021,641 | B2 * | 9/2011 | Curtis et al. | ....... | 423/508 |
| 2011/0148248 | A1 * | 6/2011 | Landa | ....... | 310/306 |

OTHER PUBLICATIONS

Matsumoto, H. et al. Solar cells 11, 367(1984).
Oladeji, I. O. et al. Sol. Energy. Mater. Sol. Cells 61, 203(2000).
Vidyadharan Pillai, P. K. et al. Sol. Energy. Mater. Sol. Cells. 51, 47(1998).
Gordillo, G. et al. Sol. Energy. Mater. Sol. Cells. 77, 163(2003).
Sakurai, T. et al. Sol. Energy. Mater. Sol. Cells. 95, 227(2011).
Oda, Y. et al. Curr. Appl. Phys. 10, S146 (2010).
Bindu, K. et al. Sol. Energy. Mater. Sol. Cells. 76, 67(2003).
Deepa, K.C. et al. Sol. Energy. 83,964(2009).
Ruckh, M. et al. Sol. Energy. Mater. Sol. Cells. 41/42,335(1996).
Repins, I. et al, IEEE Photovoltaics Specialists Conference Record. 33 (2008).
Riha, S. C. et al. J. Am. Chem. Soc. 133, 1383(2011).
Wang, W. et al. J. Mater. Chem. 8, 2321(1998).
Liu, Y. et al. Mater. Res. Bull. 37, 209(2002).
Xie, Y. et al. Inorg. Chem. 41, 387(2002).
Zhang, A. et al. Mater. Chem. Phys. 124, 916(2010).
Grizdartov 1. Synth. Met. 63, 213(1994).
Pejova, B. et al. J. Solid State Chem. 158, 49(2001).

(Continued)

*Primary Examiner* — John C Ingham
(74) *Attorney, Agent, or Firm* — Fishman & Associates, LLC.

(57) ABSTRACT

In the present invention, copper(I) selenide ($Cu_{2-x}Se$) nanoparticles are fabricated by pyrolysis in an inert atmosphere. Uniformly dispersed $Cu_{2-x}Se$ particles are synthesized by altering Cu/Se ratio, the concentration of Se Precursors (TOP Se), reaction time and temperature. Analysis by inductively coupled plasma atomic emission spectroscopy (ICP-AES) of said Cu2-xSe nanoparticles reveals that the composition of the nanoparticles is Cu 1.95Se, wherein x=0.05. In addition, $Cu_{2-x}Se$ is dissolved in ethanol to deposit thin films by electrophoretical deposition (EPD) in an inert atmosphere, wherein a positive electrode and a negative electrode are employed. The positive electrode is made of stainless steel plate and the negative electrode is made of indium tin oxide on a glass substrate. Investigations on properties and surface morphology thereof in different electrophoretical conditions are carried out. The rate of EPD is found to significantly influence the quality of thin films.

9 Claims, 67 Drawing Sheets

(56) References Cited

OTHER PUBLICATIONS

Clement C. L. et al. Thin Solid Films 302, 12(1997).
Yan, Y. L. et al. Inorg. Chem. Commun. 6, 34(2003).
Dhanam, M. et al. Cryst. Growth 280, 425(2005).
Chen, W. S. et al. Appl. Phys., Lett. 46, 1095(1985).
Li, Y. Z. et al. J Compd. 505 623 (2010).
Okimura, H. et al. Thin Solid Films. 71, 53 (1980).
Hiramatsu, H. et al. J Appl Phys, 104, 113723 (2008).
Hu, Y. et al. J Cryst Growth, 297, 61 (2006).
Mane, R. S. et al. Vacuum, 80, 631 (2006).
Pathan, H. M. et al. Appl Surf Sci, 211 48 (2003).
Padam, G. K. Thin Solid Films, 150, L89 (1987).
Garcia, V. M. et al. J Cryst Growth, 203, 113 (1999).
Bhuse V. M. et al. Mater Chem Phys, 80, 82 (2003).
Lakshmi, M. et al. Thin Solid Films 370, 89(2000).
Jagminas, A. et al. J. Cryst. Growth 294, 343(2006).
Zhu, J. et al. J. Phys. Chem. B 104, 7344(2000).
Gosavi, S.R. et al. J. Alloy. Compd. 448, 344(2008).
Lalatonne, Y. et al. Nat. Mater. 3, 121(2004).
Yum, J. H. et al. J. Photochem. Photobiol. A-Chem. 173, 1(2005).
Leroy, P. et al. J. Colloid Interface Sci. 356, 442(2011).
Statkute, G. et al. J. Appl. Phys. 105, 113519(2009).
Hessel, C. M. et al. Nano Lett. 11, 2560(2011).
Nakazawa, T. et al. Thin Solid films 464, 360(2004).
Cover of Shionoya, S. et al. Phosphor Handbook (CRC Press, Boca Raton, 2006).
Relative pages of Shionoya, S. et al. Phosphor Handbook (CRC Press, Boca Raton, 2006).
Ma., J. et al. Mater. Lett. 56, 721(2002).
Firoz Hasan, S. M. et al. Sol. Energy. Mater. Sol. Cells 58, 349(1999).

* cited by examiner

METHOD FOR MAKING CU2-XSE NANOPARTICLES AND METHOD FOR MAKING DEPOSITED CU2-XSE THIN FILM BY ELECTROPHORESIS

BACKGROUND OF THE INVENTION

1. Field of the Invention

The present invention relates to method for making nanoparticles and method for making a thin film, and particularly to a method for making $Cu_{2-x}Se$ nanoparticles with photo-electrical properties and a method for making a deposited $Cu_{2-x}Se$ thin film by electrophoresis.

2. Description of the Prior Arts

Group II-VI and Group II-VI solar cells are named thin-film solar cells since they can be fabricated on flexible substrates, can be manufactured in quantity production and the quantity production is low-cost. The common thin-film solar cells include cadmium telluride (CdTe), as mentioned in Matsumoto, H. et al. *Solar cells* 11, 367 (1984), Oladeji, I. O. et al. *Sol. Energy. Mater. Sol. Cells* 61, 203 (2000), copper indium selenide (CIS), as mentioned in Vidyadharan Pillai, P. K. et al. *Sol. Energy. Mater. Sol. Cells.* 51, 47 (1998), Gordillo, G et al. *Sol. Energy. Mater. Sol. Cells.* 77, 163 (2003), and copper indium gallium selenide (CIGS), as mentioned in Sakurai, T. et al. *Sol. Energy. Mater. Sol. Cells.* 95, 227 (2011), Oda, Y. et al. *Curr. Appl. Phys.* 10, S146 (2010).

CdSe, belonging to group II-VI on the periodic table, is an excellent material for thin-film solar cells. The energy gap of CdSe is 1.4 eV to 1.5 eV, and CdSe is a direct energy gap material. Besides, CdSe has a good absorption coefficient ($\alpha$) larger than $5 \times 10^5$ cm$^{-1}$, and a thickness of only 2 μm can absorb 99% light of which energy is larger than the energy gap of CdSe. During manufacturing process, when depositing a cadmium telluride thin film, because the vapor pressure of elemental tellurium and the vapor pressure of elemental cadmium are almost the same, the composition of CdTe will be self-stabilizing and thus the proportion of tellurium is very close to the proportion of cadmium. As a result, even though the accuracy of an instrument is not superior, the stoichiometric ratio of tellurium to cadmium of a deposited cadmium telluride thin film is approximately 1. Hence, using CdTe is easier in respect of manufacturing process. Currently, the highest efficiency on laboratory scale is 16.5%. Because cadmium is a heavy metal, which results in heavy metal contamination to the environment, legislation should be made to control the usage of cadmium to avoid damaging the environment.

Group I-III-VI semiconductors are materials derived from group II-VI semiconductors, and $CuInSe_2$ (CIS) is one of the group I-III-VI semiconductors. As shown in FIG. 1 and FIG. 2, CIS has a structure of chalcopyrite, of which lattice parameter a is 5.78 Å and c is 11.62 Å. The structure of chalcopyrite can be regarded as a stack of two hexagonal zincblend structures wherein cations are arranged in an ordered manner along the crystal c axis. The energy gap of CIS is about 1 eV and the absorption coefficient of CIS is $10^5$ cm$^{-1}$, as mentioned in Firoz Hasan, S. M. et al. *Sol. Energy. Mater. Sol. Cells* 58, 349 (1999). CIS is a popular direct energy gap material because a thickness of 0.1 μm can absorb most of the incident light. According to the known spectra of varied common-used semiconductors and absorption coefficients thereof at different wavelengths, CIS is known to absorb light of which wavelength covers from UV light to infrared light.

FIG. 3 is a $Cu_2Se$—$In_2Se_3$ pseudo binary phase diagram, which indicates that the allowable deviation from stoichiometry (Cu:In:Se=1:1:2) is about 5%, namely, as long as the ratio of Cu to In is between 0.82 and 1.04, $CuInSe_2$ has physical properties and chemical properties of chalcopyrite structure.

Moreover, conductivity type and electrical property can be changed through changing ratio of Cu to In, as mentioned in Bindu, K. et al. *Sol. Energy. Mater. Sol. Cells.* 79, 67 (2003) and Deepa, K. G. et al. *Sol. Energy.* 83, 964 (2009). When Cu/In>1 (Cu-rich), the CIS thin film is P-type, of which resistivity is lower, the surface is rougher and the grains are larger. When Cu/In<1 (In-rich), the CIS thin film is N-type, of which resistivity is higher, the surface is smoother and the grains are smaller. A typical structure of CIS solar cell is shown in FIG. 4.

Some researchers discover that adding gallium into $CuInSe_2$ changes the energy gap of the material, leading to the development of $CuIn_xGa_{1-x}Se$ (CIGS). One of the advantages of CIGS is that an energy gap gradient within the absorber layer can be generated through adjusting the ratio of In to Ga, and the ratio gradually increases in a direction from the substrate to the buffer layer, which assists in absorbing different wavelengths of light, and thus achieving a high light-use efficiency.

Some publications indicate that using sodium-lime glass as substrate instead of silicon substrate has a positive effect, as mentioned in Ruckh, M. et al. *Sol. Energy. Mater. Sol. Cells.* 41/42, 335 (1996). In general, the reason for said positive effect is that when depositing a CIGS absorber layer, because of heating, a small amount of sodium ion of the substrate diffuses into CIGS, which results in larger grains, better electrical conductivity, reducing serial resistance and increasing open-circuit voltage of the device. However, many problems still remain to be solved. A typical structure of CIGS solar cell is shown in FIG. 5. The highest efficiency on laboratory scale is 19.9% at present, which is achieved by Repins. et al., as mentioned in Repins, I. et al. *IEEE Photovoltaics Specialists Conference Record.* 33 (2008).

For the purpose of facilitating popularization of solar cells entirely to make solar cells replace most of the energy sources as the main source of power system, the most important issues lie in how to increase conversion efficiency and how to reduce cost. Although the conversion efficiency of the quaternary compounds of copper indium gallium selenide is the highest among the thin-film solar cells, the cost is high because both indium and gallium are precious metals.

In 2011, Prieto et al. at Colorado State University has found that copper selenide is a high-effective and cheap material for solar cells, as mentioned in Riha, S. C. et al. *J. Am. Chem. Soc.* 133, 1383 (2011). Compared to the costly solar cells based on quaternary compounds of copper indium gallium selenide thin-film, copper selenide without containing precious metals has predominance in price.

In 1998, Prieto et al. has used hydrothermal at 90° C. for 4 hours to successfully synthesize $Cu_{2-x}Se$, as mentioned in Wang, W. et al. *J. Mater. Chem.* 8, 2321 (1998), and the mole ratio of CuI to Se they use is 2.2/1. In 2002, Liu et al. has also used hydrothermal at 60° C. for 2 hours to synthesize $Cu_{2-x}Se$ rod-like nanocrystal, as mentioned in Liu, Y. et al. *Mater. Res. Bull.* 37, 2509 (2002), and the mole ratio of $CuSO_4$ to $Na_2SeSO_3$ they use is 0.75/1. In 2002, Xie et al. has utilized ultrasonic irradiation both at a ratio of Cu to Se of 1/1 and 1/2 respectively to synthesize $Cu_{2-x}Se$, as mentioned in Xie, Y. et al. *Inorg. Chem.* 41, 387 (2002). In 2010, Zhang et al. has used pyrolysis at 250° C. for 5 minutes at a ratio of Cu to Se of 2/1 and 1/1 respectively to synthesize $Cu_{2-x}Se$, as mentioned in Zhang, A. et al. *Mater. Chem. Phys.* 124, 916 (2010).

From the conventional methods noted above, to synthesize $Cu_{2-x}Se$ nano crystal, the key point is not the ratio of copper to selenium but is the reaction conditions such as reaction temperature, reaction time and the used solvent. However, some publications state that an additional crystalline phase will be formed if excessive amount of selenium participates in the reaction. Grozdanov uses a ratio of Cu to Se of 1/1 and of 1/4 respectively under the same reaction conditions and Grozdanov finds that $Cu_{2-x}Se$ is formed when the ratio of Cu to Se is 1/1 while CuSe is formed when the ratio of Cu to Se is 1/4, as mentioned in Grozdanov I. *Synth. Met.* 63, 213 (1994). CuSe is also a selenide semiconductor and the energy gap of CuSe is 3 eV, with reference to Pejova, B. et al. *J. Solid State Chem.* 158, 49 (2001).

In 1997, Clement et al. has proposed that when x is larger than 0.2, the $Cu_3Se_2$ crystalline phase will exist in $Cu_{2-x}Se$ crystalline phase and acts as an impurity phase, resulting in worsening the properties of $Cu_{2-x}Se$, as mentioned in Clement C. L. et al. *Thin Solid Films* 302, 12 (1997). $Cu_3Se_2$ (copper(II) selenide) is a binary semiconductor compound whose energy gap is about 2.6 to 2.8 eV and whose resistivity is about $10^{-3}$, as mentioned in Yan, Y. L. et al. *Inorg. Chem. Commun.* 6, 34 (2003). Compared to $Cu_{2-x}Se$, because $Cu_3Se_2$ has a worse absorption coefficient, the applicability of $Cu_3Se_2$ is lower. Dhanam et al. also mentions that when x is smaller than 0.2, $Cu_{2-x}Se$ is more stable, as mentioned in Dhanam, M. et al. *J. Cryst. Growth* 280, 425 (2005). In conclusion, to synthesize $Cu_{2-x}Se$, the ideal value of 2−x is $2.00 \geq 2-x \geq 1.80$.

In respect of copper selenide solar cells, in 1984, Stewart et al. has fabricated a copper selenide solar cell of which conversion efficiency is 5.4% through using glass as substrate, evaporating CdS as N-type and buffer layer respectively, evaporating $Cu_{2-x}Se$ as P-type, and using Ag as back electrode and upper electrode, as mentioned in Chen, W. S. et al. *Appl. Phys. Lett.* 46, 1095 (1985). So far the structure with the highest conversion efficiency revealed by publication is through using silicon as N-type, using Au/Sb alloy as electrodes, and evaporating $Cu_{2-x}Se$ as P-type, and the conversion efficiency is 8.8%, as mentioned in Okimura, H. et al. *Thin Solid Films* 71, 53 (1980). Moreover, if an anti-reflection layer is added to the structure, the anticipated efficiency will reach over 10%.

Although copper selenide, which is a Group I-VI semiconductor and belongs to binary compounds, is a promising material for solar cells, the conventional method for synthesizing copper selenide nanocrystal is by means such as hydrothermal, ultrasonic irradiation pyrolysis and so forth, hence, the problem of high production cost still remains.

In addition, conventional methods for fabricating copper selenide thin films, such as spraying, printing, sputtering and so forth, need to be operated under high temperature environment to allow sintering process to proceed in order to remove binder, or such conventional methods need to be performed under vacuum conditions to allow coating process to proceed, not only the manufacturing processes are not convenient but also related equipments, maintenance and operating cost are extremely costly.

To overcome the shortcomings, the present invention provides a method for making $Cu_{2-x}Se$ nanoparticles and method for making a deposited $Cu_{2-x}Se$ thin film by electrophoresis to mitigate or obviate the aforementioned problems.

SUMMARY OF THE INVENTION

Given that the aforesaid drawbacks of the prior art such as that conventional methods need to be operated under high temperature environment, the manufacturing processes are not convenient, and related equipments, maintenance and operating cost are extremely costly, the main object of the present invention is to provide a method for coating $Cu_{2-x}Se$ nanoparticles in an inert atmosphere by electrophoresis, particularly to a method having advantages including capability of being operated under low temperature, simple manufacturing process, and low cost.

The present invention provides a low-cost method for making $Cu_{2-x}Se$ nanoparticles and method for making a deposited $Cu_{2-x}Se$ thin film by electrophoresis. In the present invention, pyrolysis, which is a simple manufacturing process, is used to synthesize $Cu_{2-x}Se$ nanoparticles at room temperature and in a nitrogen atmosphere, and then is followed by using low-cost electrophoresis to make a deposited $Cu_{2-x}Se$ thin film at room temperature and in a non-vacuum environment.

The method for making $Cu_{2-x}Se$ nanoparticles in accordance with the present invention comprises steps of:

at a ratio of 3 mmol of copper (I) chloride/per 6 mL of 1-Dodecanethiol and 12 mL of 1-Octadecene, dissolving copper (I) chloride in 1-Dodecanethiol and then adding 1-Octadecene into the 1-Dodecanethiol to form a resulting solution, followed by stiffing the resulting solution and heating the resulting solution to 180° C. to obtain a copper (I) chloride solution;

adding selenium powder into Tri-n-octylphosphine and then heating the resulting solution to 50° C. and stirring the resulting solution at 50° C. to obtain a selenium solution;

when the copper (I) chloride solution is heated to 180° C., adding the selenium solution rapidly into the copper (I) chloride solution at 180° C. to obtain a solution containing copper (I) chloride and selenium;

stirring the solution containing copper (I) chloride and selenium at a predetermined temperature over 180° C. for a predetermined time;

after the reaction is completed, cooling down the solution containing copper (I) chloride and selenium rapidly to 45° C., followed by adding acetone into the solution containing copper (I) chloride and selenium to precipitate $Cu_{2-x}Se$, stirring the solution containing copper (I) chloride and selenium at 45° C. for 10 minutes and then obtaining a supernatant liquor and particles by centrifugation;

removing the supernatant liquor to keep the particles, adding chloroform and methanol to the particles at a ratio of chloroform to methanol of 1:3 to obtain a mixed solution, sonicating the mixed solution for 10 minutes and operating centrifugation to obtain particles; and drying the obtained particles to obtain $Cu_{2-x}Se$ nanoparticles.

The method for making a deposited $Cu_{2-x}Se$ thin film by electrophoretical deposition in accordance with the present invention includes steps of:

preparing an ethanol solution containing $Cu_{2-x}Se$ nanoparticles made by the aforementioned method;

sonicating the ethanol solution containing $Cu_{2-x}Se$ nanoparticles for a predetermined period and adjusting the pH value of the ethanol solution containing $Cu_{2-x}Se$ nanoparticles;

preparing a steel substrate and an indium tin oxide (ITO) substrate wherein the two substrates are of the same size, followed by washing the steel substrate with acetone and DI water and washing the ITO substrate with DI water, and then drying the two substrates;

connecting a power supply with a positive electrode and a negative electrode to the ethanol solution containing $Cu_{2-x}Se$ nanoparticles, which has been sonicated for the predetermined period, wherein the positive electrode is connected to the steel substrate and the negative electrode is connected to the ITO substrate, and a predetermined distance exists between the steel substrate and the ITO substrate to facilitate depositing a $Cu_{2-x}Se$ thin film by electrophoretical deposition;

drying the depositing $Cu_{2-x}Se$ thin film after the electrophoretical deposition to obtain a deposited $Cu_{2-x}Se$ thin film.

Properties of the thin film of the present invention determined by SEM, XRD and Hall measurement show that the present invention indeed provides a low-cost method for making $Cu_{2-x}Se$ nanoparticles and method for making a deposited $Cu_{2-x}Se$ thin film, and the present invention meets the purpose of making $Cu_{2-x}Se$ nanoparticles and a deposited $Cu_{2-x}Se$ thin film as materials for copper selenide solar cells by a low-cost manufacturing process. Besides, the method of the present invention can be operated at room temperature under 1 atm instead of carrying out a sintering process, hence, the method of the present invention avoids using techniques and equipments for providing high temperature or non-vacuum environment, so the cost of the present invention is low. Furthermore, the method of the present invention provides a convenient manufacturing process for making high-efficiency copper selenide solar cells.

In the present invention, electrophoresis is used to make a deposited $Cu_{2-x}Se$ thin film from $Cu_{2-x}Se$ nanoparticles at room temperature and in an inert atmosphere, hence, the present invention has advantages including capability of being operated under low temperature, simple manufacturing process, and low cost. In general, electrophoretic deposition is operated under atmosphere, but elemental selenium in $Cu_{2-x}Se$ nanoparticles is easily substituted by oxygen under oxygen-containing atmosphere, as a result, electrophoretic deposition should be operated in an inert atmosphere such as nitrogen, argon and so forth to carry out depositing a $Cu_{2-x}Se$ thin film by electrophoresis.

Other objectives, advantages and novel features of the invention will become more apparent from the following detailed description when taken in conjunction with the accompanying drawings.

DETAILED DESCRIPTION OF THE PREFERRED EMBODIMENTS

For a better understanding about the technical features of the present invention and its effect, and for implements in accordance with the disclosures of the specification, preferred embodiment, details and figures are further shown as follows:

First Embodiment

This is an embodiment illustrative of the materials involved in the embodiments of the present invention.

To implement the present invention, the following materials can be used:

a. Copper (I) Chloride (CuCl): 99.9%, purchased from Wako Pure Chemical Industries, Ltd.

b. Selenium (Se): powder, 99.7%, purchased from Acros Chemicals Inc., U.S.A.

c. Tri-n-octylphosphine ($C_{24}H_{51}P$, TOP): 90%, purchased from Alfa Aesar Chemical Company Inc., U.S.A.

d. 1-Dodecanethiol ($C_{12}H_{26}S$, DT): 98.5+%, purchased from Acros Chemicals Inc., U.S.A.

e. 1-Octadecene ($C_{18}H_{36}$, ODE): 90%, purchased from Acros Chemicals Inc., U.S.A.

f. Methanol ($CH_3OH$): 99.9%, purchased from C-ECHO.

g. Ethanol ($C_2H_6O$): 99.9%, purchased from Mallinckrodt Baker, Inc. Phillipsburg.

h. Chloroform ($CHCl_3$): 99.99%, purchased from C-ECHO.

i. Acetone ($CH_3COCH_3$): 99.9%, purchased from C-ECHO.

Second Embodiment

The present embodiment relates to a method for making $Cu_{2-x}Se$ nanoparticles.

Figure 1:
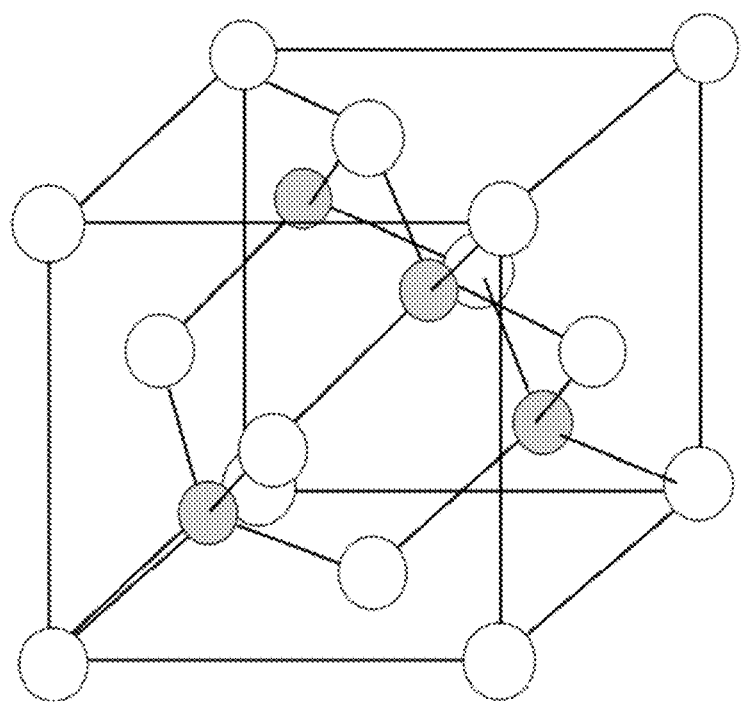
FIG. 1 is a schematic diagram of zincblend structure.
Figure 2:
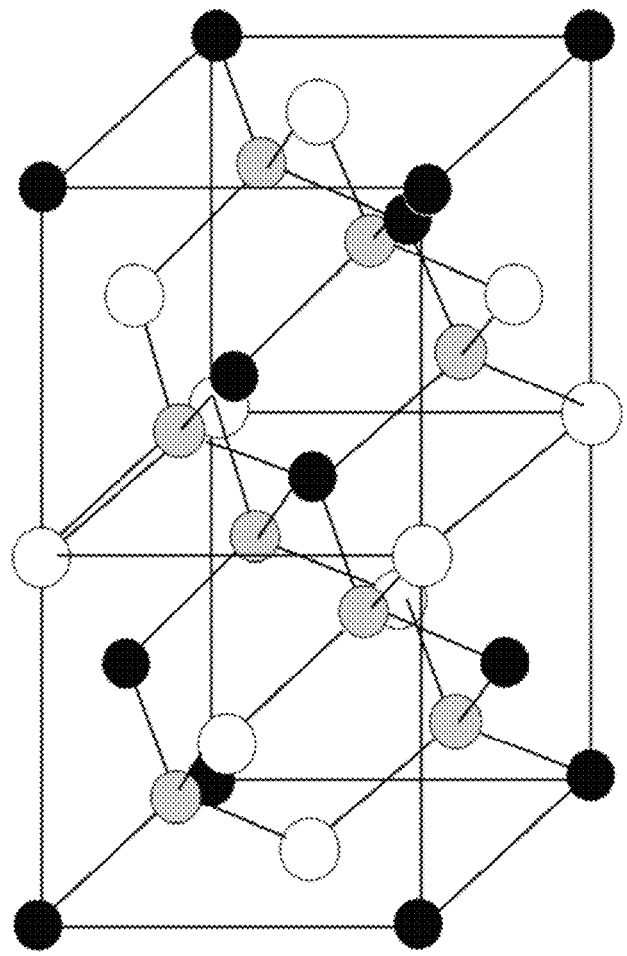
FIG. 2 is a schematic diagram of chalcopyrite structure.
Figure 3:
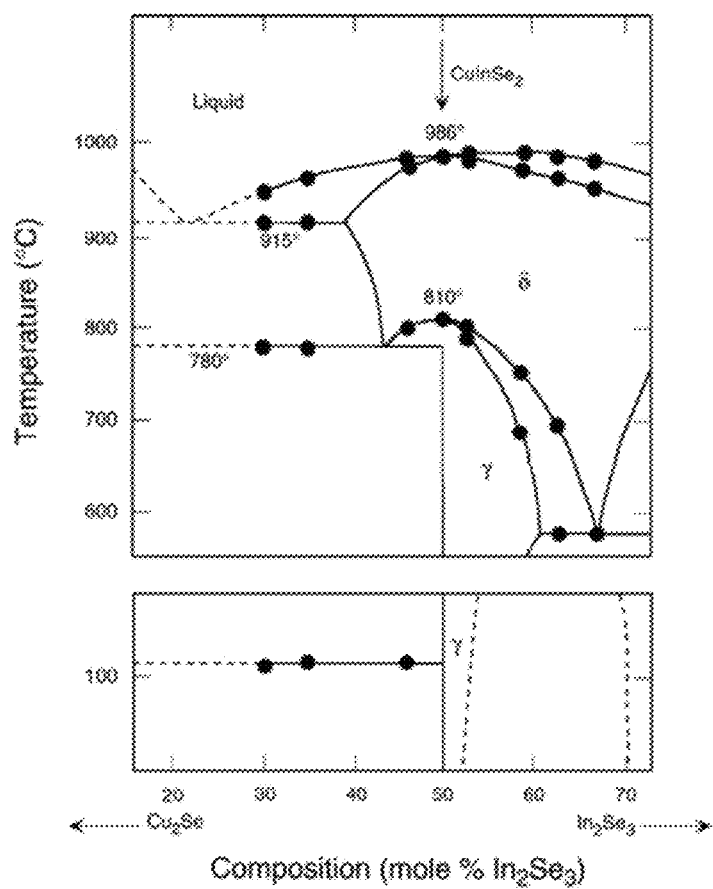
FIG. 3 is a $Cu_2Se$—$In_2Se_3$ pseudo binary phase diagram.
Figure 4:
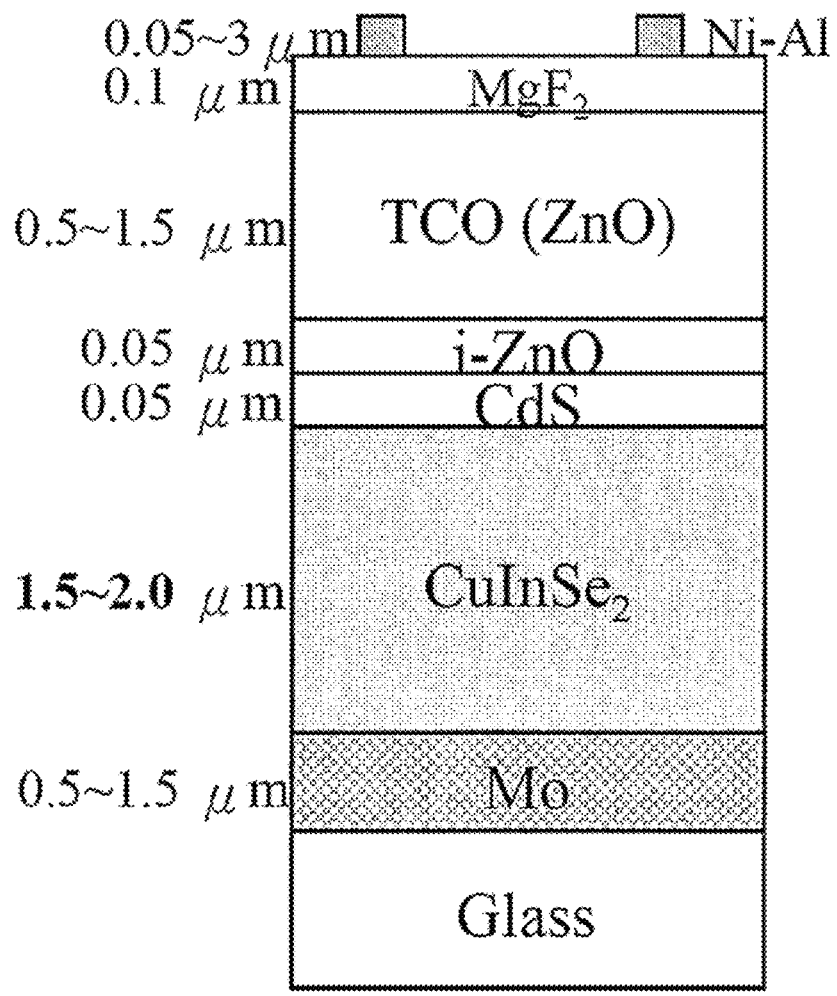
FIG. 4 is a diagram of a typical structure of CIS solar cell.
Figure 5:
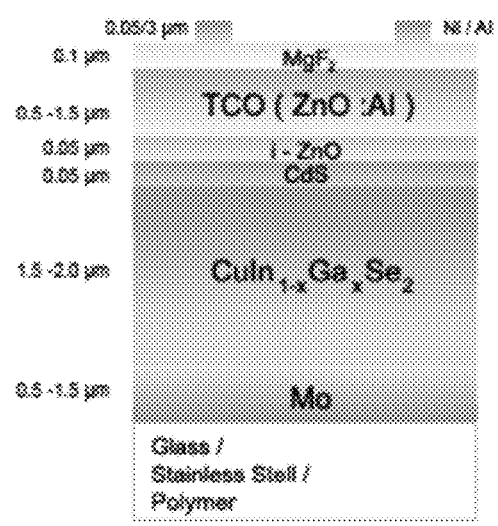
FIG. 5 is a diagram of a typical structure of CIGS solar cell.
Figure 6:
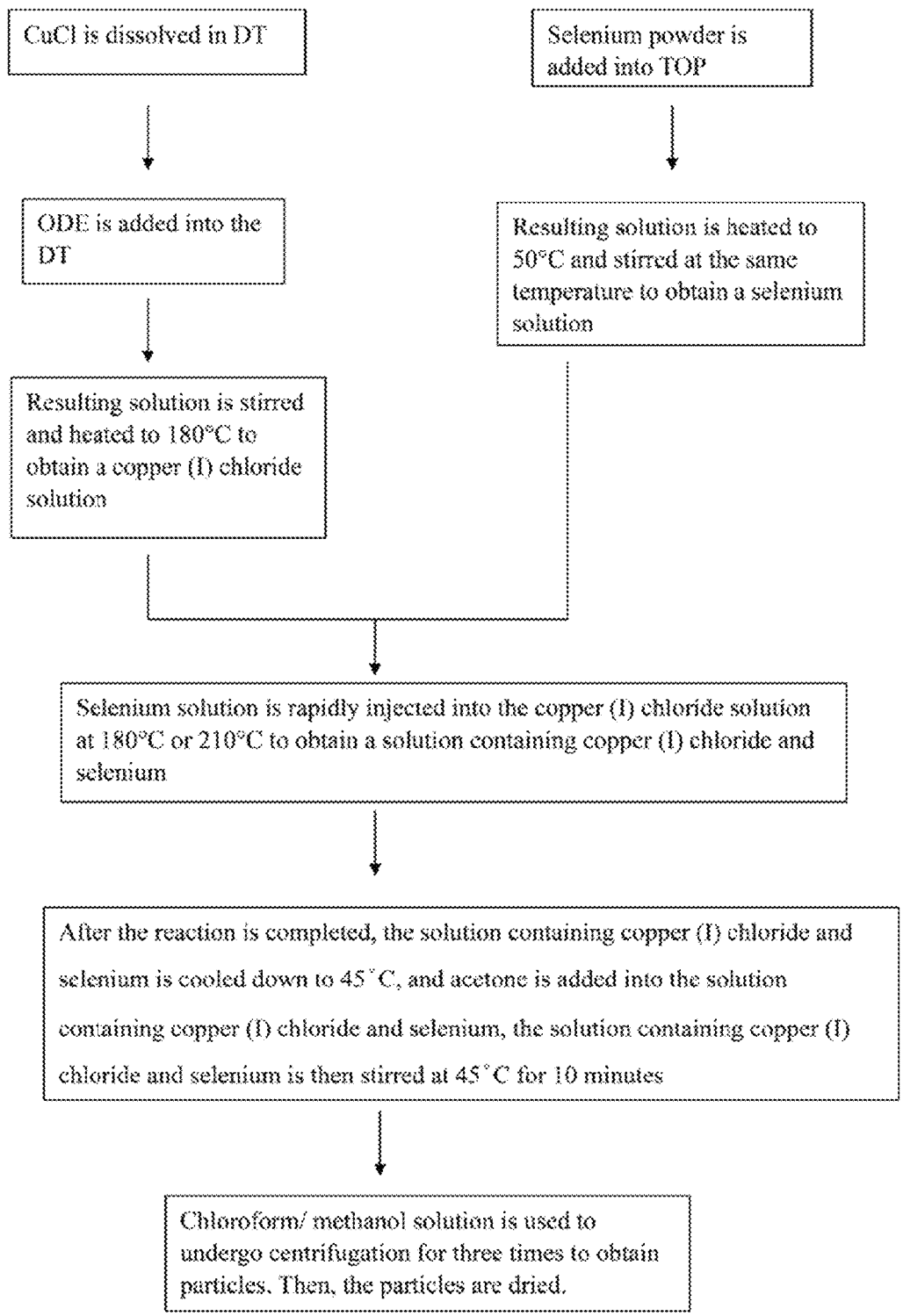
FIG. 6 is a flow diagram of making copper (I) selenide ($Cu_{2-x}Se$) nanoparticles by pyrolysis.
Figure 7:
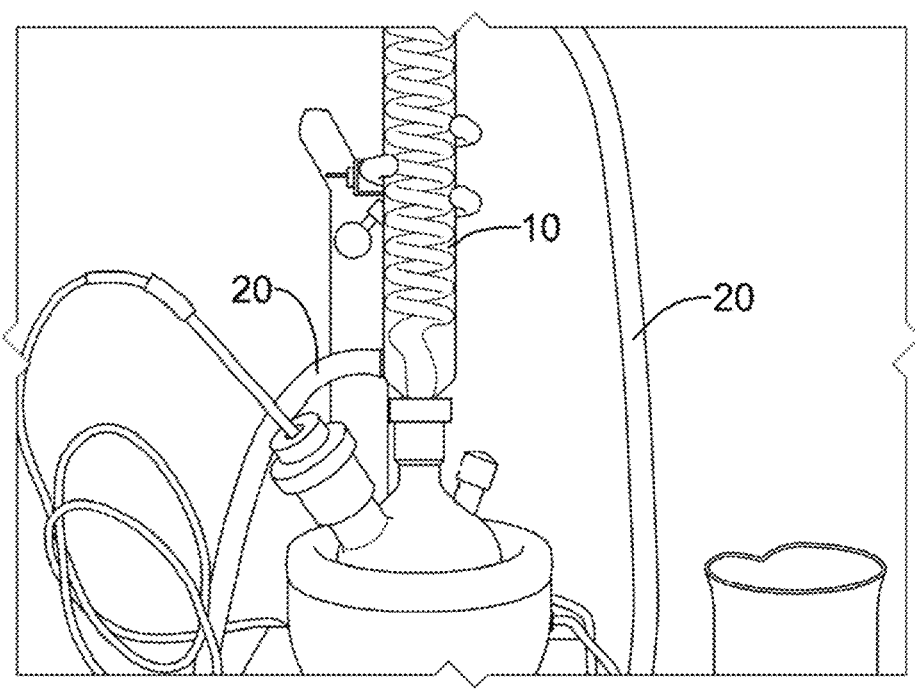
FIG. 7 is a diagram of pyrolysis installation.

With reference to FIG. 6, the method of the present embodiment for making $Cu_{2-x}Se$ nanoparticles included steps as follows:

a. A three-necked bottle was connected with a graham condenser 10, rubber tubings 20 were connected with the graham condenser 10 to provide water, and the installation was degassed with nitrogen, as shown in FIG. 7.

b. 3 mmol of CuCl was dissolved in 6 mL of DT and then 12 mL of ODE was added into the DT, the resulting solution was opalescent and turbid at that moment, the resulting solution was then stirred and heated to 180° C. to obtain a copper (I) chloride solution, and the color of the copper (I) chloride solution was golden at that moment.

c. 1.64 mmol of selenium powder was added into 2.7 mmol of TOP, and the resulting solution was heated to 50° C. and stirred at the same temperature to obtain a selenium solution, and the color of the selenium solution, containing TOP and Se, was golden at that moment. In the present step of the embodiment, the mole ratio of TOP/Se was about 1.65. Furthermore, the mole ratio of TOP/Se of the present invention ranges from 1 to 10.

d. When the copper (I) chloride solution prepared by step b was heated to 180° C., the selenium solution prepared by step c was rapidly injected into the copper (I) chloride solution prepared by step b through syringe at 180° C. to obtain a solution containing copper (I) chloride and selenium, the solution containing copper (I) chloride and selenium showed different colors according to the different concentrations of TOP and Se.

e. The solution containing copper (I) chloride and selenium prepared by step d was stirred at a predetermined temperature for a predetermined time, wherein the predetermined temperature of the present embodiment was 180° C. or 210° C.

f. After the reaction was completed, the solution containing copper (I) chloride and selenium was cooled down rapidly to 45° C., and 30 mL of acetone was added into the solution containing copper (I) chloride and selenium to precipitate $Cu_{2-x}Se$, the solution containing copper (I) chloride and selenium was then stirred at 45° C. for 10 minutes; after being taken out from the three-necked bottle, the solution containing copper (I) chloride underwent centrifugation to obtain a supernatant liquor and particles.

g. The supernatant liquor and particles prepared from step f were separated to keep the rubricans particles, and then 14.92 g of chloroform and 23.76 g of methanol wherein the volume ratio of chloroform to methanol was 1:3 was added to the particles to obtain a mixed solution, the mixed solution was then sonicated for 10 minutes and then underwent centrifugation to obtain particles.

h. Step g was repeated three times, and the obtained particles were dried in a vacuum oven for 5 hours to obtain $Cu_{2-x}Se$ nanoparticles, and the $Cu_{2-x}Se$ nanoparticles were stored in the vacuum oven.

Third Embodiment

The present embodiment relates to a method for making a deposited $Cu_{2-x}Se$ thin film by electrophoretical deposition.

Figure 8:
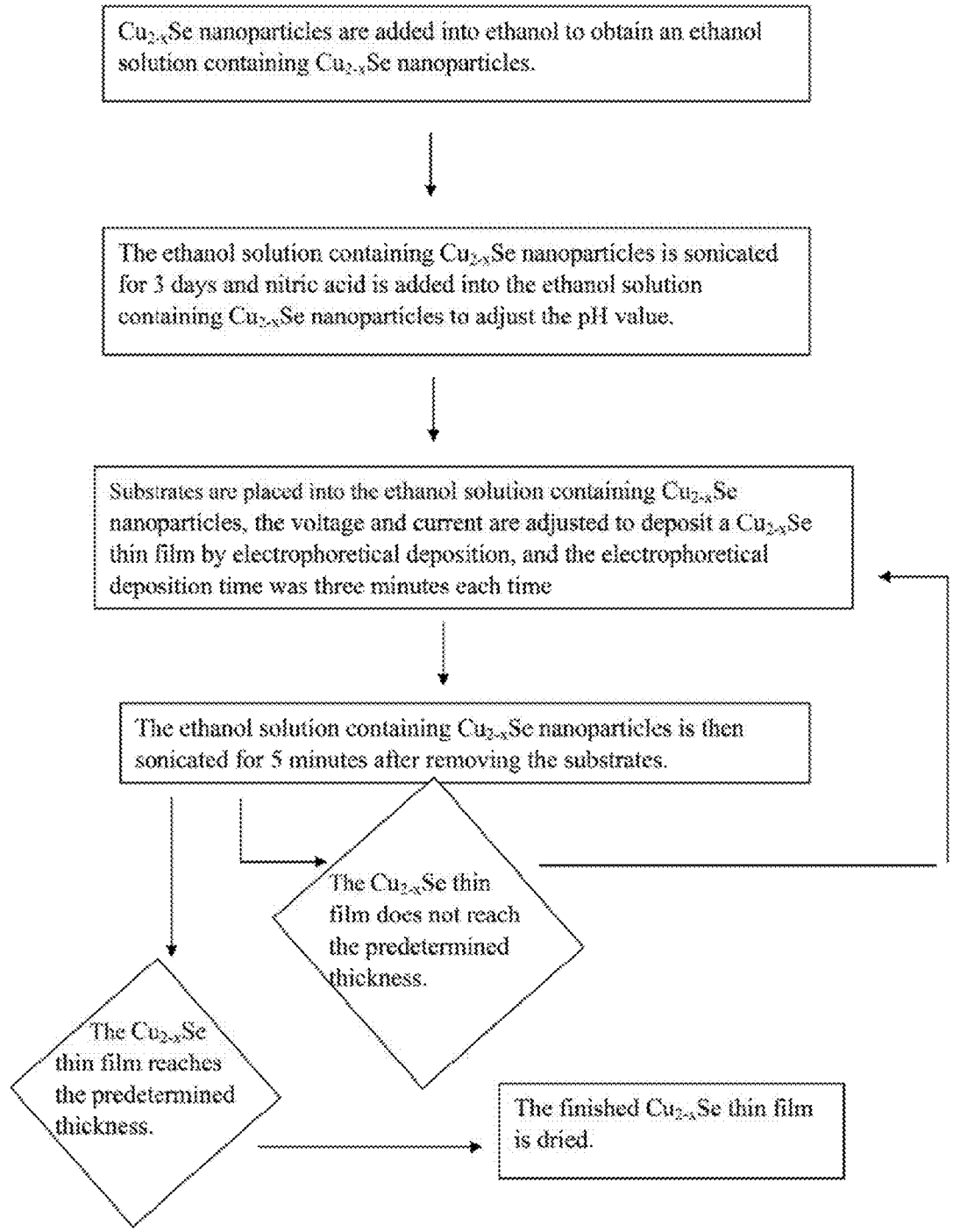
FIG. 8 is a flow diagram of depositing a $Cu_{2-x}Se$ thin film by electrophoresis.

With reference to FIG. 8, the method of the present embodiment for making a deposited $Cu_{2-x}Se$ thin film by electrophoretical deposition included steps as follows:

a. $Cu_{2-x}Se$ nanoparticles prepared by the second embodiment were weighed to a proper scale and added into 60 mL of ethanol to obtain an ethanol solution containing $Cu_{2-x}Se$ nanoparticles.

b. The ethanol solution containing $Cu_{2-x}Se$ nanoparticles prepared by step a was sonicated for 3 days and nitric acid was added into the ethanol solution containing $Cu_{2-x}Se$ nanoparticles to adjust the pH value.

c. A steel substrate and an ITO substrate were prepared wherein the two substrates were of the same size, the steel substrate was washed with acetone and DI water and the ITO substrate was washed with DI water, and then the two substrates were dried with nitrogen.

d. The ethanol solution containing $Cu_{2-x}Se$ nanoparticles was connected to a power supply, the positive electrode was connected to the steel substrate, and the negative electrode was connected to the ITO substrate. Besides, a fixture was used to fix the installation and a distance of 1 cm existed between the steel substrate (positive electrode) and the ITO substrate (negative electrode), the voltage and current were adjusted to deposit a $Cu_{2-x}Se$ thin film by electrophoretical deposition.

e. In an inert atmosphere, the electrophoretical deposition time was three minutes each time; after the electrophoretical deposition was finished, the fixture was separated from the installation and the ethanol solution containing $Cu_{2-x}Se$ nanoparticles was then sonicated for 5 minutes. The thickness of the depositing $Cu_{2-x}Se$ thin film was adjusted by the number of deposition cycles.

f. After electrophoretical deposition, the finished $Cu_{2-x}Se$ thin film was dried in a vacuum oven for 1 hour to obtained a deposited $Cu_{2-x}Se$ thin film and the deposited $Cu_{2-x}Se$ thin film was stored in the vacuum oven.

Fourth Embodiment

This is an embodiment illustrative of the instruments involved in the embodiments of the present invention.

a. Electronic balance, manufactured by Sartorius Corp. (Germany) and the product type was CP4202S.

b. High-speed small centrifuge, manufactured by HSIANGTAI MACHINERY IND. CO., the product type was CN-2200, and maximum centrifugal force was 10500 g. The High-speed small centrifuge included rotating disks and four plastic centrifuge tubes and capacity of each plastic centrifuge tube was 50 mL c. Condensing arrangements included a three-necked bottle of 250 mL, teflon caps, a graham condenser, a temperature controller, a mantle heater for flask, a thermal couple and a viton o-ring.

d. Power supply, manufactured by Gwinstek Corp., the product type was GPR 10HH10D, rated supply voltage was 1000V and current was 1A.

e. X-ray Powder Diffractometer (XRD) was from Instrument Center at National Chung Cheng University and the product type was Shimadzu XRD-6000. X-ray was formed through passing the light source through a copper target ($K\alpha$=1.54184 Å with a voltage of 40 kV and a current of 30 mA), and the scan range was from 10 degrees to 80 degrees and the scan rate was 8 degrees per minute.

f. Field-emission scanning electron microscopy (FE-SEM) was from Instrument Center at National Chung Cheng University and the product type was Hitachi S-4800. The acceleration voltage was 0.1 to 30 KV. The magnifying power was 30 to 800,000×. The emission source was a cold-cathode electron beam gun. The size of sample was 100 mm in diameter. The resolution of the secondary electron image was 1.0 nm (at 15 kV) or 2.0 nm (at 1 kV). In addition, the FE-SEM has an energy dispersive spectroscopy (EDS) system.

g. Particle size analyzer by dynamic light scattering was from Department of Chemistry and Biochemistry of National Chung Cheng University and the particle size analyzer by dynamic light scattering was of Zetasizer Nano series. The particle size analyzer by dynamic light scattering was capable of measuring important parameters of colloids and polymers, wherein the parameters included grain size, zeta potential and molecule weight. The grain size analyzer by dynamic light scattering combined back scattering technique and photon counters manufactured by ALV Corp., which made a breakthrough in limitation on concentration compared to the conventional dynamic light scattering, and further increased the sensitivity of the instrument. Non-invasive back scattering (NIBS) technology could measure the grain size of a high concentration sample of 0.1 PPM-40 wt % and the measurement ability ranges from 0.6 nm to 6000 nm.

h. Inductively coupled plasma atomic emission spectroscopy (ICP-AES) was from Instrument Center at National Tsinghua University and the product type was Kontron S-35.

i. UV-visible spectrophotometer was from Department of Physics at National Chung Cheng University and the product type was HP 8543. The wavelength ranges from 190 nm to 1100 nm.

Fifth Embodiment

The present embodiment relates to the analyses of the effect of changing reaction temperature and reaction time on the grain size of $Cu_{2-x}Se$ nanoparticles, and the measurements of $Cu_{2-x}Se$ nanoparticles were determined by XRD.

In the present embodiment, the mole ratio of Cu/Se was 2/1.1 and the mole ratio of TOP/Se was 1.68/1, and the $Cu_{2-x}Se$ nanoparticles were synthesized at 180° C. The change of phase of $Cu_{2-x}Se$ nanoparticles caused by different reaction times was observed, as shown in FIG. 9.

Figure 9:
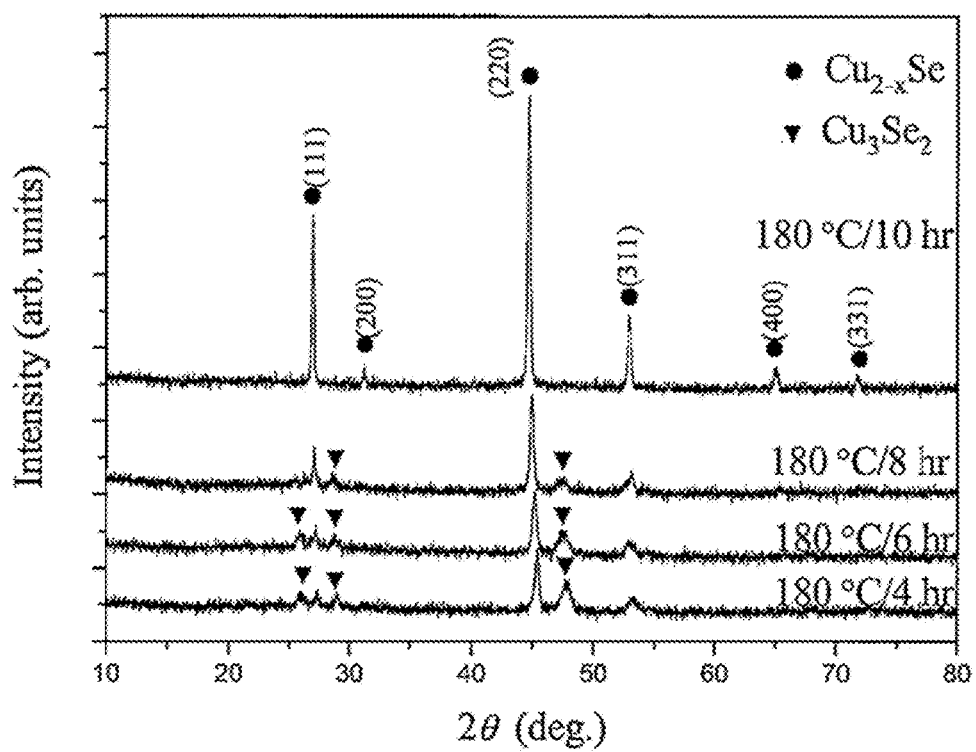
FIG. 9 is an XRD diagram of $Cu_{2-x}Se$ nanoparticles made at the reaction temperature of 180° C. and at TOP/Se of 1.68/1.

FIG. 9 shows that when the reaction time is 10 hours, the $Cu_{2-x}Se$ nanoparticles have perfect crystalline phase and sharp peaks, and the results are consistent with JCPD card: 06-0680. The values of main peaks at 2θ are 26.8, 31.1, 44.7, 52.9, 64.9 and 71.7 and the corresponding crystal orientations are (111), (200), (220), (311), (400) and (331) respectively. When the reaction time is less than 10 hours, FIG. 9 shows that the $Cu_{2-x}Se$ nanoparticles have other crystalline phases of different compounds and the values of main peaks at 2θ are 25.7, 28.8 and 47.9. JCPD card: 47-1745 shows that the crystalline phase is $Cu_3Se_2$ crystalline phase. A conclusion is obtained that when the reaction time reaches 10 hours, the diffraction intensity of the major crystalline phase increases remarkably, indicating that the reaction is fierce.

Figure 10:
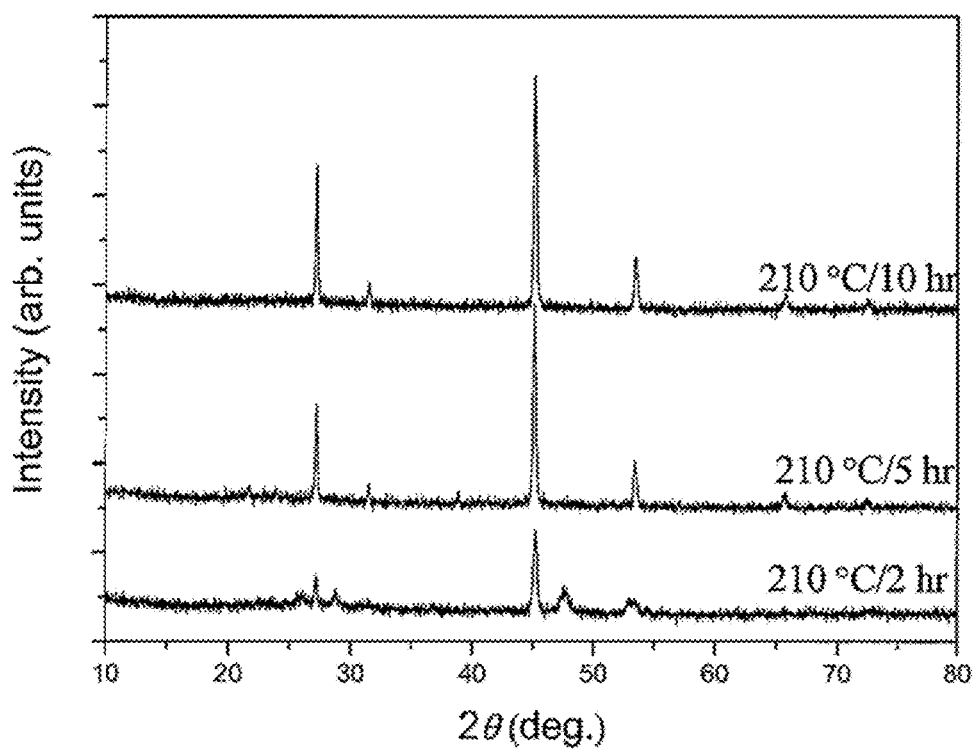
FIG. 10 is an XRD diagram of $Cu_{2-x}Se$ nanoparticles made at the reaction temperature of 210° C. and TOP/Se of 1.68/1.

FIG. 10 shows that as the reaction proceeds at 210° C., strong diffraction peaks exist when the reaction time is 5 hours, indicating that the reaction rate increases at a higher temperature.

As mentioned in D'Agostino, A. T. *Anal Chim Acta* 262, 269 (1992), in using the Scherrer equation for grain size determination, (220) crystal orientation is used to calculate the grain size. The obtained results are tabulated in Table 1. Table 1 shows the grain sizes of $Cu_{2-x}Se$ nanoparticles obtained by different reaction times and different reaction temperatures when the ratio of TOP/Se is 1.68/1. A conclusion is obtained that at the same reaction temperature, the longer the reaction time, the larger the grain size.

TABLE 1

| Reaction temperature | Reaction time (hr)/Grain size (nm) | | | |
|---|---|---|---|---|
| 180° C. | 10 hr<br>34.2 nm | 8 hr<br>31.3 nm | 6 hr<br>25.6 nm | 4 hr<br>21.4 nm |
| 210° C. | 10 hr<br>41.2 nm | 5 hr<br>37.4 nm | 2 hr<br>25 nm | |

Sixth Embodiment

The present embodiment relates to the analyses of the effect of changing the concentration of TOP/Se on the grain size of $Cu_{2-x}Se$ nanoparticles and on reaction time, and the measurements of $Cu_{2-x}Se$ nanoparticles were determined by XRD.

In the present embodiment, in order to make $Cu_{2-x}Se$ nanoparticles with smaller grain size, the concentration of TOP/Se was adjusted.

Figure 11:
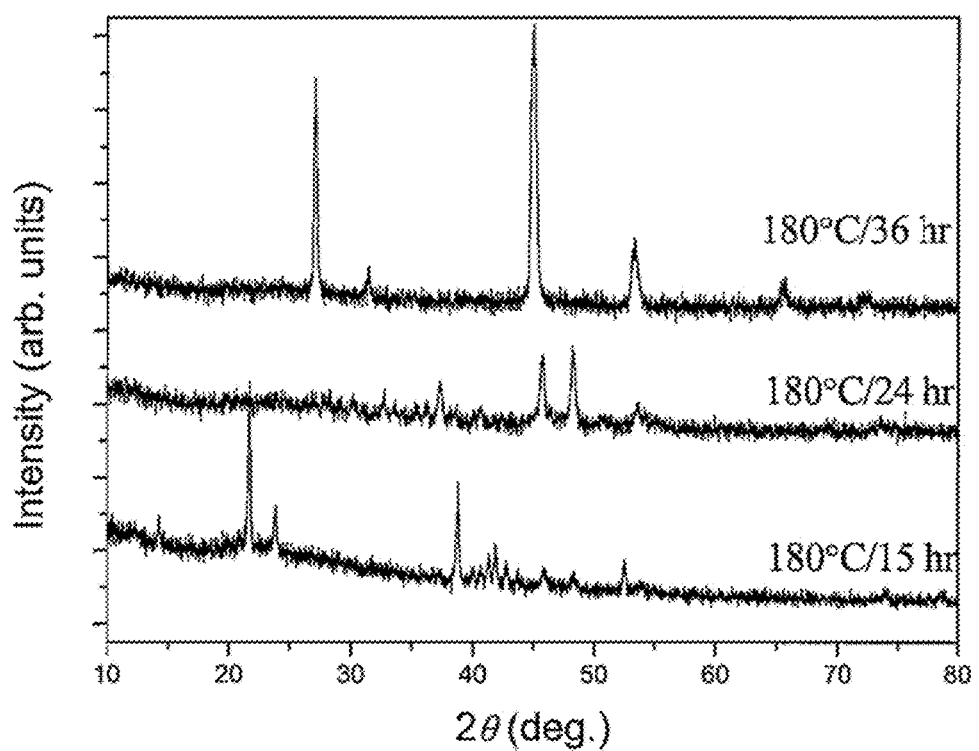
FIG. 11 is an XRD diagram of $Cu_{2-x}Se$ nanoparticles made at the reaction temperature of 180° C. and TOP/Se of 4/1.

FIG. 11 shows that when the concentration of TOP/Se is 4/1 and when the reaction proceeds at 180° C., the reaction rate obviously decreases, and complete crystalline phase exists when the reaction time is 36 hours. The slow reaction rate is attributed to the reduction of collisions between the particles caused by the reduction of the concentration of the reactant.

The grain size is 18.3 nm, which is calculated by Scherrer equation. Increasing the ratio of TOP/Se is found to decrease reaction rate and actually decrease grain size, with reference to Lakshmi, M. et al. *Thin Solid Films* 370, 89 (2000). However, the extent of grain size decreasing is limited.

Figure 12:
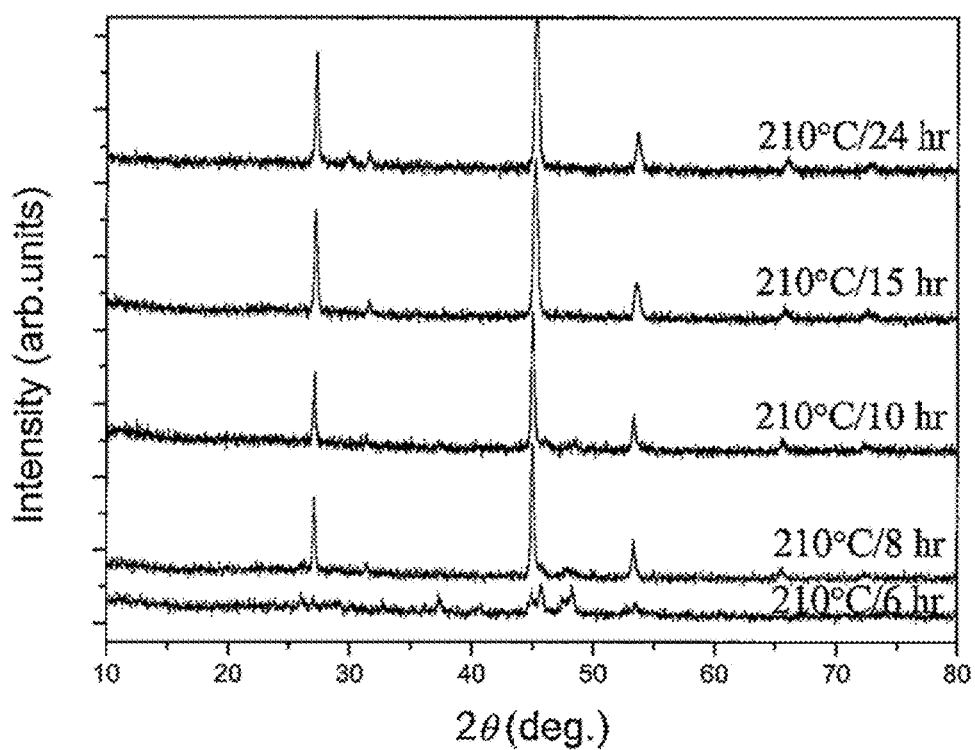
FIG. 12 is an XRD diagram of $Cu_{2-x}Se$ nanoparticles made at the reaction temperature of 210° C. and TOP/Se of 4/1.
Figure 13:
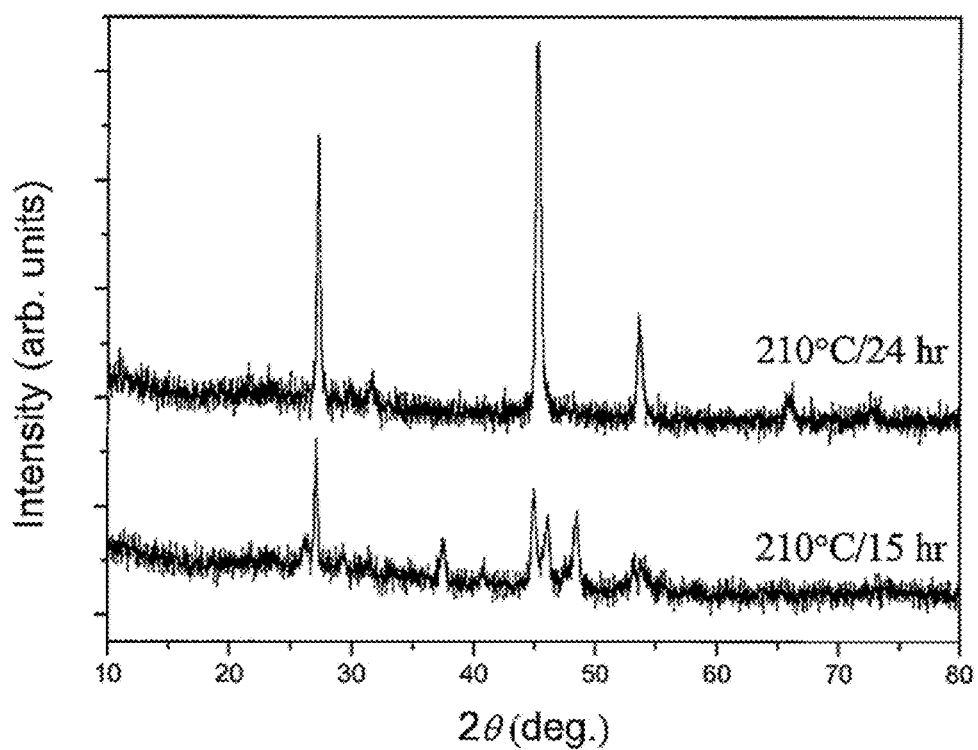
FIG. 13 is an XRD diagram of $Cu_{2-x}Se$ nanoparticles made at the reaction temperature of 210° C. and TOP/Se of 6/1.

FIG. 12 and FIG. 13 respectively show the results of the $Cu_{2-x}Se$ nanoparticles obtained by TOP/Se of 4/1 and TOP/Se of 6/1, and the reaction temperatures of both are 210° C. Compared to the result of $Cu_{2-x}Se$ nanoparticles obtained at the reaction temperature of 180° C., the grain size does not decrease obviously.

The obtained results are tabulated in Table 2. Table 2 shows the grain sizes of $Cu_{2-x}Se$ nanoparticles obtained by different reaction times and at different reaction temperatures when the ratio of TOP/Se is 4/1.

Besides, when TOP/Se is 6/1 and when the reaction proceeds at 240° C. for 24 hours, the grain size is 19.1 nm. Hence, with increasing ratio of TOP/Se, the grain size decreases, however, the reaction time is extended and a phenomenon of aggregation occurs.

TABLE 2

| Reaction temperature | Reaction time (hr)/Grain size (nm) | | | |
|---|---|---|---|---|
| 180° C. | 36 hr<br>18.3 nm | | 24 hr<br>20.1 nm | |
| 210° C. | 24 hr<br>25.4 nm | 15 hr<br>22.1 nm | 10 hr<br>34.3 nm | 8 hr<br>29.5 nm |

Seventh Embodiment

The present embodiment relates to the analyses of the effect of changing the ratio of Cu/Se on the aggregation phenomenon of $Cu_{2-x}Se$ nanoparticles and on reaction time, and the measurements of $Cu_{2-x}Se$ nanoparticles were determined by XRD.

Because prolonged reaction might cause the aggregation phenomenon of $Cu_{2-x}Se$ nanoparticles and thus increase grain size, in the present invention, increasing the ratio of Se was tried and the reaction proceeded at high temperature with a short reaction time in order to make $Cu_{2-x}Se$ nanoparticles with smaller grain size.

Figure 14:
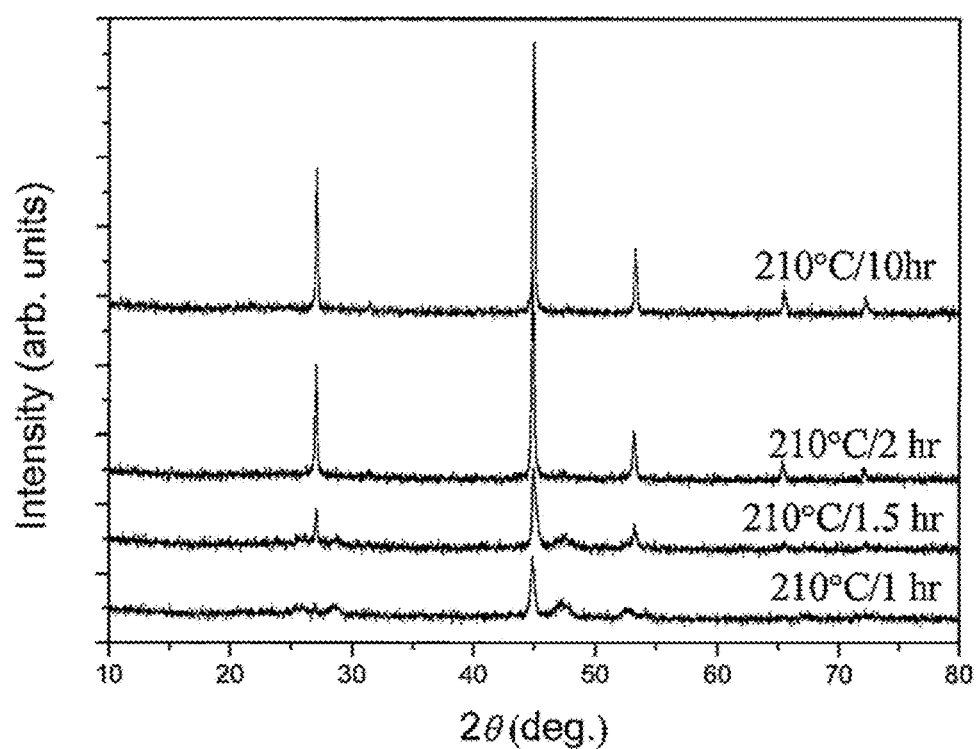
FIG. 14 is an XRD diagram of $Cu_{2-x}Se$ nanoparticles made at the reaction temperature of 210° C. and Cu/Se of 1/1.

FIG. 14 shows an XRD diagram of $Cu_{2-x}Se$ nanoparticles made at the reaction temperature of 210° C. and Cu/Se of 1/1. FIG. 14 indicates that a complete crystalline phase exists when the reaction time is 2 hours. Increasing the ratio of Se results in an increasing reaction rate, which is consistent with the publication Jagminas, A. et al. *J. Cryst. Growth* 294, 343 (2006). The grain size obtained by calculation is 35 nm, which makes no obvious difference compared to the $Cu_{2-x}Se$ nanoparticles made at Cu/Se of 2/1.1. That is, when the ratio of Cu/Se is 1/1, the particles aggregate faster during the shorter reaction time, resulting in the failure to decrease grain size.

Eighth Embodiment

The present embodiment relates to analyses of SEM images of $Cu_{2-x}Se$ nanoparticles made at Cu/Se of 2/1.1 and at TOP/Se of 1.68/1.

Figure 15:
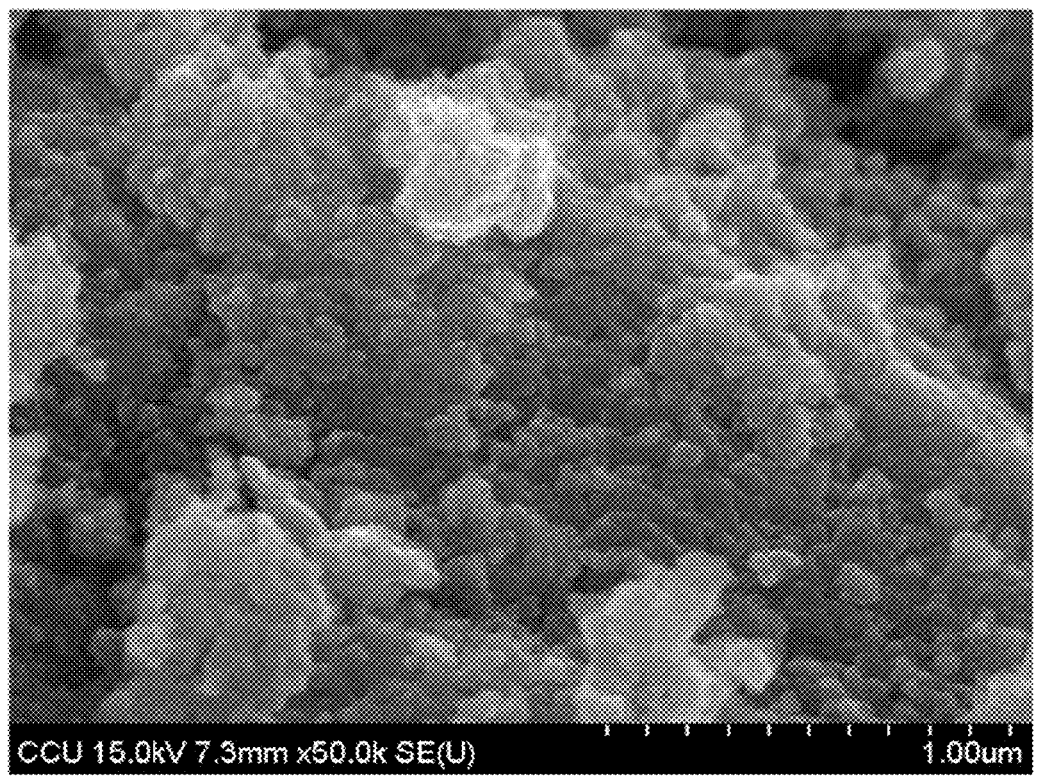
FIG. 15 is an SEM image of $Cu_{2-x}Se$ nanoparticles made at TOP/Se of 1.68/1, at the reaction temperature of 180° C. and with the reaction time of 8 hours.
Figure 16:
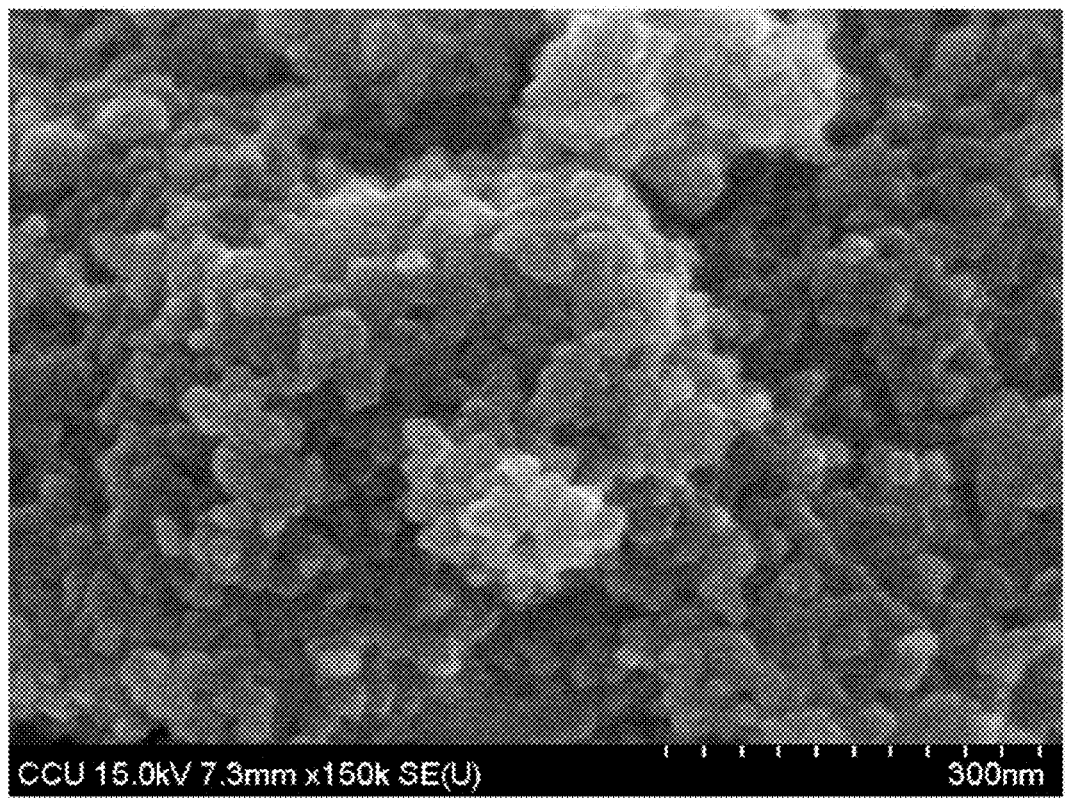
FIG. 16 is an SEM image of $Cu_{2-x}Se$ nanoparticles made at TOP/Se of 1.68/1, at the reaction temperature of 180° C. and with the reaction time of 8 hours.
Figure 17:
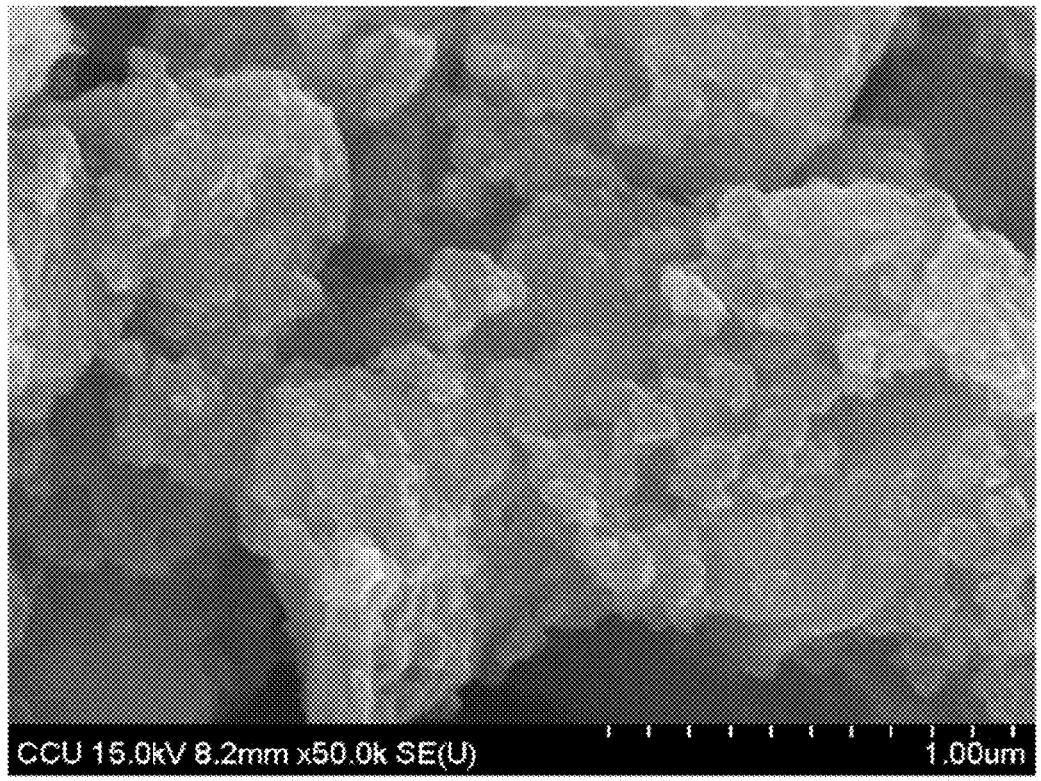
FIG. 17 is an SEM image of $Cu_{2-x}Se$ nanoparticles made at TOP/Se of 1.68/1, at the reaction temperature of 180° C. and with the reaction time of 10 hours.
Figure 18:
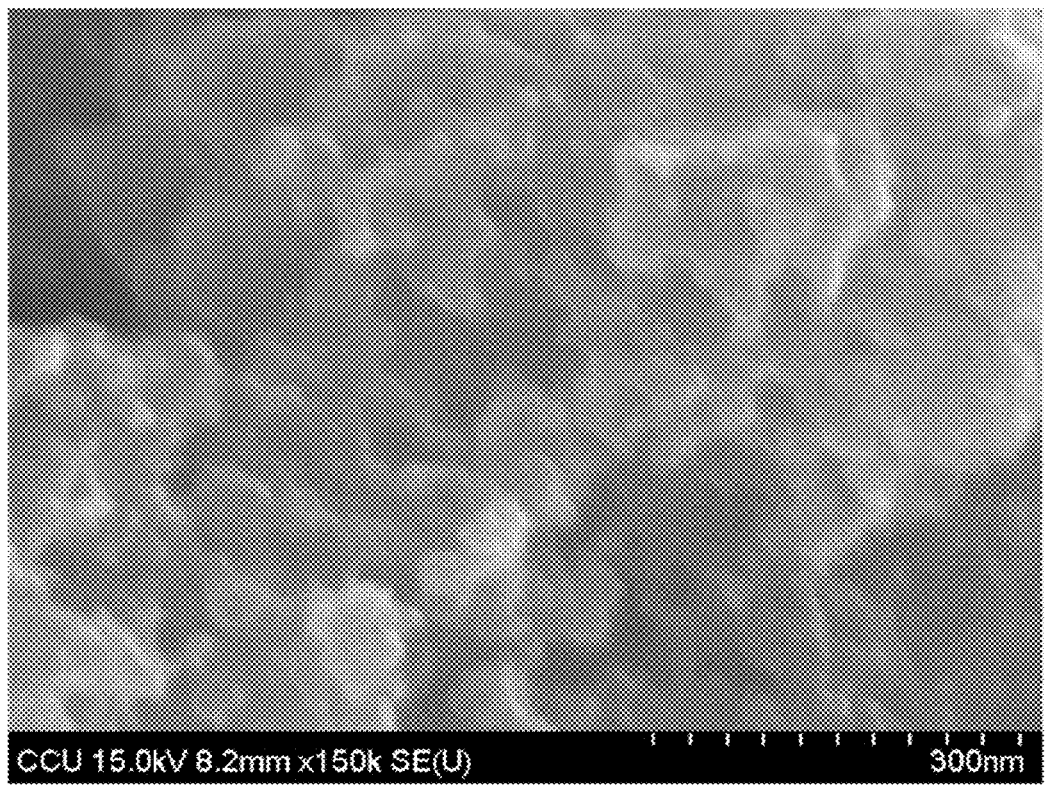
FIG. 18 is an SEM image of $Cu_{2-x}Se$ nanoparticles made at TOP/Se of 1.68/1, at the reaction temperature of 180° C. and with the reaction time of 10 hours.
Figure 19:
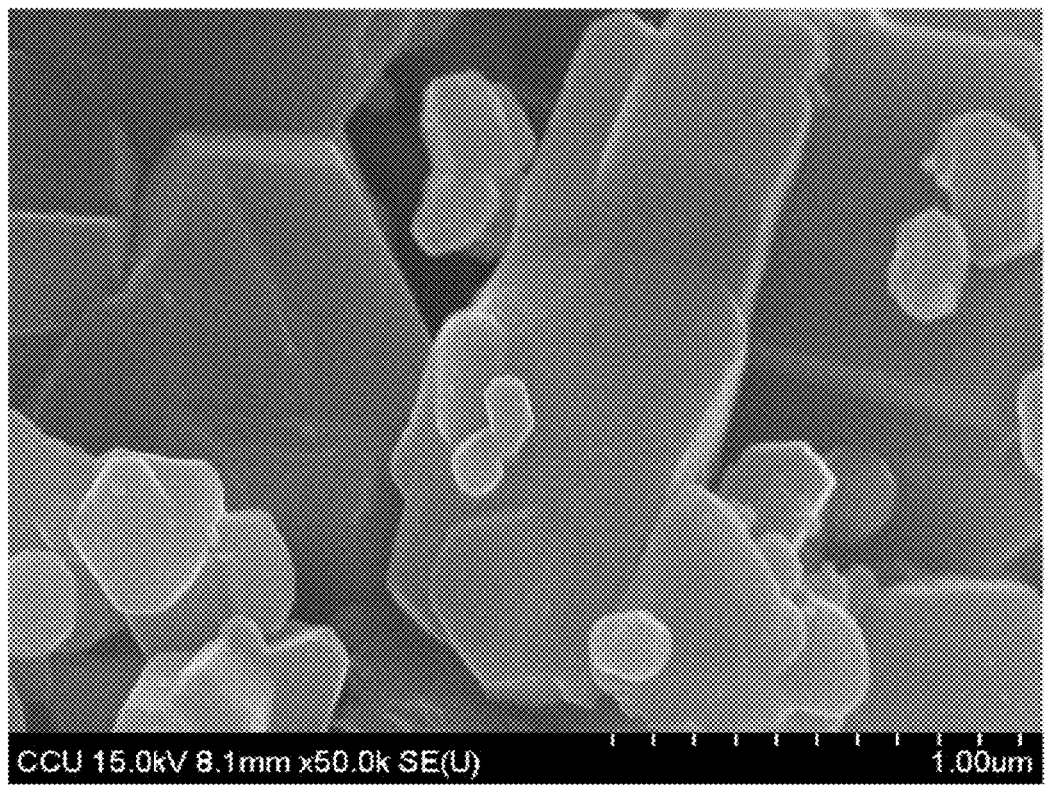
FIG. 19 is an SEM image of $Cu_{2-x}Se$ nanoparticles made at TOP/Se of 1.68/1, at the reaction temperature of 210° C. and with the reaction time of 5 hours.
Figure 20:
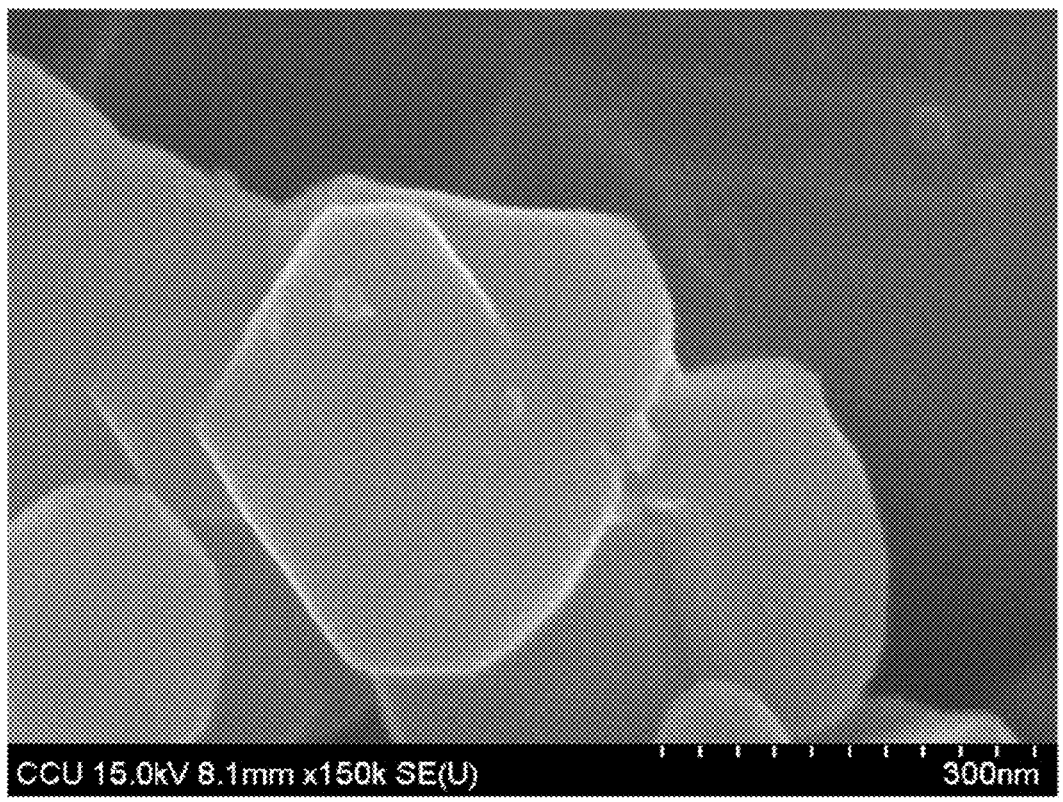
FIG. 20 is an SEM image of $Cu_{2-x}Se$ nanoparticles made at TOP/Se of 1.68/1, at the reaction temperature of 210° C. and with the reaction time of 5 hours.
Figure 21:
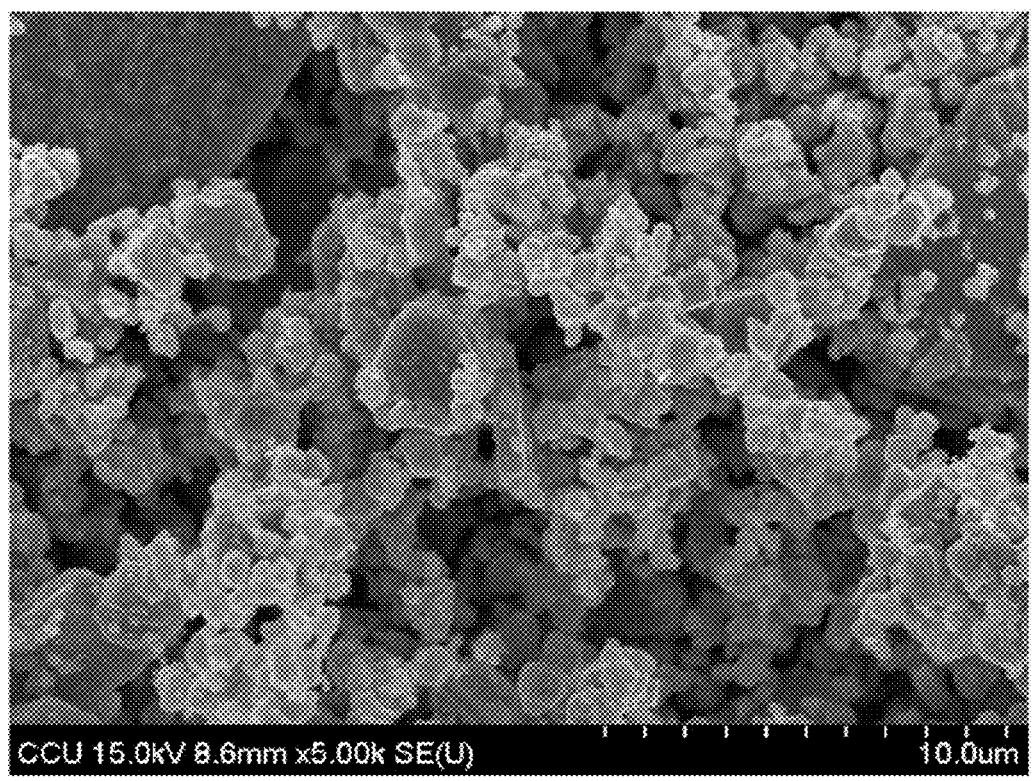
FIG. 21 is an SEM image of $Cu_{2-x}Se$ nanoparticles made at TOP/Se of 1.68/1, at the reaction temperature of 210° C. and with the reaction time of 10 hours.
Figure 22:
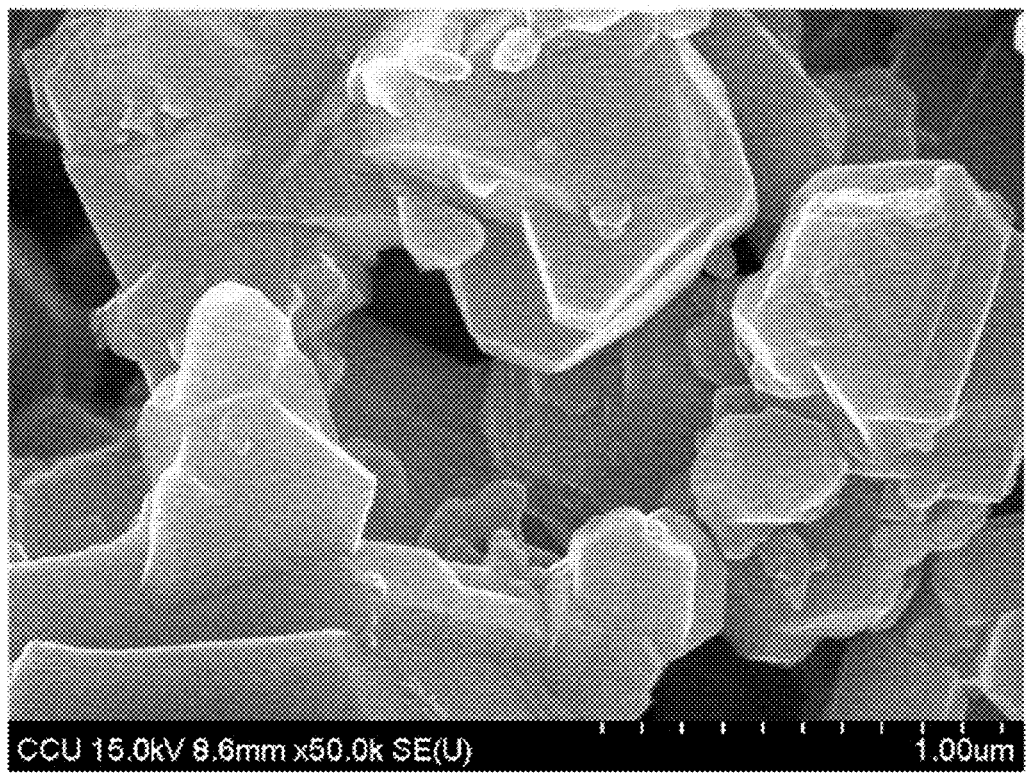
FIG. 22 is an SEM image of $Cu_{2-x}Se$ nanoparticles made at TOP/Se of 1.68/1, at the reaction temperature of 210° C. and with the reaction time of 10 hours.

FIG. 15 and FIG. 16 are SEM images of $Cu_{2-x}Se$ nanoparticles made at the reaction temperature of 180° C. and with the reaction time of 8 hours. When the reaction is not completed, the grain size is about 28 nm. FIG. 17 and FIG. 18 are SEM images of $Cu_{2-x}Se$ nanoparticles made at the reaction temperature of 180° C. with the reaction time of 10 hours, and the figures show that the grain size is about 34 nm, which is similar to the value calculated by Scherrer equation. However, a phenomenon of aggregation occurs, with reference to Zhu, J. et al. *J. Phys. Chem. B* 104, 7344 (2000), and subsequent embodiments related to the analyses of grain size will explain the results. Furthermore, nanoplate structure exists when the reaction proceeds at 210° C. for 5 hours, and the grain size ranges from 300 nm to 1 μm, as shown in FIG. 19 and FIG. 20, which indicates that extended reaction time or high reaction temperature will result in increasing grain size. Similarly, when the reaction time is 10 hours, the nanoplate structure is very obvious, and the grain size is even as high as 2 μm, as shown in FIG. 21 and FIG. 22.

Ninth Embodiment

The present embodiment relates to analyses of SEM images of $Cu_{2-x}Se$ nanoparticles made at Cu/Se of 2/1.1 and at TOP/Se of 4/1.

Figure 23:
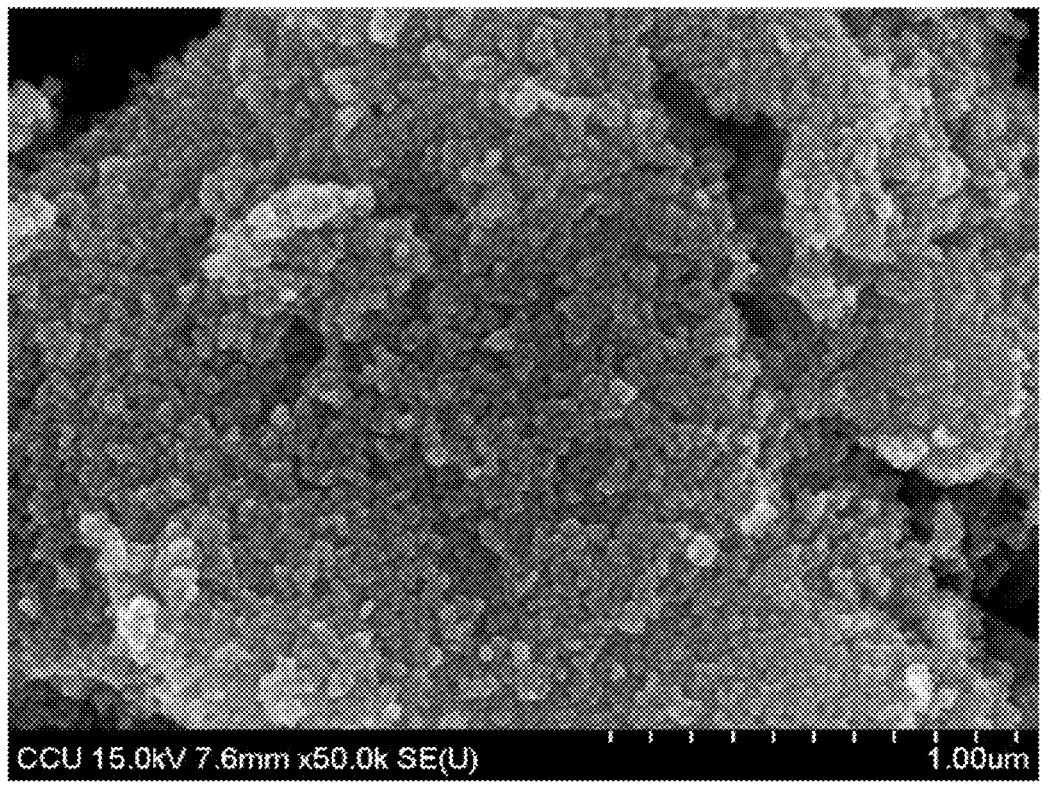
FIG. 23 is an SEM image of $Cu_{2-x}Se$ nanoparticles made at TOP/Se of 4/1, at the reaction temperature of 180° C. and with the reaction time of 24 hours.
Figure 24:
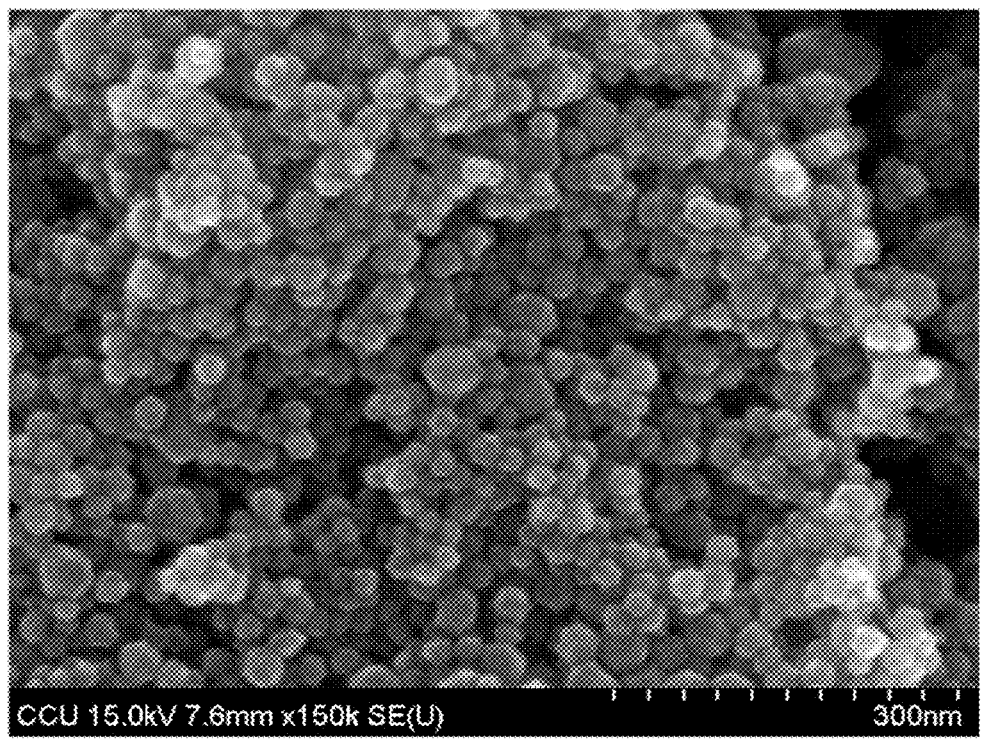
FIG. 24 is an SEM image of $Cu_{2-x}Se$ nanoparticles made at TOP/Se of 4/1, at the reaction temperature of 180° C. and with the reaction time of 24 hours.
Figure 25:
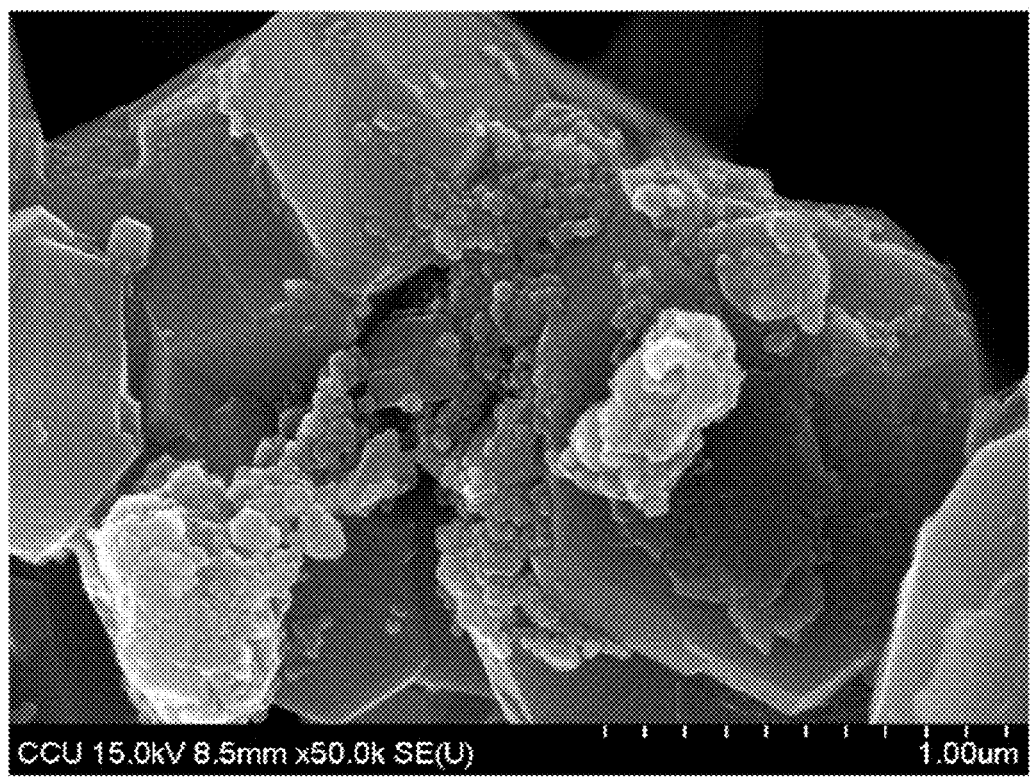
FIG. 25 is an SEM image of $Cu_{2-x}Se$ nanoparticles made at TOP/Se of 4/1, at the reaction temperature of 180° C. and with the reaction time of 36 hours.
Figure 26:
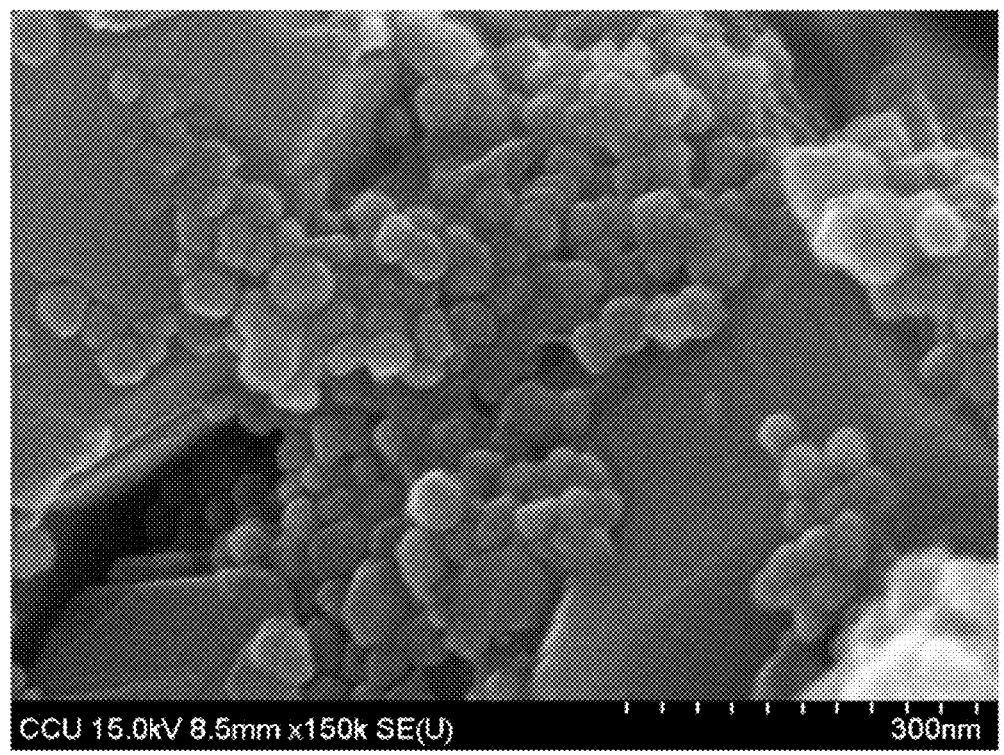
FIG. 26 is an SEM image of $Cu_{2-x}Se$ nanoparticles made at TOP/Se of 4/1, at the reaction temperature of 180° C. and with the reaction time of 36 hours.
Figure 27:
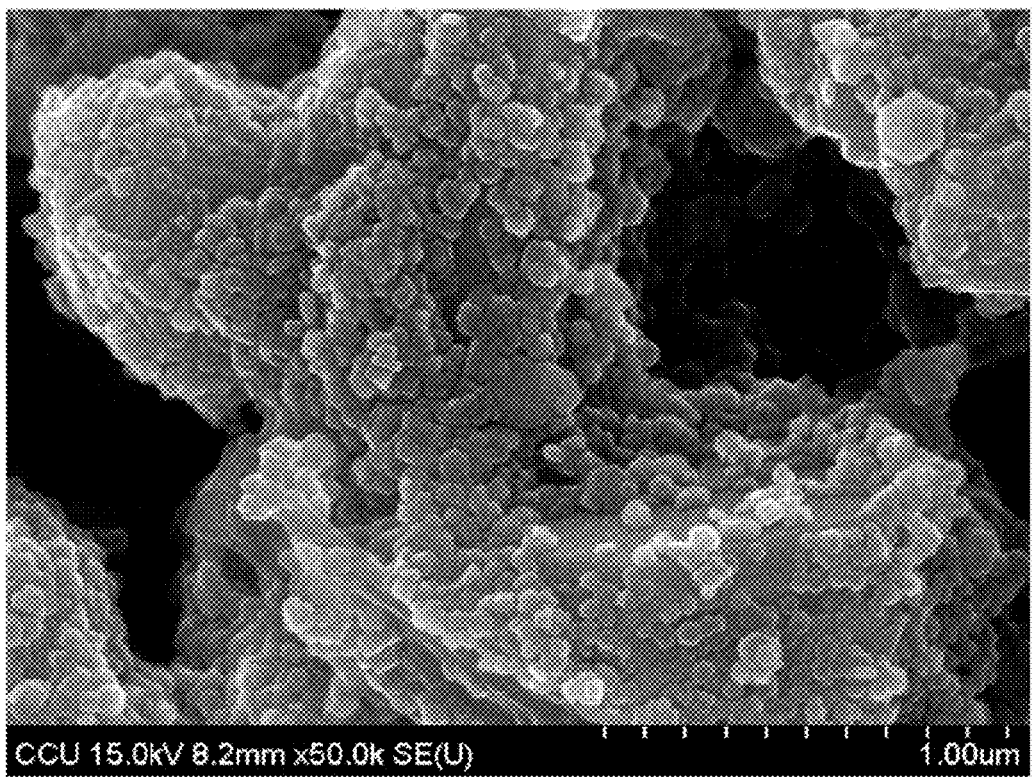
FIG. 27 is an SEM image of $Cu_{2-x}Se$ nanoparticles made at TOP/Se of 4/1, at the reaction temperature of 210° C. and with the reaction time of 8 hours.
Figure 28:
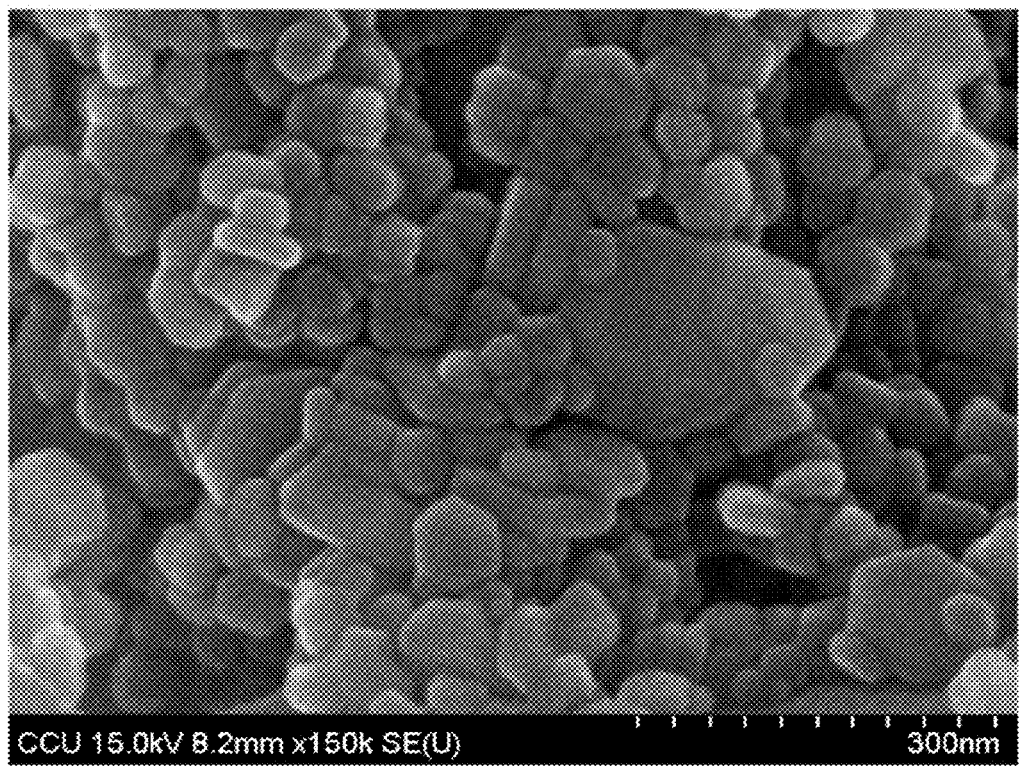
FIG. 28 is an SEM image of $Cu_{2-x}Se$ nanoparticles made at TOP/Se of 4/1, at the reaction temperature of 210° C. and with the reaction time of 8 hours.
Figure 29:
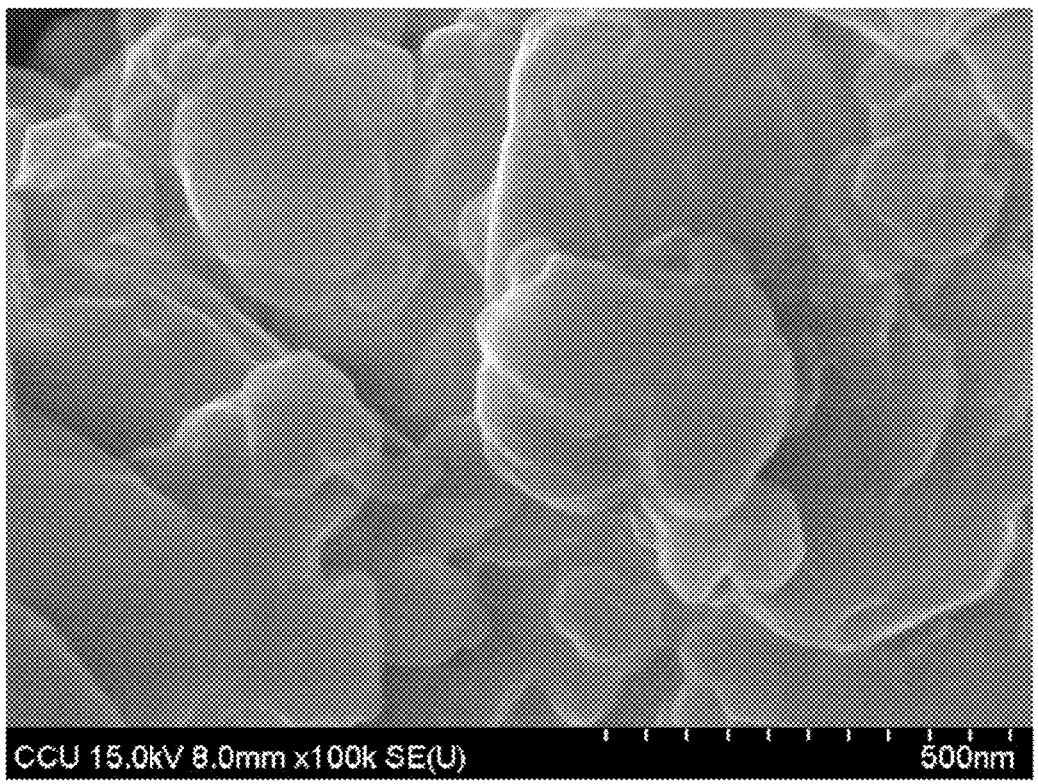
FIG. 29 is an SEM image of $Cu_{2-x}Se$ nanoparticles made at TOP/Se of 4/1, at the reaction temperature of 210° C. and with the reaction time of 15 hours.
Figure 30:
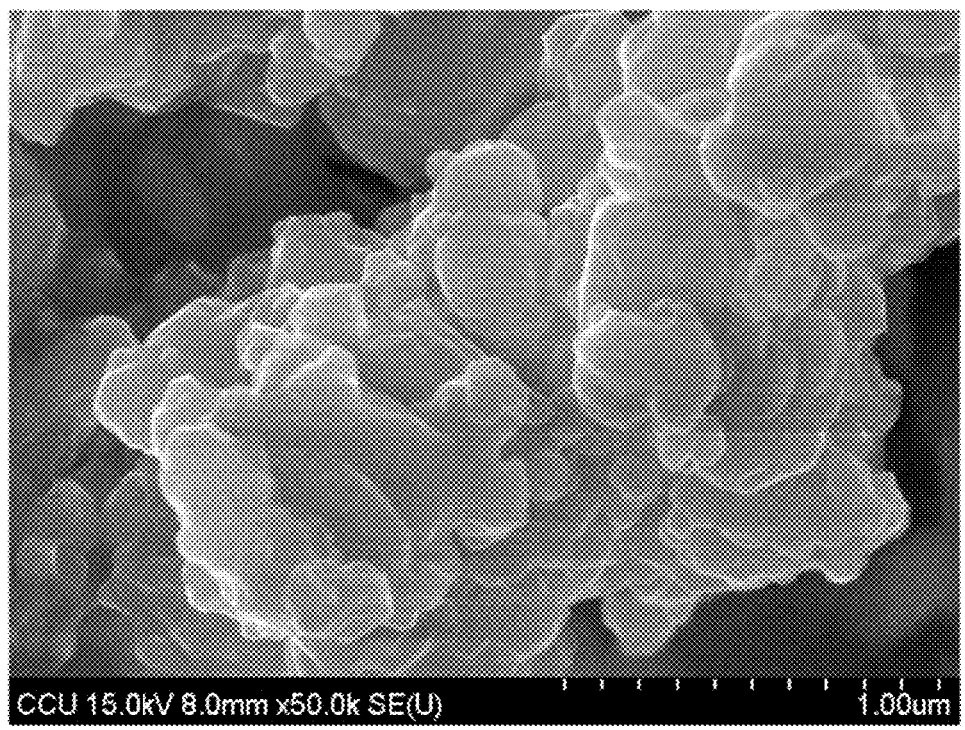
FIG. 30 is an SEM image of $Cu_{2-x}Se$ nanoparticles made at TOP/Se of 4/1, at the reaction temperature of 210° C. and with the reaction time of 15 hours.

FIG. 23 and FIG. 24 are SEM images of $Cu_{2-x}Se$ nanoparticles made at the reaction temperature of 180° C. and with the reaction time of 24 hours. Figures show that another crystalline phase exists besides the $Cu_{2-x}Se$ crystalline phase, and the grain size is about 30 nm. $Cu_{2-x}Se$ nanoparticles made at the reaction temperature of 180° C. and with the reaction time of 36 hours also have a nanoplate structure of 1 μm grain size besides nanoparticles of about 42 nm in grain size, as shown in FIG. 25 and FIG. 26. $Cu_{2-x}Se$ nanoparticles made at the reaction temperature of 210° C. and with the reaction time of 8 hours have a more complicated structure, besides nanoparticles of 40 nm in grain size, the $Cu_{2-x}Se$ nanoparticles have a nano-rod structure of 80 nm, as shown in FIG. 27 and FIG. 28, and the result is assumed to be caused by the non-uniform stirring by the stir bar. FIG. 29 and FIG. 30 are SEM images of $Cu_{2-x}Se$ nanoparticles made at the reaction temperature of 210° C. and with the reaction time of 15 hours, and the figures show that the all structures of the $Cu_{2-x}Se$ nanoparticles are nanoplate structures, and the maximum grain size is about 2 μm.

Tenth Embodiment

The present embodiment relates to analyses of SEM images of $Cu_{2-x}Se$ nanoparticles made at Cu/Se of 2/1.1 and at TOP/Se of 6/1.

Figure 31:
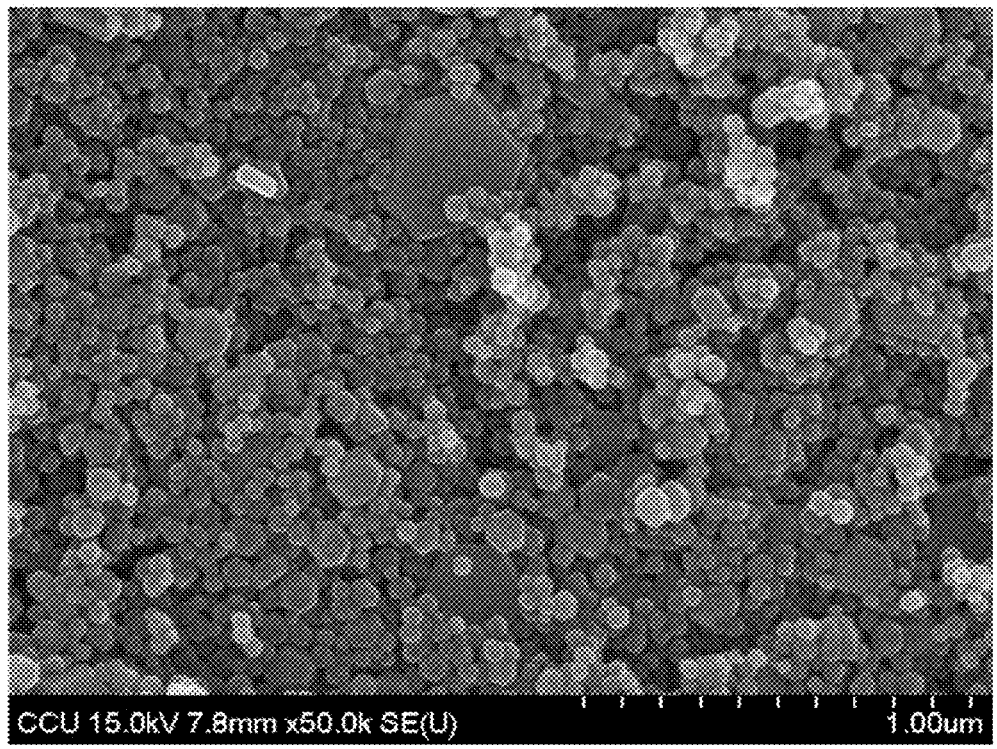
FIG. 31 is an SEM image of $Cu_{2-x}Se$ nanoparticles made at TOP/Se of 6/1, at the reaction temperature of 210° C. and with the reaction time of 15 hours.
Figure 32:
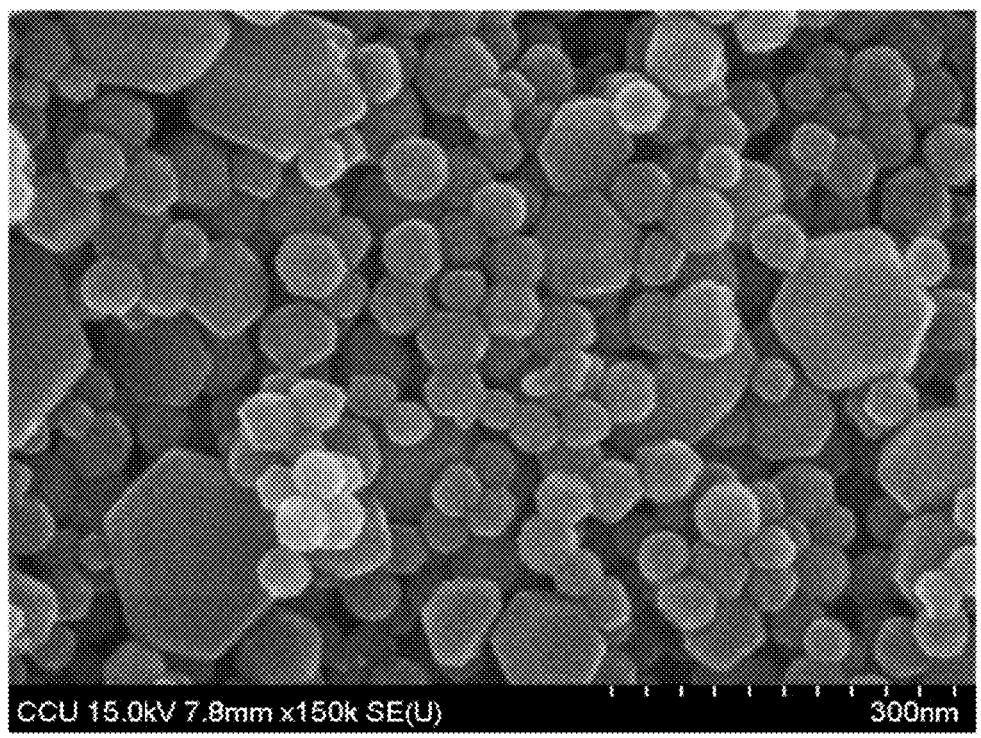
FIG. 32 is an SEM image of $Cu_{2-x}Se$ nanoparticles made at TOP/Se of 6/1, at the reaction temperature of 210° C. and with the reaction time of 15 hours.
Figure 33:
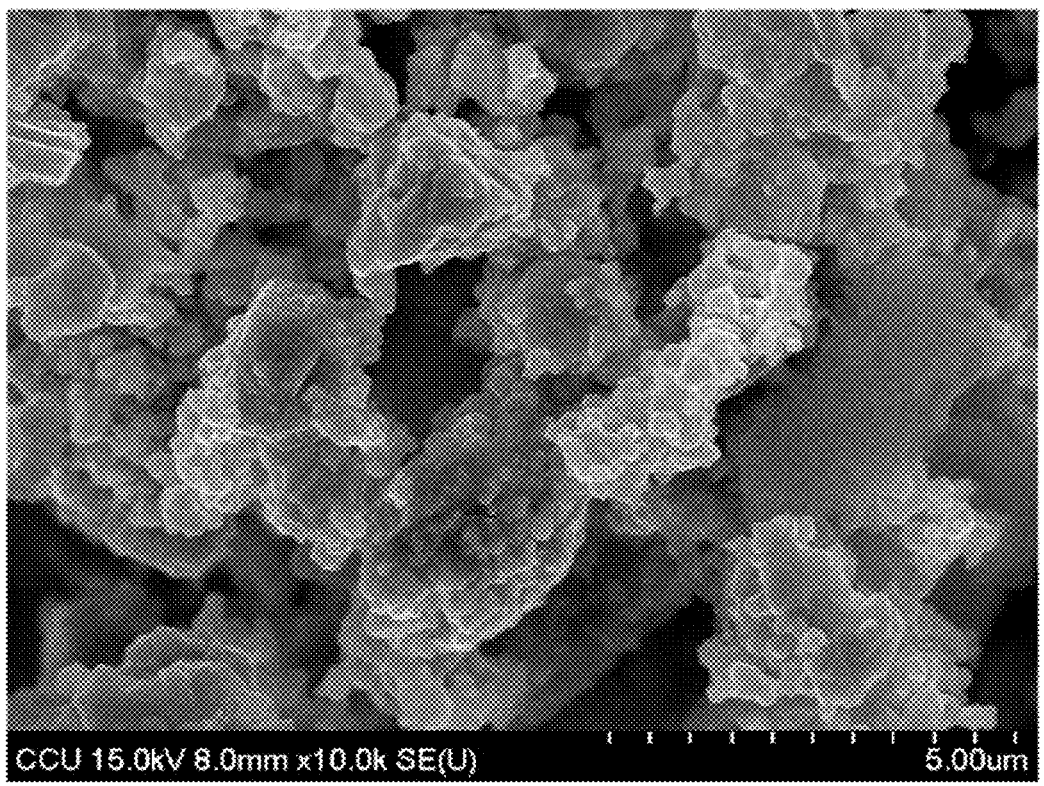
FIG. 33 is an SEM image of $Cu_{2-x}Se$ nanoparticles made at TOP/Se of 6/1, at the reaction temperature of 210° C. and with the reaction time of 24 hours.
Figure 34:
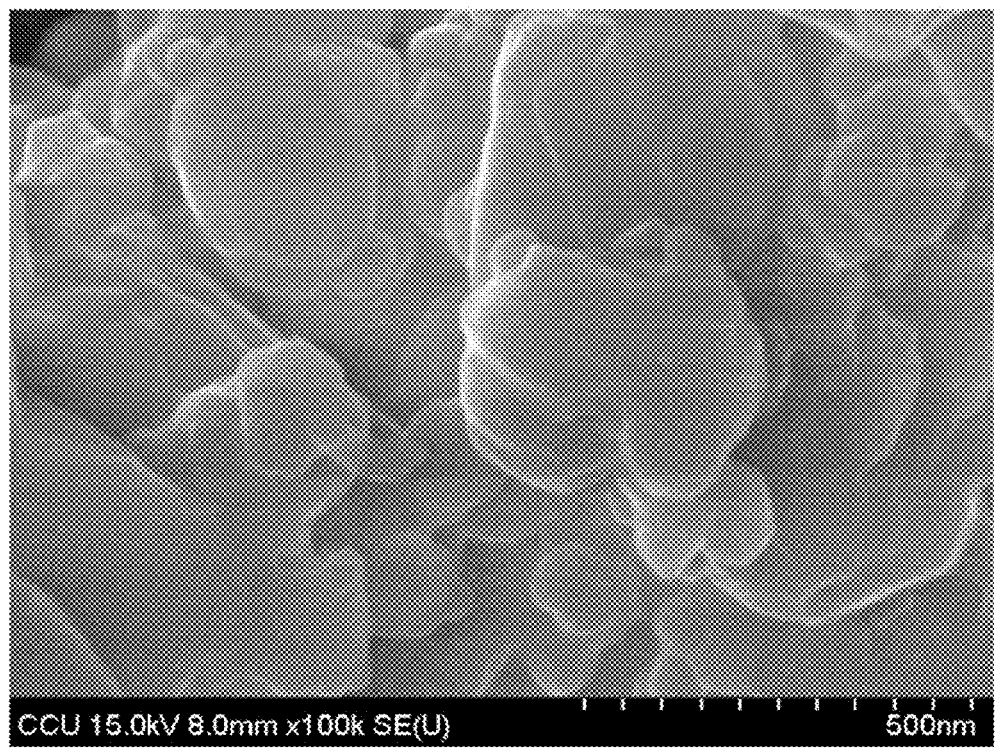
FIG. 34 is an SEM image of $Cu_{2-x}Se$ nanoparticles made at TOP/Se of 6/1, at the reaction temperature of 210° C. and with the reaction time of 24 hours.

FIG. 31 and FIG. 32 show that $Cu_{2-x}Se$ nanoparticles made at the reaction temperature of 210° C. and with the reaction time of 15 hours have nanoplates with a hexagonal structure, which is assumed to be CuSe crystalline phase, with reference to Gosavi, S. R. et al. *J. Alloy. Compd.* 448, 344 (2008). The structures of $Cu_{2-x}Se$ nanoparticles made at the reaction temperature of 210° C. and with the reaction time of 24 hours mostly are nanoplate structures, as shown in FIG. 33 and FIG. 34. Besides, the increasing amount of TOP results in cleaning problem with centrifugation, so dissolving the compound through heating before operating centrifugation is performed whenever necessary.

Eleventh Embodiment

The present embodiment relates to analyses of SEM images of $Cu_{2-x}Se$ nanoparticles made at Cu/Se of 1/1 and at TOP/Se of 4/1.

Figure 35:
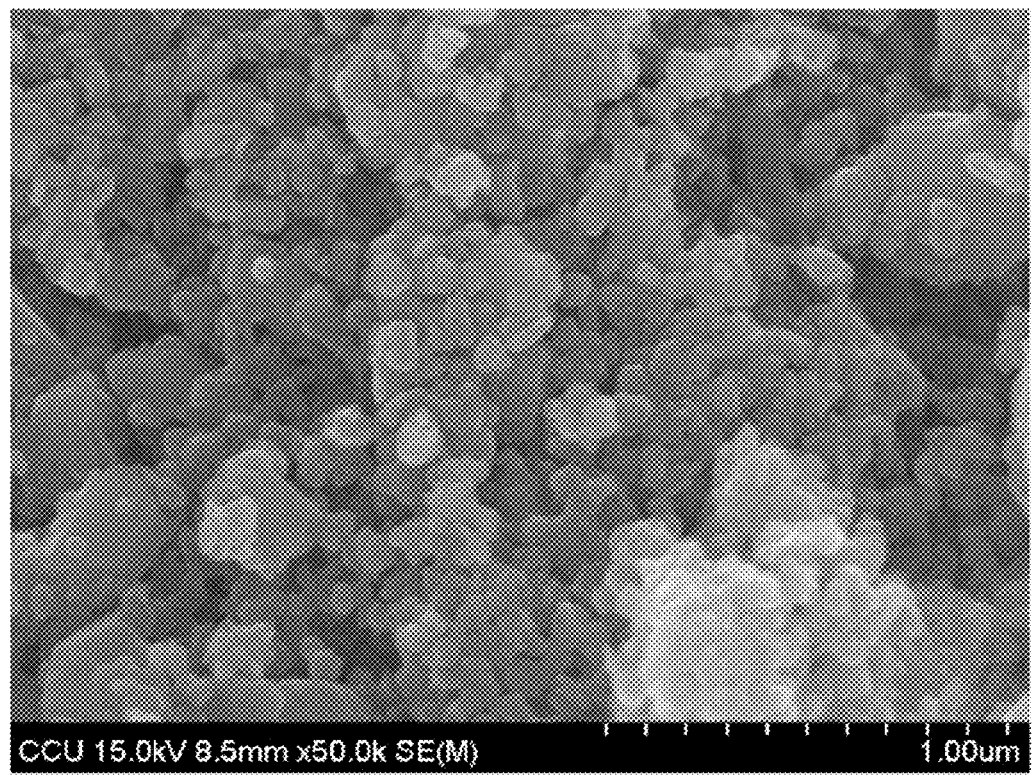
FIG. 35 is an SEM image of $Cu_{2-x}Se$ nanoparticles made at Cu/Se of 1/1, at the reaction temperature of 210° C. and with the reaction time of 2 hours.
Figure 36:
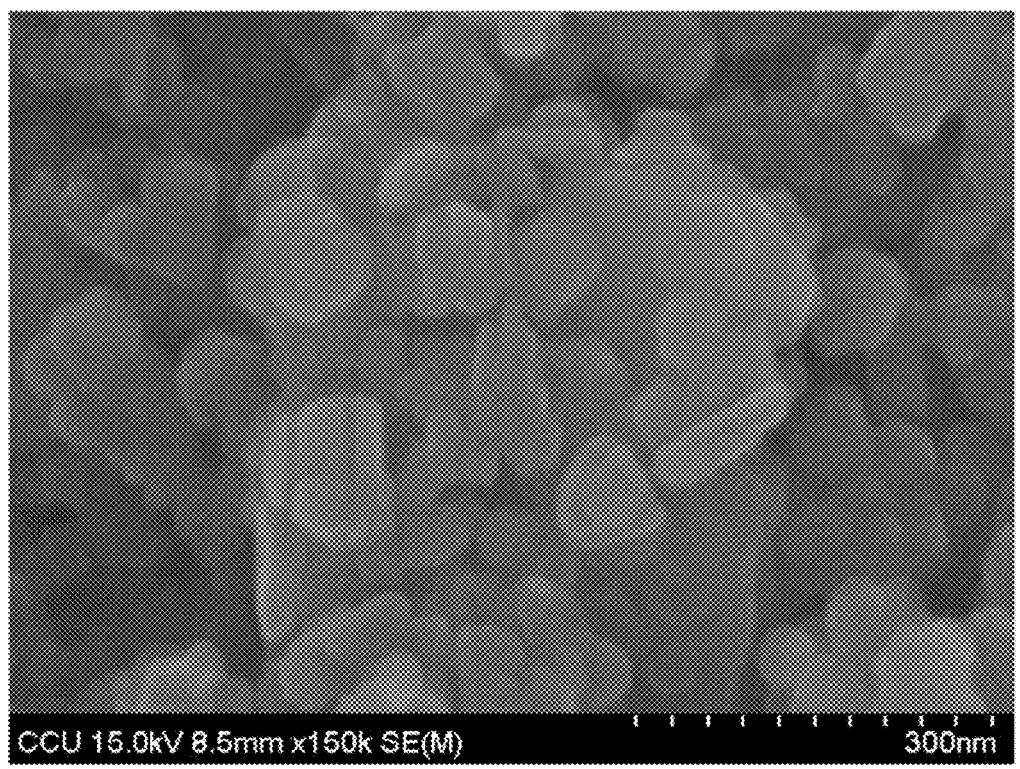
FIG. 36 is an SEM image of $Cu_{2-x}Se$ nanoparticles made at Cu/Se of 1/1, at the reaction temperature of 210° C. and with the reaction time of 2 hours.
Figure 37:
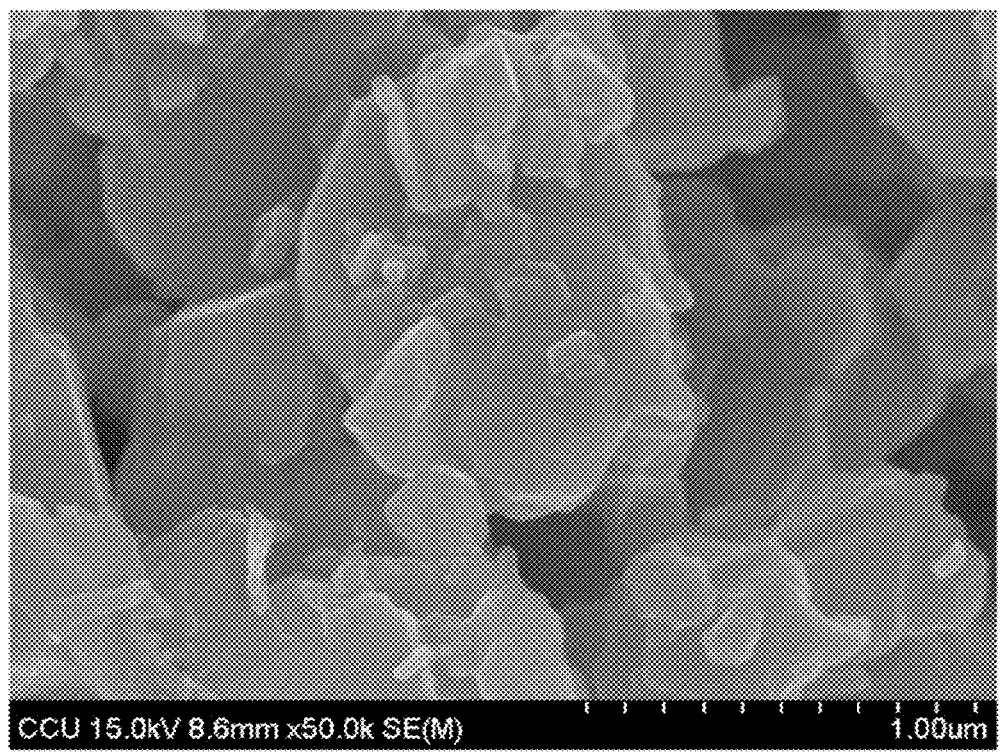
FIG. 37 is an SEM image of $Cu_{2-x}Se$ nanoparticles made at Cu/Se of 1/1, at the reaction temperature of 210° C. and with the reaction time of 10 hours.
Figure 38:
FIG. 38 is an SEM image of $Cu_{2-x}Se$ nanoparticles made at Cu/Se of 1/1, at the reaction temperature of 210° C. and with the reaction time of 10 hours.
Figure 39:
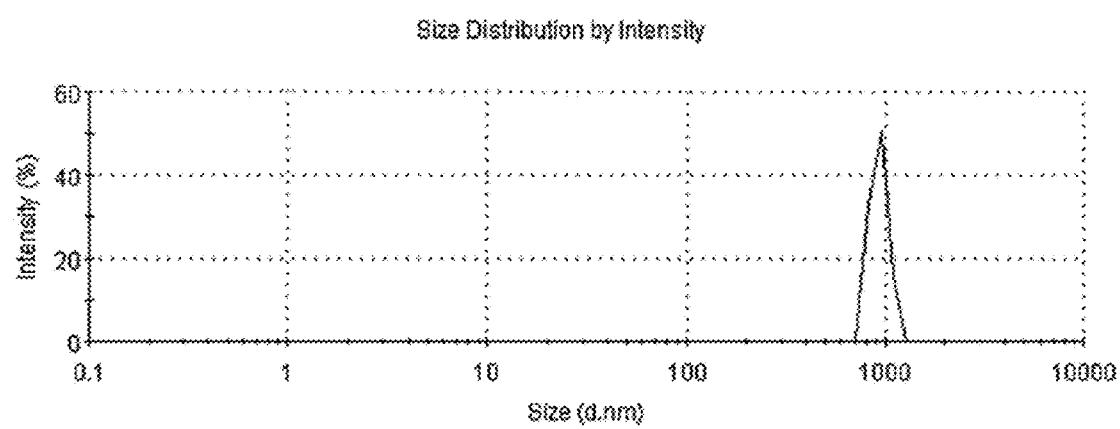
FIG. 39 is a grain size distribution of $Cu_{2-x}Se$ nanoparticles made at TOP/Se of 1.68/1, at the reaction temperature of 180° C. and with the reaction time of 10 hours and then the ethanol solution containing $Cu_{2-x}Se$ nanoparticles was sonicated for 3 days.
Figure 40:
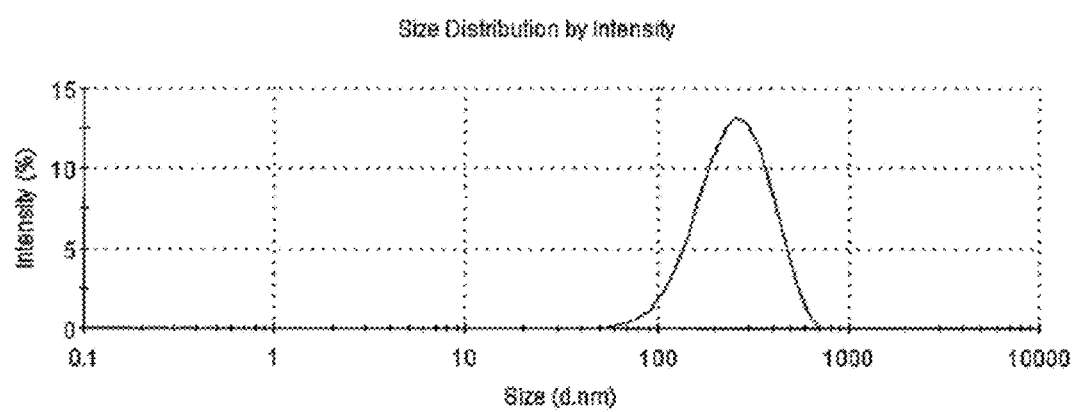
FIG. 40 is a grain size distribution of $Cu_{2-x}Se$ nanoparticles made at TOP/Se of 1.68/1, at the reaction temperature of 180° C. and with the reaction time of 10 hours and then the ethanol solution containing $Cu_{2-x}Se$ nanoparticles was sonicated for 2 weeks.
Figure 41:
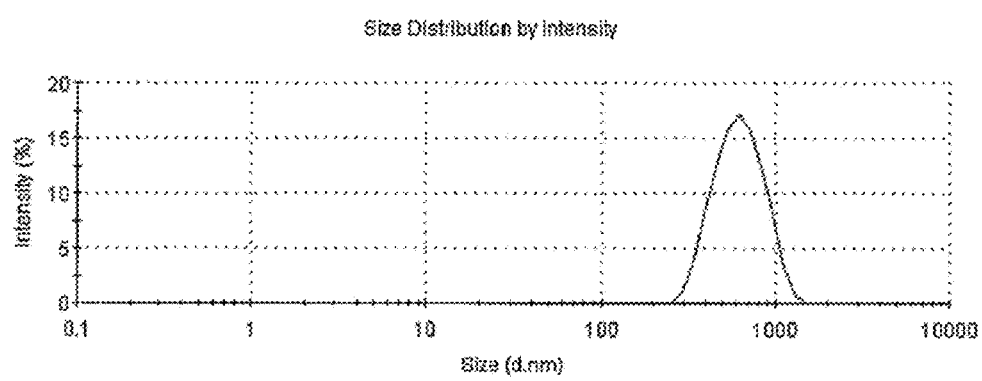
FIG. 41 is a grain size distribution of $Cu_{2-x}Se$ nanoparticles made at TOP/Se of 4/1, at the reaction temperature of 210° C. and with the reaction time of 10 hours and then the ethanol solution containing $Cu_{2-x}Se$ nanoparticles was sonicated for 3 days.
Figure 42:
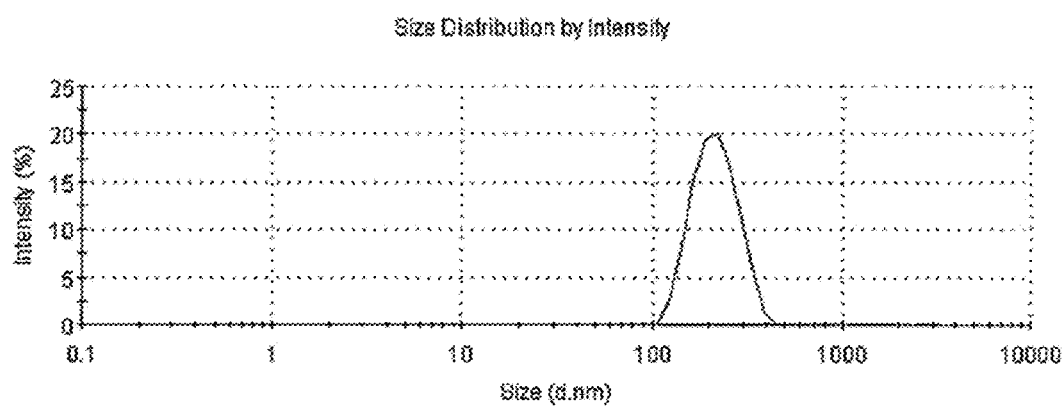
FIG. 42 is a grain size distribution of $Cu_{2-x}Se$ nanoparticles made at TOP/Se of 4/1, at the reaction temperature of 210° C. and with the reaction time of 10 hours and then the ethanol solution containing $Cu_{2-x}Se$ nanoparticles was sonicated for 2 weeks.

FIG. 35 and FIG. 36 show that $Cu_{2-x}Se$ nanoparticles made at the reaction temperature of 210° C. and with the reaction time of 2 hours have obvious nanoparticles but no nanoplate structure, and the grain size ranges between 40 nm and 60 nm, and still the aggregation phenomenon occurs. $Cu_{2-x}Se$ nanoparticles made at the reaction temperature of 210° C. and with the reaction time of 10 hours also have nanoplate structures ranging between 200 nm and 1 μm, as shown in FIG. 37 and FIG. 38.

Twelfth Embodiment

The present embodiment relates to analyses of grain size of $Cu_{2-x}Se$ nanoparticles.

In the present embodiment, an ethanol solution containing $Cu_{2-x}Se$ nanoparticle was measured after being sonicated for 3 days, and the results are tabulated in Table 3 and Table 4. Table 3 shows the grain size of $Cu_{2-x}Se$ nanoparticles made at the ratio of Cu/Se of 2/1.1 and the ratio of TOP/Se of 1.68/1. Table 4 shows the grain size of $Cu_{2-x}Se$ nanoparticles made at the ratio of Cu/Se of 2/1.1 and the ratio of TOP/Se of 4/1. The grain size is determined through particle size analyzer. The measurement obtained by particle size analyzer is different from the measurement obtained by calculation of full width at half maximum of XRD diagram and is different from the measurement obtained by SEM image, which was attributed to the aggregation effect of nanoparticles.

TABLE 3

| Reaction temperature | Reaction time (hr)/Grain size (nm) | | | |
|---|---|---|---|---|
| 180° C. | 4 hr | 6 hr | 8 hr | 10 hr |
|  | 78 nm | 240 nm | 477 nm | 935 nm |
| 210° C. | 2 hr | 5 hr | 10 hr | |
|  | 220 nm | 549 nm | 972 nm | |

TABLE 4

| Reaction temperature | Reaction time (hr)/Grain size (nm) | | | |
|---|---|---|---|---|
| 180° C. | 24 hr<br>100 nm | | 36 hr<br>836 nm | |
| 210° C. | 8 hr<br>314 nm | 10 hr<br>645 nm | 15 hr<br>813 nm | 24 hr<br>978 nm |

Aggregation is resulted from Van der waals forces and chemical bonding, with reference to Lalatonne, Y. et al. *Nat. Mater.* 3, 121 (2004). The grain size measured through particle size analyzer may be the grain size of a few or dozens of $Cu_{2-x}Se$ nanoparticles aggregating together, recognized as an aggregated nanoplate, and such an aggregated nanoplate will form many holes in the thin film after electrophoretical deposition, hence, the quality of the thin film decreases.

The grain size of a $Cu_{2-x}Se$ nanoparticle made at a ratio of TOP/Se of 4/1 is smaller than the grain size of a $Cu_{2-x}Se$ nanoparticle made at a ratio of TOP/Se of 1.68/1, which proves that the grain size decreases with increasing concentration of surfactant. When the sonication time is extended to 2 weeks, the grain size of $Cu_{2-x}Se$ nanoparticles decreases, indicating that most of the particles aggregate by Van der waals forces, because the aggregated particles can be fallen apart by sonication, as shown in FIG. 39 to FIG. 42.

Figure 43:
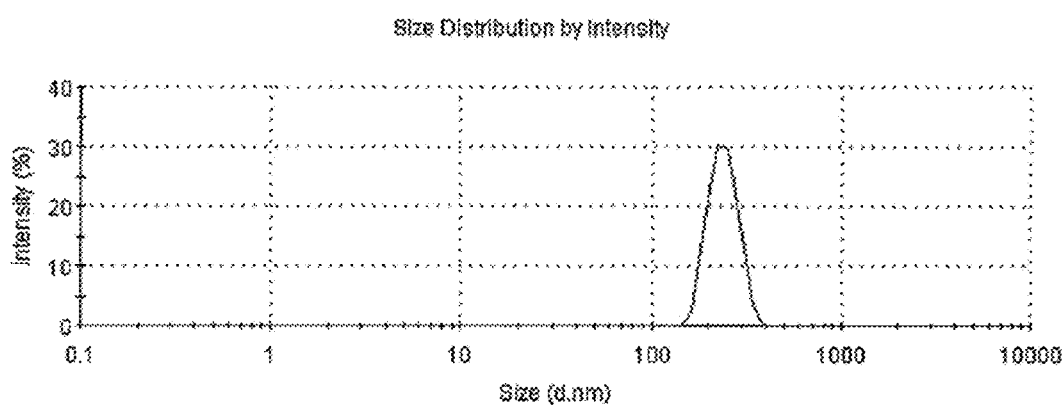
FIG. 43 is a grain size distribution of $Cu_{2-x}Se$ nanoparticles without adding nitric acid into the ethanol solution containing $Cu_{2-x}Se$ nanoparticles.
Figure 44:
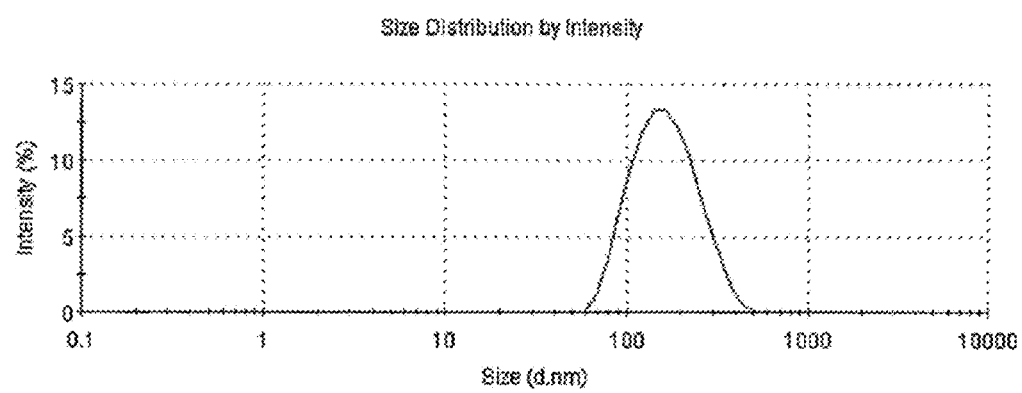
FIG. 44 is a grain size distribution of $Cu_{2-x}Se$ nanoparticles with nitric acid added into the ethanol solution containing $Cu_{2-x}Se$ nanoparticles.

Besides, nitric acid was added into the ethanol solution containing $Cu_{2-x}Se$ nanoparticles, resulting in the decreasing grain size. The result may be attributed to the hydrogen ions, provided from the dissociation of nitric acid and adhering to the surface of particles, which results in the repulsive force between particles and lowering the probability of aggregation, as shown in FIG. 43 and FIG. 44.

Thirteenth Embodiment

The present embodiment relates to analyses of zeta potential of $Cu_{2-x}Se$ nanoparticles.

Figure 45:
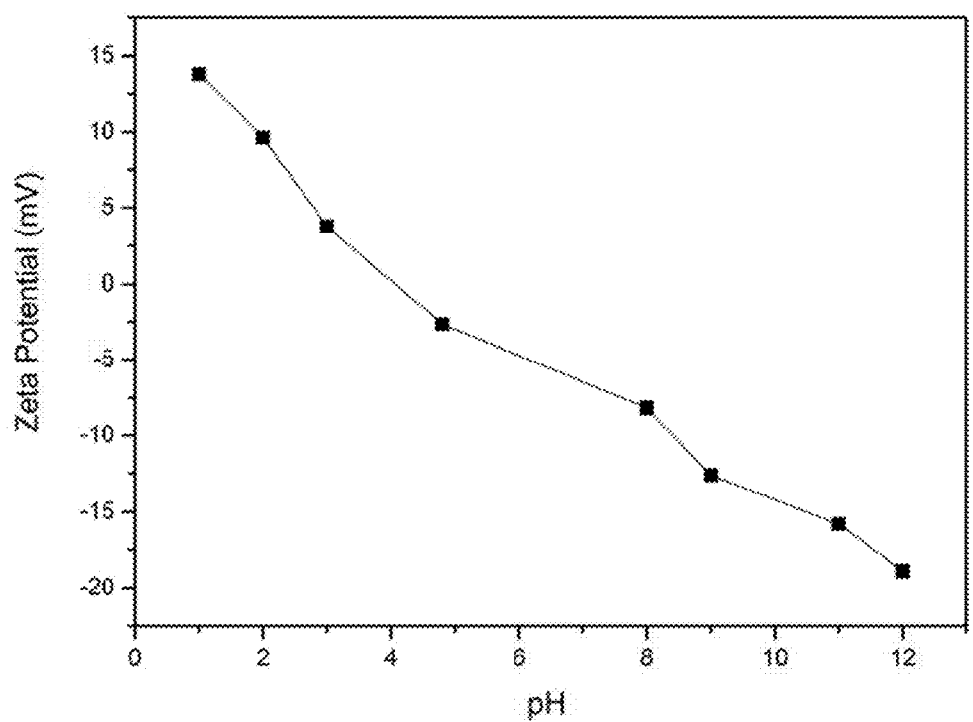
FIG. 45 is a chart of pH value versus zeta potential of $Cu_{2-x}Se$ nanoparticles in the ethanol solution containing $Cu_{2-x}Se$ nanoparticles, which has been sonicated for 3 days.
Figure 46:
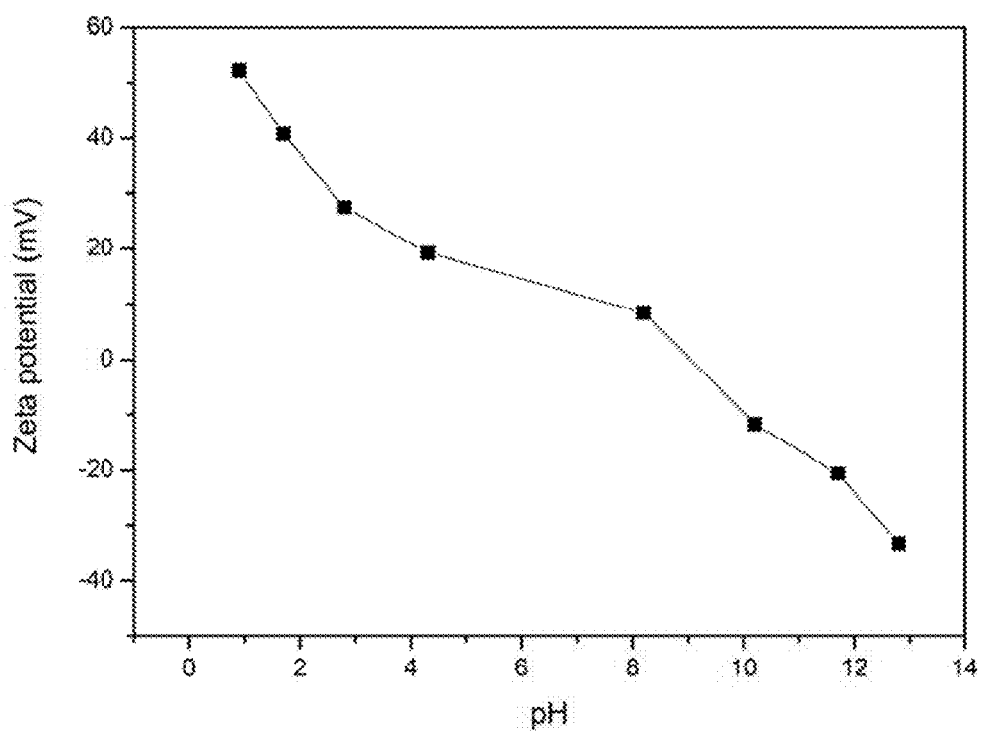
FIG. 46 is a chart of pH value versus zeta potential of $Cu_{2-x}Se$ nanoparticles in the ethanol solution containing $Cu_{2-x}Se$ nanoparticle, which has been sonicated for 2 weeks.

In the present invention, $Cu_{2-x}Se$ nanoparticles were dissolved in ethanol to obtain an ethanol solution containing $Cu_{2-x}Se$ nanoparticles, and the pH value of the ethanol solution containing $Cu_{2-x}Se$ nanoparticles was adjusted through adding nitric acid. FIG. 45 and FIG. 46 show the effect of pH value on zeta potential, that is, zeta potential increases with decreasing pH value, which was attributed to more positive charges existing in the lower-pH environment, with reference to Yum, J. H. et al. *J. Photochem. Photobiol. A-Chem.* 173, 1 (2005). Zeta potential value affects the electrophoretic speed. FIG. 45 shows pH value versus zeta potential of $Cu_{2-x}Se$ nanoparticles in the ethanol solution containing $Cu_{2-x}Se$ nanoparticles, which has been sonicated for 3 days, and the $Cu_{2-x}Se$ nanoparticles are made at the ratio of Cu/Se of 2/1.1, at the ratio of TOP/Se of 1.68/1 and at 180° C. for 10 hours. The zeta potential of the $Cu_{2-x}Se$ nanoparticles in the ethanol solution containing $Cu_{2-x}Se$ nanoparticles is 13.6 mV when pH is 1. FIG. 46 shows pH value versus zeta potential of $Cu_{2-x}Se$ nanoparticles in the ethanol solution containing $Cu_{2-x}Se$ nanoparticles, which has been sonicated for 2 weeks, and the $Cu_{2-x}Se$ nanoparticles are made under the same conditions as mentioned above, the zeta potential thereof is 52.3 mV when pH is 1. The results may be attributed to the effect of grain size. The grain size of $Cu_{2-x}Se$ nanoparticles in the ethanol solution containing $Cu_{2-x}Se$ nanoparticles that has been sonicated for 3 days is about 900 nm, while the grain size of $Cu_{2-x}Se$ nanoparticles in the ethanol solution containing $Cu_{2-x}Se$ nanoparticles that has been sonicated for 2 weeks is about 200 nm, and the grain size is determined by particle size analyzer. Some publications indicate that grain size affects the electrophoretic mobility, resulting in changing zeta potential, with reference to Leroy, P. et al. *J. Colloid Interface Sci.* 356, 442 (2011).

Fourteenth Embodiment

The present embodiment relates to ICP-AES analyses of $Cu_{2-x}Se$ nanoparticles.

In the present embodiment, $Cu_{2-x}Se$ nanoparticles were dissolved in chlorazotic acid and diluted with DI water, then the resulting sample was sent to Instrument Center at National Tsinghua University for ICP-AES analysis, and the results are tabulated in Table 5. Table 5 shows the results of ratios of Cu/Se of $Cu_{2-x}Se$ nanoparticles made at different reaction temperatures and different reaction times at the a ratio of Cu/Se of 2/1.1 and a ratio of TOP/Se of 1.68/1. Whether the reaction temperature is 180° C. or 210° C., the longer the reaction time, the less Se. When the reaction temperature is 180° C. and the reaction time is less than 10 hours, because $Cu_{2-x}Se$ nanoparticles have $Cu_3Se_2$ crystalline phase, the concentration of Se is higher. When the reaction time reaches 10 hours, $Cu_{2-x}Se$ nanoparticles have complete crystalline phase and at this time, $Cu_{2-x}Se=Cu_{1.95}Se$, wherein x is 0.05. When the reaction temperature is 210° C., although the $Cu_{2-x}Se$ nanoparticles have desired crystalline phase, the concentration of Cu is higher and the ratio of Cu/Se is larger than 2, which is determined by ICP-AES.

TABLE 5

| Reaction temperature | Reaction time (hr)/Cu:Se | | | |
|---|---|---|---|---|
| 180° C. | 10 hr<br>1.95:1 | 8 hr<br>1.9:1 | 6 hr<br>1.84:1 | 4 hr<br>1.79:1 |
| 210° C. | 10 hr<br>2.14:1 | 5 hr<br>2.09:1 | 2 hr<br>2.04:1 | |

Fifteenth Embodiment

The present embodiment relates to analyses of optical characteristics of $Cu_{2-x}Se$ nanoparticles.

Figure 47:
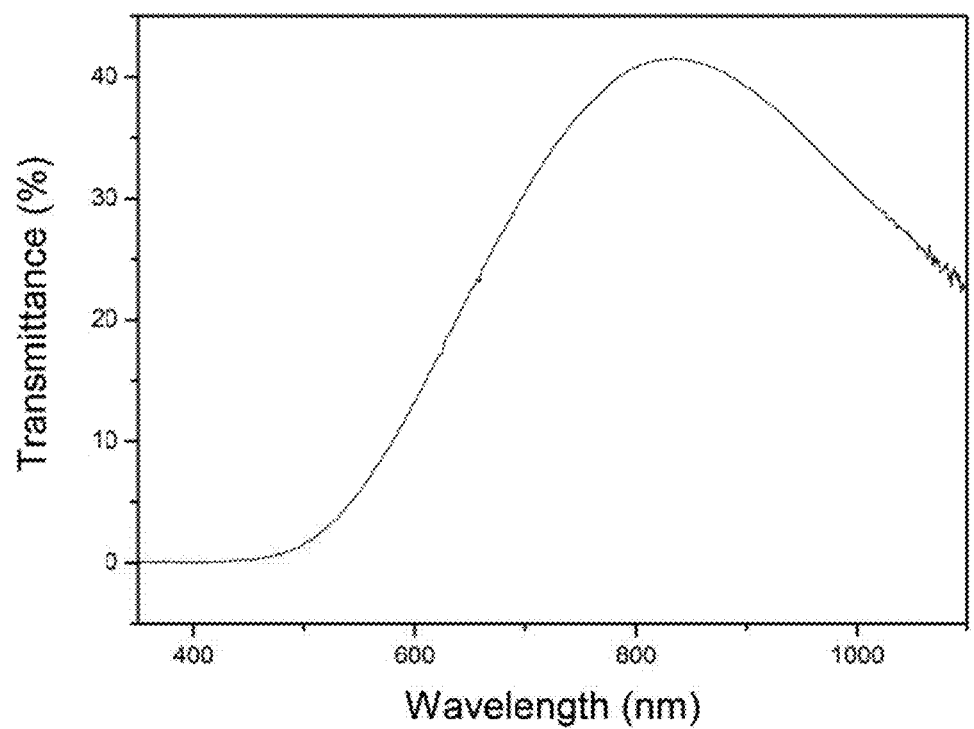
FIG. 47 is a UV-Visible spectrum of $Cu_{2-x}Se$ nanoparticles with only $Cu_{2-x}Se$ crystalline phase.
Figure 48:
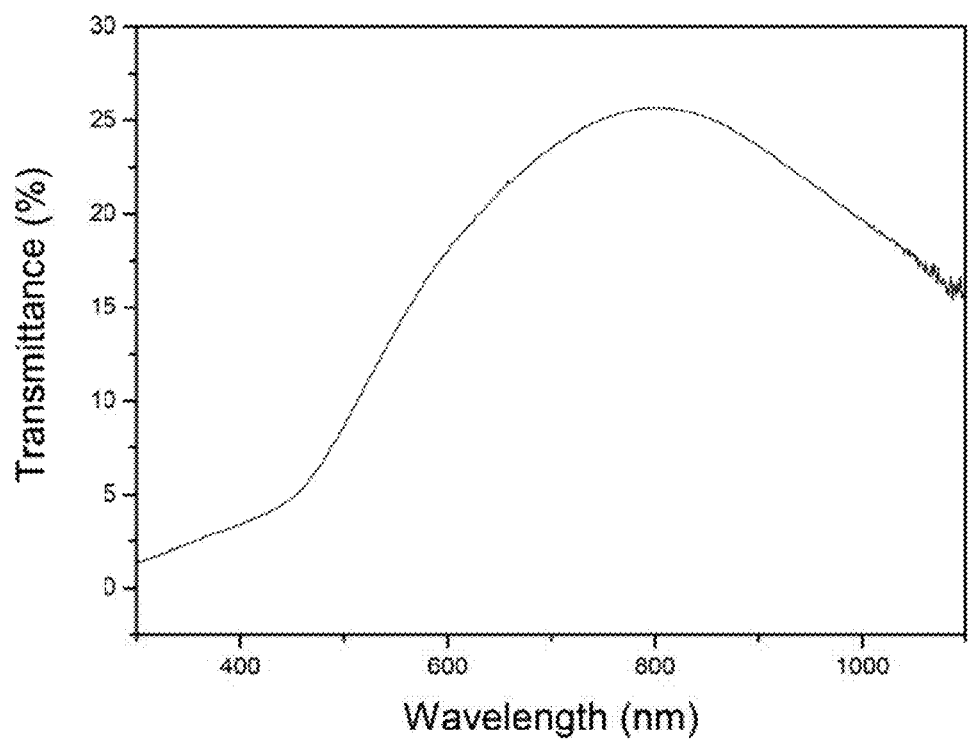
FIG. 48 is a UV-Visible spectrum of $Cu_{2-x}Se$ nanoparticles containing $Cu_3Se_2$ crystalline phase.
Figure 49:
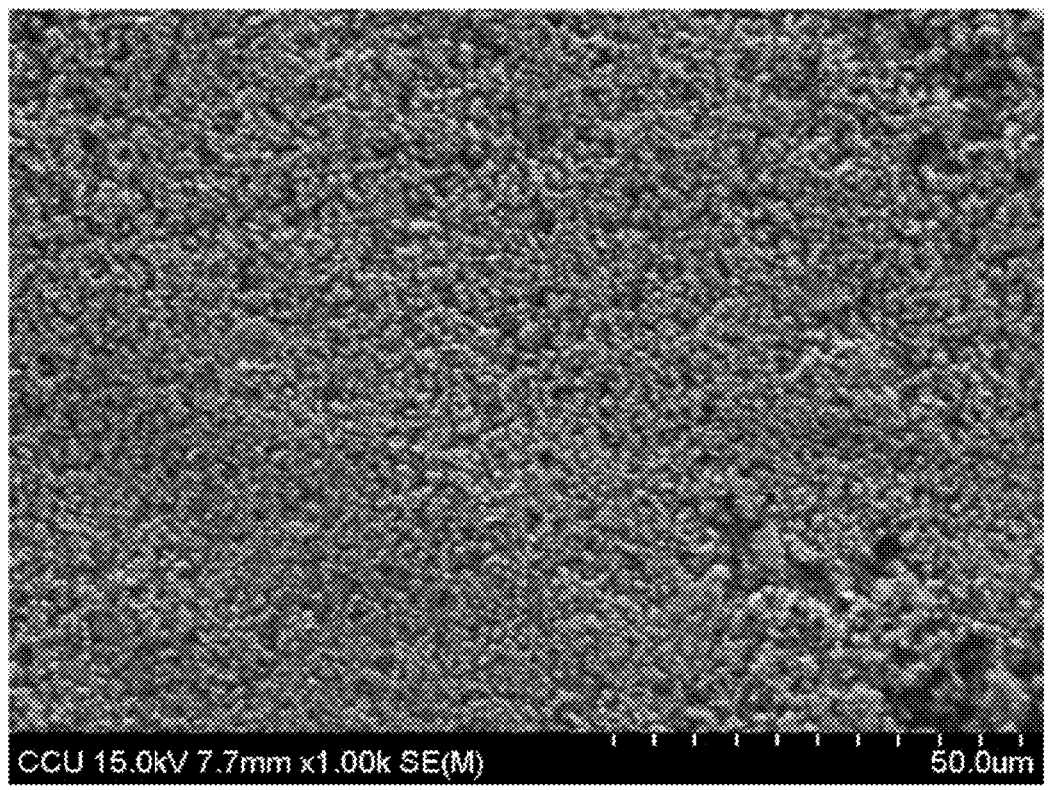
FIG. 49 is an SEM image of a deposited $Cu_{2-x}Se$ thin film made from $Cu_{2-x}Se$ nanoparticles with the grain size about 900 nm and formed by electrophoretical deposition, wherein the voltage is 30 V.
Figure 50:
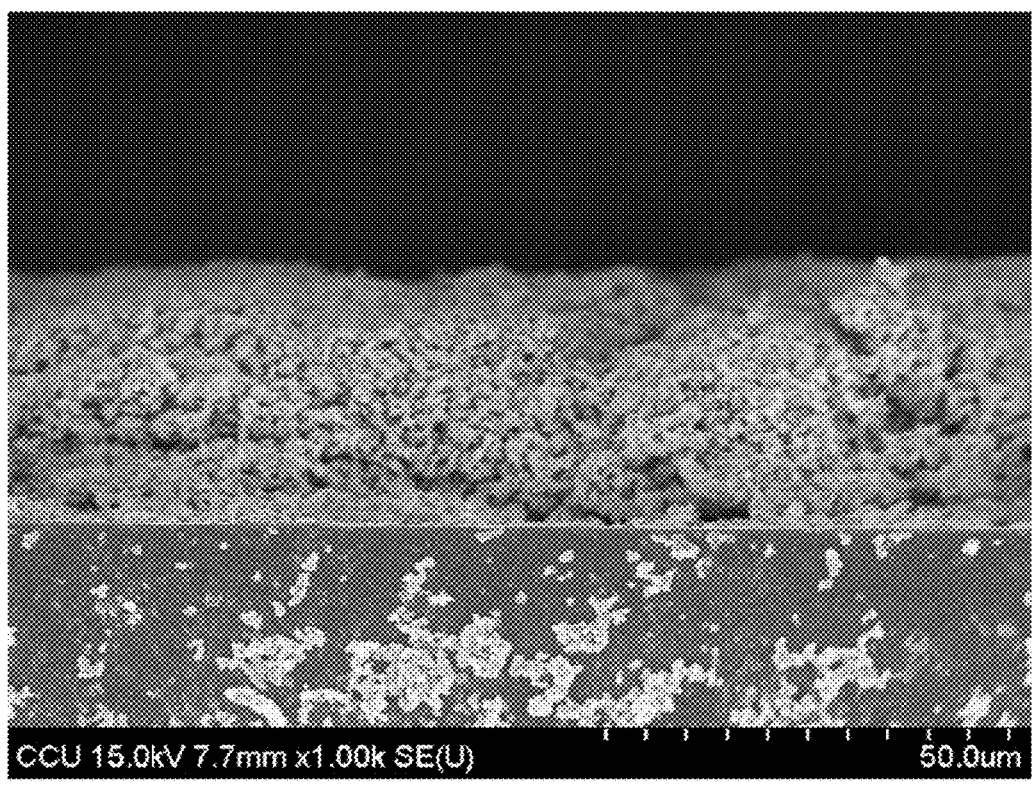
FIG. 50 is an SEM image of a deposited $Cu_{2-x}Se$ thin film made from $Cu_{2-x}Se$ nanoparticles with the grain size about 900 nm and formed by electrophoretical deposition, wherein the voltage is 30 V.
Figure 51:
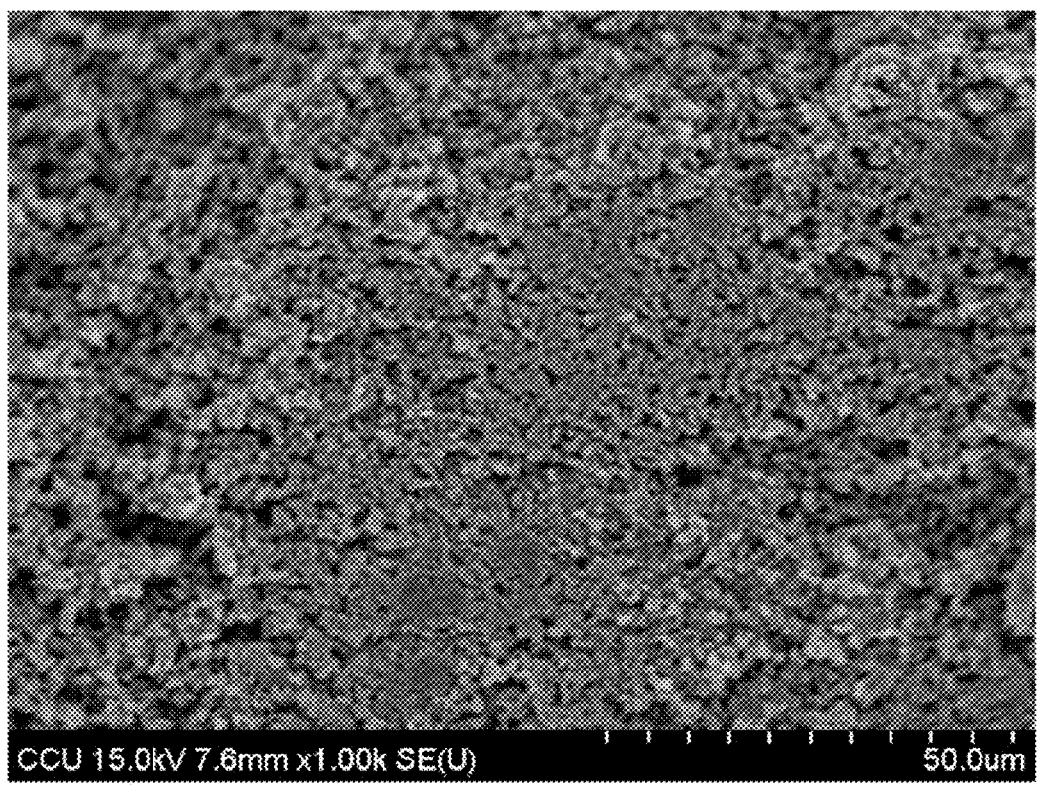
FIG. 51 is an SEM image of a deposited $Cu_{2-x}Se$ thin film made from $Cu_{2-x}Se$ nanoparticles with the grain size about 900 nm and formed by electrophoretical deposition, wherein the voltage is 50 V.
Figure 52:
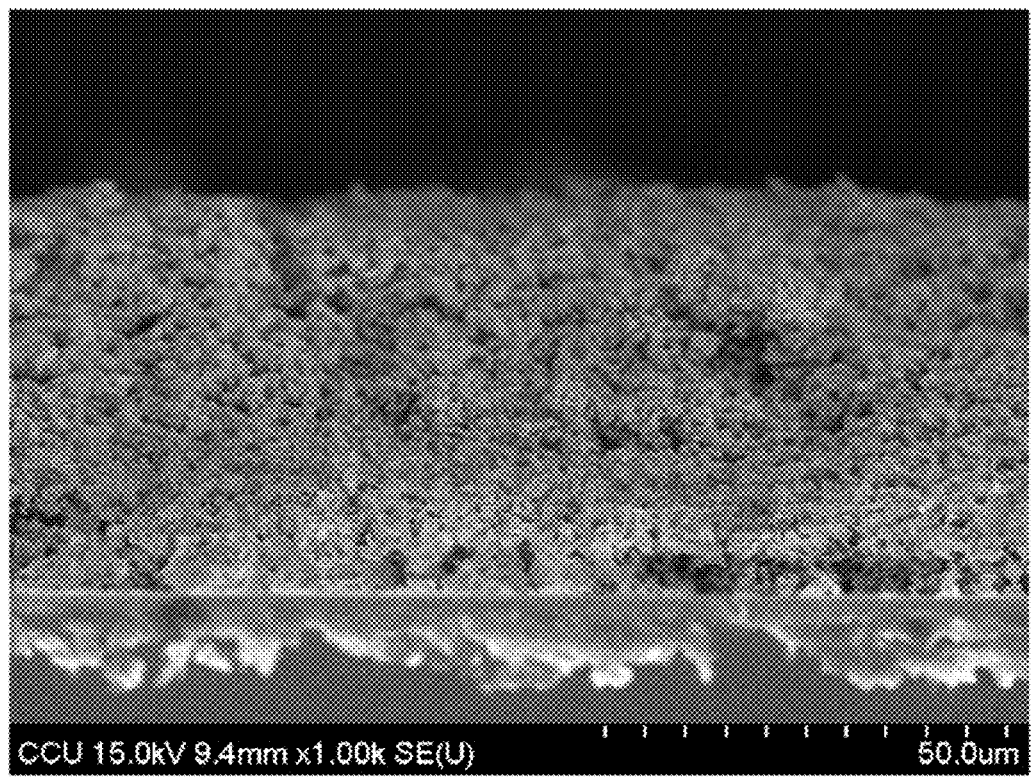
FIG. 52 is an SEM image of a deposited $Cu_{2-x}Se$ thin film made from $Cu_{2-x}Se$ nanoparticles with the grain size about 900 nm and formed by electrophoretical deposition, wherein the voltage is 50 V.
Figure 53:
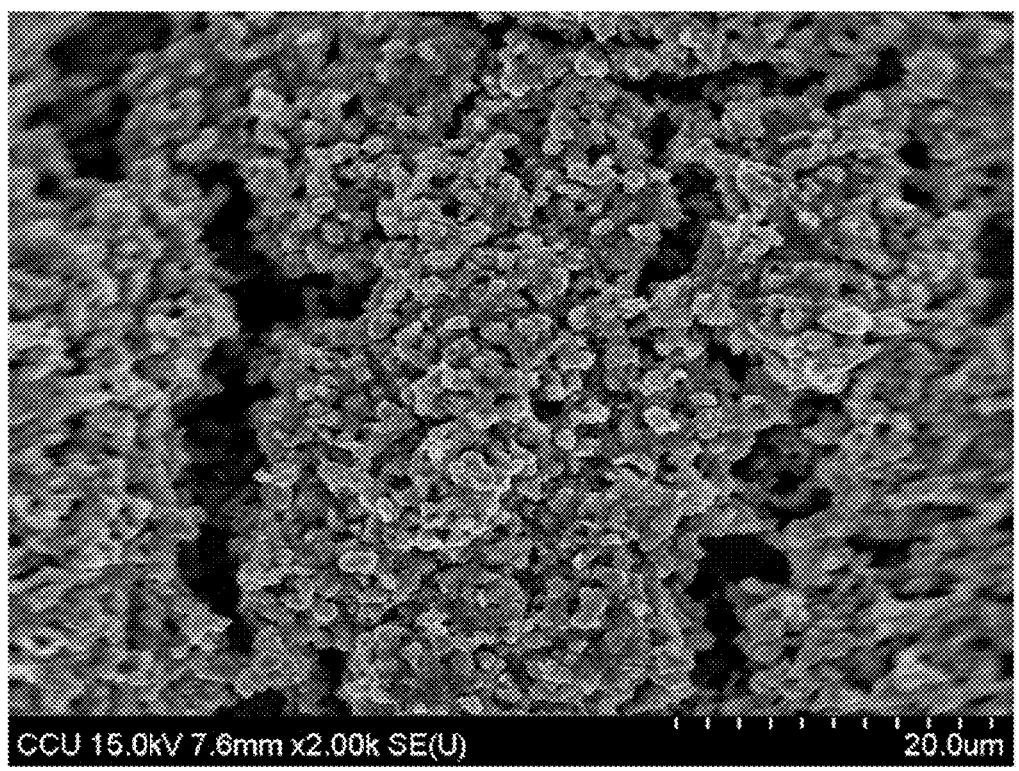
FIG. 53 is an SEM image of a deposited $Cu_{2-x}Se$ thin film made from $Cu_{2-x}Se$ nanoparticles with the grain size about 900 nm and formed by electrophoretical deposition, wherein the voltage is 70 V.
Figure 54:
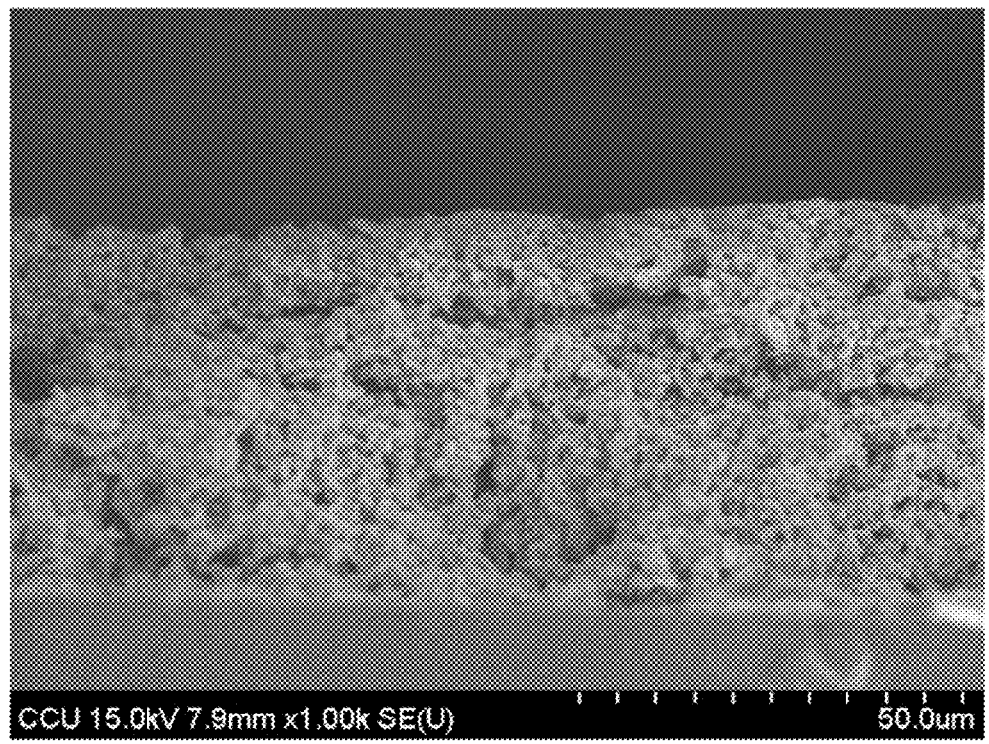
FIG. 54 is an SEM image of a deposited $Cu_{2-x}Se$ thin film made from $Cu_{2-x}Se$ nanoparticles with the grain size about 900 nm and formed by electrophoretical deposition, wherein the voltage is 70 V.
Figure 55:
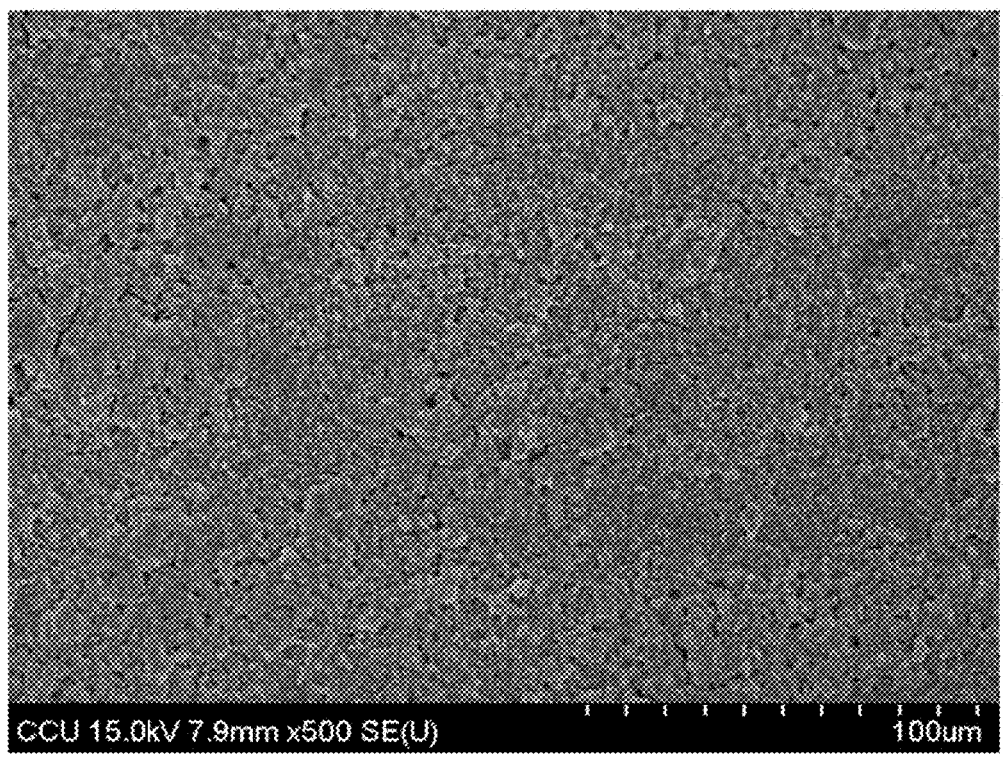
FIG. 55 is an SEM image of a deposited $Cu_{2-x}Se$ thin film made from $Cu_{2-x}Se$ nanoparticles with the grain size about 200 nm and formed by electrophoretical deposition, wherein the voltage is 30 V.
Figure 56:
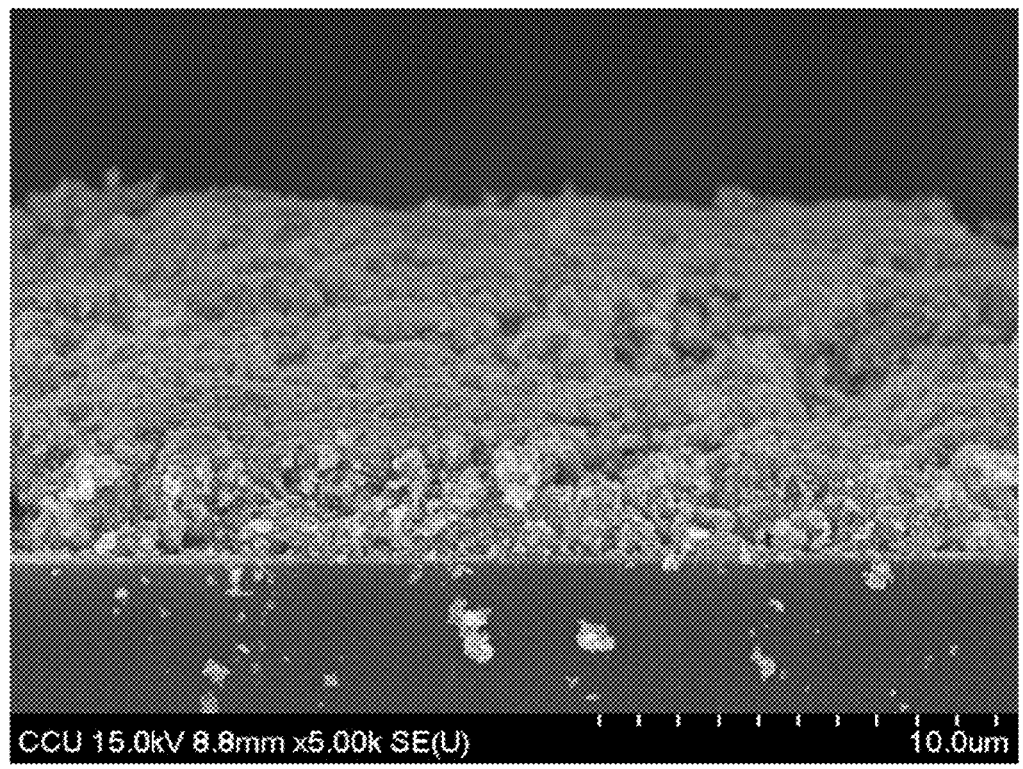
FIG. 56 is an SEM image of a deposited $Cu_{2-x}Se$ thin film made from $Cu_{2-x}Se$ nanoparticles with the grain size about 200 nm and formed by electrophoretical deposition, wherein the voltage is 30 V.
Figure 57:
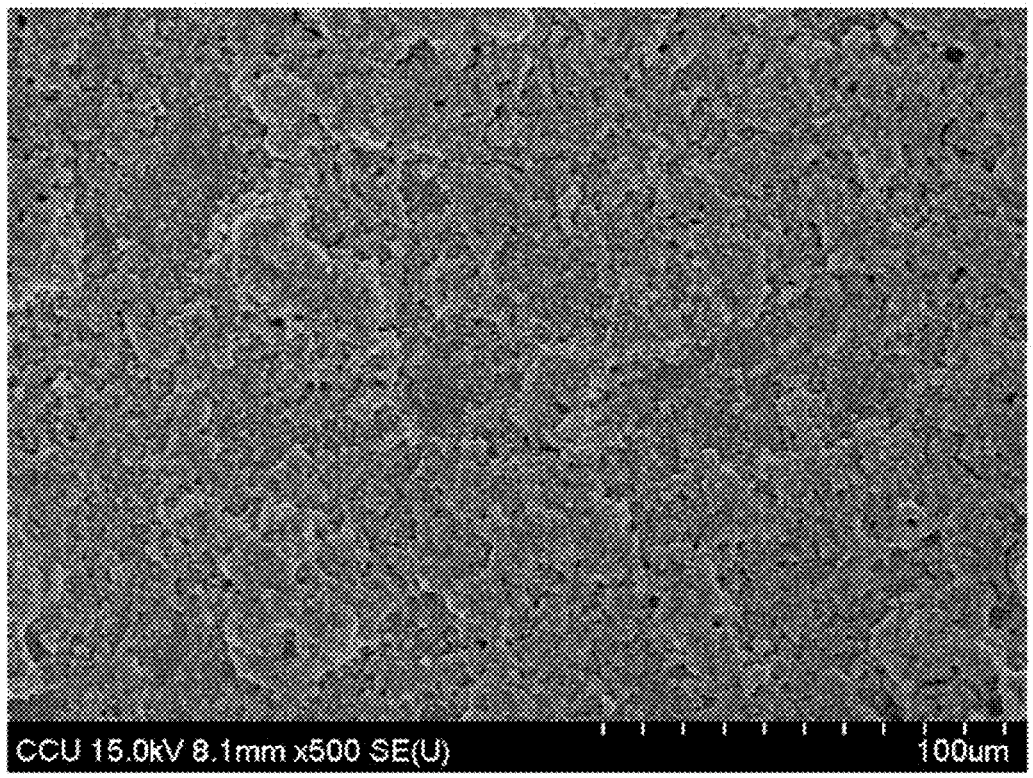
FIG. 57 is an SEM image of a deposited $Cu_{2-x}Se$ thin film made from $Cu_{2-x}Se$ nanoparticles with the grain size about 200 nm and formed by electrophoretical deposition, wherein the voltage is 50 V.
Figure 58:
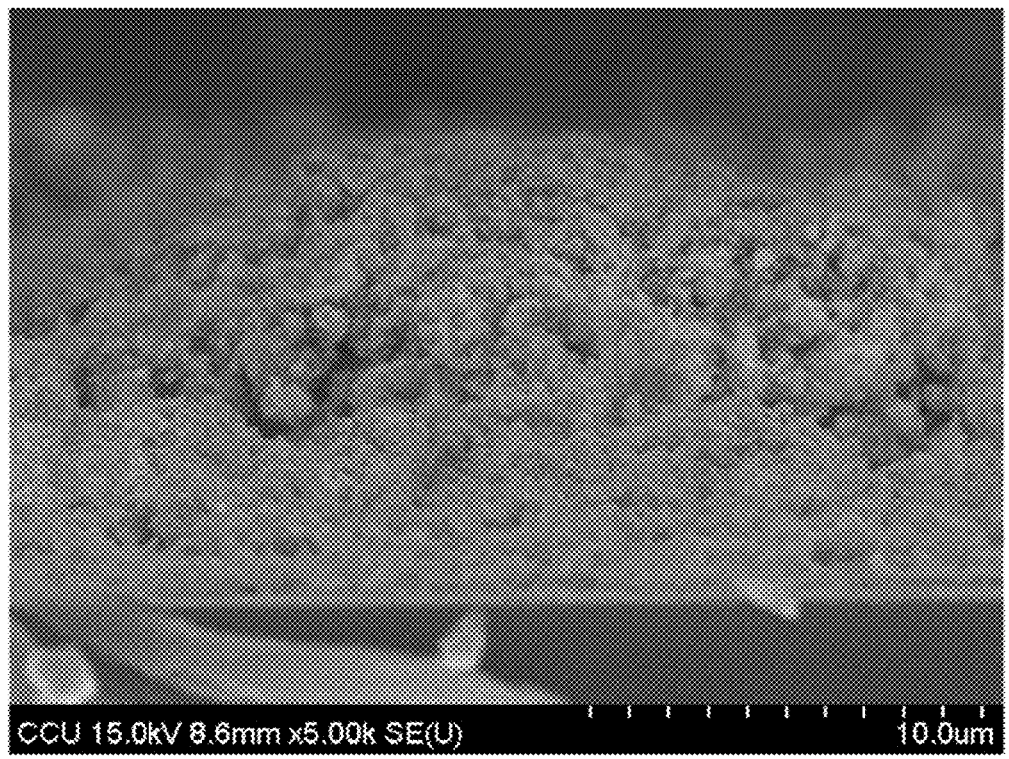
FIG. 58 is an SEM image of a deposited $Cu_{2-x}Se$ thin film made from $Cu_{2-x}Se$ nanoparticles with the grain size about 200 nm and formed by electrophoretical deposition, wherein the voltage is 50 V.
Figure 59:
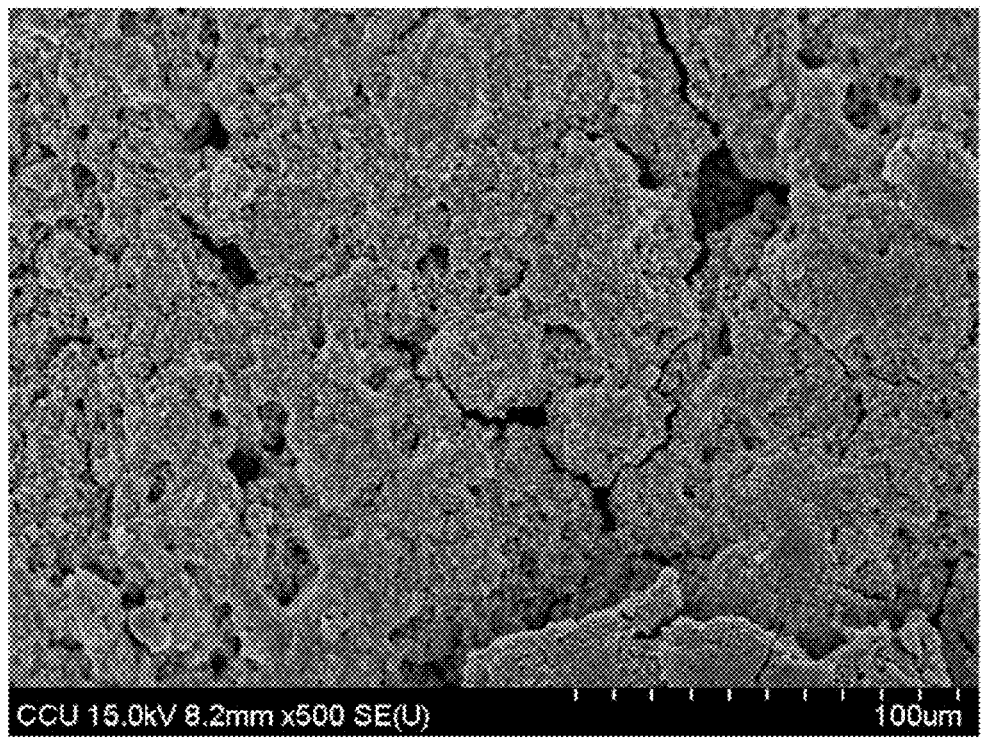
FIG. 59 is an SEM image of a deposited $Cu_{2-x}Se$ thin film made from $Cu_{2-x}Se$ nanoparticles with the grain size about 200 nm and formed by electrophoretical deposition, wherein the voltage is 70 V.
Figure 60:
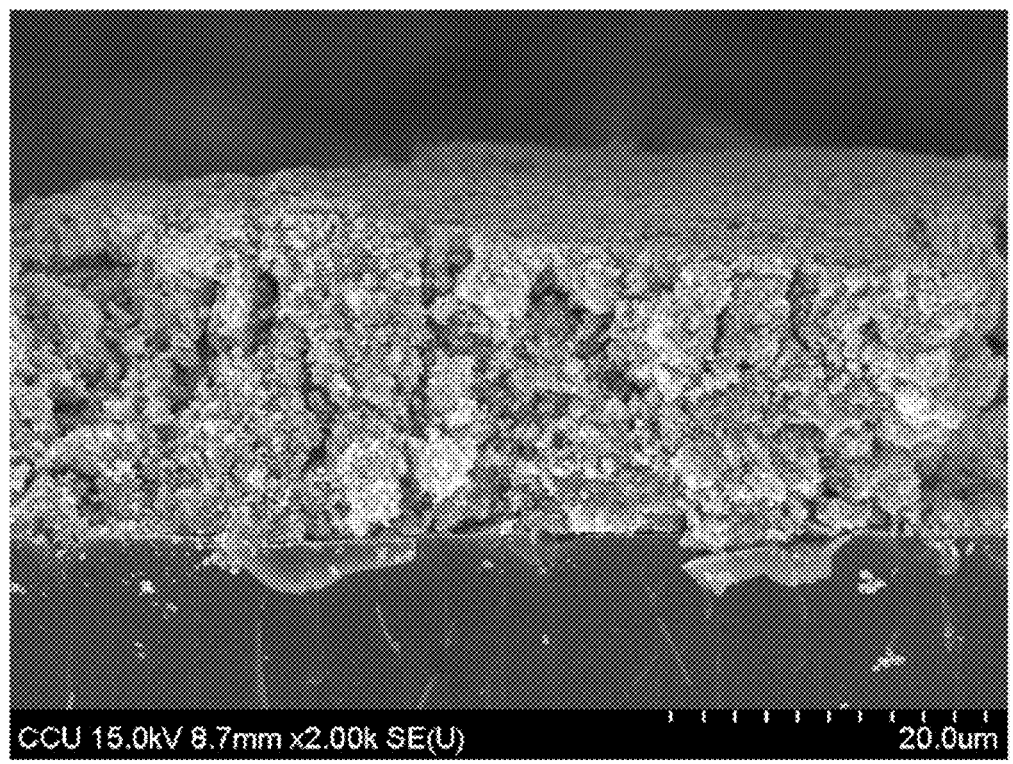
FIG. 60 is an SEM image of a deposited $Cu_{2-x}Se$ thin film made from $Cu_{2-x}Se$ nanoparticles with the grain size about 200 nm and formed by electrophoretical deposition, wherein the voltage is 70 V.

In the present embodiment, a small amount of $Cu_{2-x}Se$ nanoparticles were dissolved in ethanol to obtain an ethanol solution containing $Cu_{2-x}Se$ nanoparticles, and the ethanol solution containing $Cu_{2-x}Se$ nanoparticles was put into a quartz cuvette for measurements, the results are shown in FIG. 47 and FIG. 48. FIG. 47 shows the transmittance result of $Cu_{2-x}Se$ nanoparticles with desired crystalline phase, the peak wavelength thereof is about 810 nm, which is consistent with the publications Pathan, H. M. et al. *Appl. Surf. Sci.* 211, 48 (2003) and Statkute, G. et al. J. Appl. Phys. 105, 113519 (2009). FIG. 48 shows the transmittance result of $Cu_{2-x}Se$ nanoparticles with $Cu_3Se_2$ crystalline phase, indicating little absorption occurs at wavelengths less than 500 nm, which is attributed to the $Cu_3Se_2$ (Eg=2.8 eV).

Besides, transmittance decreases obviously in near infrared region (NIR), which is attributed to the free carrier absorption, with reference to Hessel, C. M. et al. *Nano Lett.* 11, 2560 (2011).

Sixteenth Embodiment

The present embodiment relates to analyses of SEM of deposited $Cu_{2-x}Se$ thin films.

FIG. 49 to FIG. 54 are SEM images of different deposited $Cu_{2-x}Se$ thin films made from $Cu_{2-x}Se$ nanoparticles with grain size of 900 nm and made by different deposition voltages while FIG. 55 to FIG. 60 are SEM images of different deposited $Cu_{2-x}Se$ thin films made from $Cu_{2-x}Se$ nanoparticles with grain size of 200 nm and made by different deposition voltages.

FIG. 49 to FIG. 54 show that the thickness of the deposited $Cu_{2-x}Se$ thin films range from 30 to 60 μm while FIG. 55 to FIG. 60 show that the thickness of the deposited $Cu_{2-x}Se$ thin films ranges from 8 to 20 μm, that is, a large difference exists between the two results. The results of deposited $Cu_{2-x}Se$ thin films made from $Cu_{2-x}Se$ nanoparticles of different grain sizes and made by different deposition voltages are tabulated in Table 6. Table 6 shows that deposited $Cu_{2-x}Se$ thin films made from $Cu_{2-x}Se$ nanoparticles of larger grain size are relatively thicker and less compact, resulting in affecting the properties of the deposited $Cu_{2-x}Se$ thin films, with reference to Nakazawa, T. et al. *Thin Solid films* 464, 360 (2004)

TABLE 6

| Grain size of $Cu_{2-x}Se$ nanoparticles (nm) | Deposition voltage (V)/ Thickness of deposited $Cu_{2-x}Se$ thin films (μm) | | | |
|---|---|---|---|---|
| 900 nm | 30 V 27 μm | 50 V 47 μm | 60 V 52 μm | 70 V 56 μm |
| 200 nm | 30 V 8 μm | 50 V 13 μm | | 70 V 21 μm |

FIG. 55, FIG. 56, FIG. 59 and FIG. 60 show that the thickness of a deposited $Cu_{2-x}Se$ thin film made by electrophoretical deposition is 80 μm when the deposition voltage is 30 V while the thickness of a deposited $Cu_{2-x}Se$ thin film made by electrophoretical deposition is 20 μm when the deposition voltage is 70V. That is, if deposited $Cu_{2-x}Se$ thin films are made by $Cu_{2-x}Se$ nanoparticles of the same weight, the higher the deposition voltage, the thicker the deposited $Cu_{2-x}Se$ thin films, indicating the less compact and worse quality of the deposited $Cu_{2-x}Se$ thin films. Besides, when the deposition voltage is 30 V or 50 V, the surface of the deposited $Cu_{2-x}Se$ thin film is more compact, smoother, and the roughness is smaller. When the deposition voltage is 70 V, the deposited $Cu_{2-x}Se$ thin film has holes, even cracks, which are attributed to the fast deposition rate.

Seventeenth Embodiment

The present embodiment relates to analyses of optical characteristics of deposited $Cu_{2-x}Se$ thin films.

Figure 61:
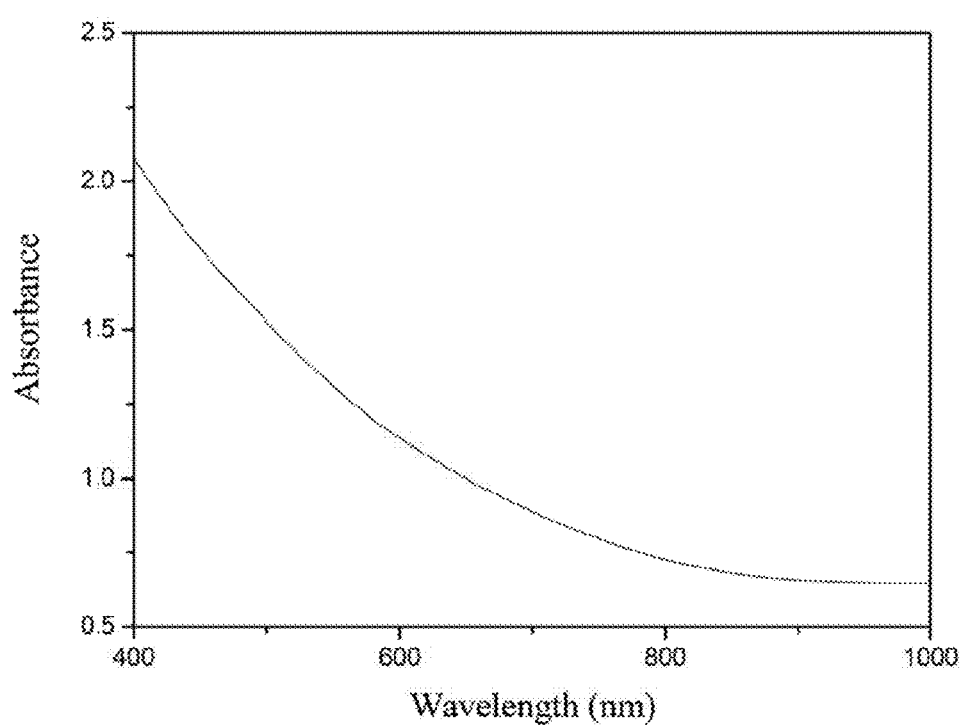
FIG. 61 is an absorption spectrum of a deposited $Cu_{2-x}Se$ thin film.

To obtain absorption spectrum and to calculate band gap (Eg), a deposited $Cu_{2-x}Se$ thin film with a thickness of 2 μm was deposited on an ITO conductive glass by electrophoretical deposition. FIG. 61 shows that a broad absorption band exists in the wavelength region between 800 nm and 1000 nm. From this result, an assumption that more than a band gap exists in the $Cu_{2-x}Se$ material is made.

Figure 62:
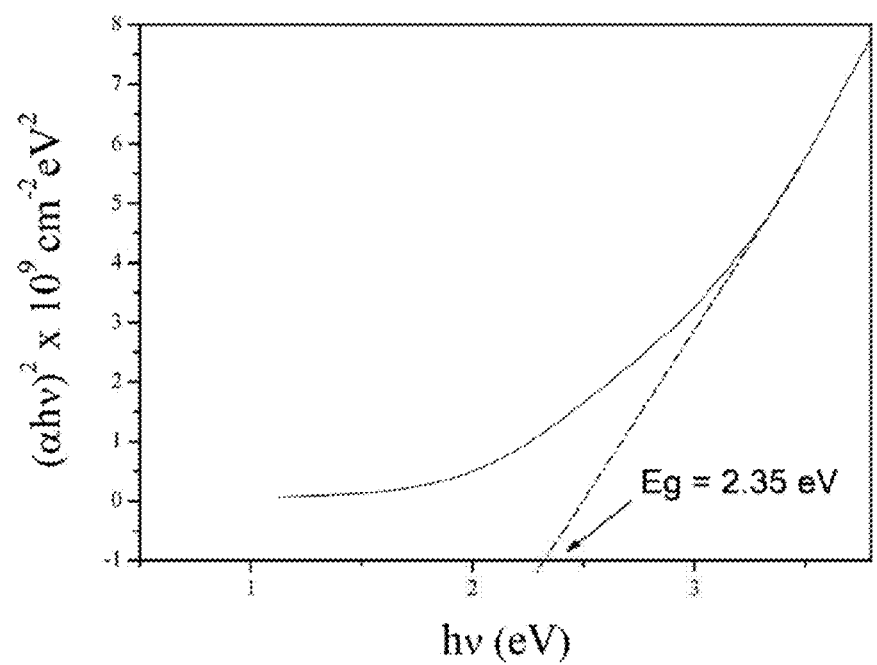
FIG. 62 is a diagram of direct band gap of a deposited $Cu_{2-x}Se$ thin film.
Figure 63:
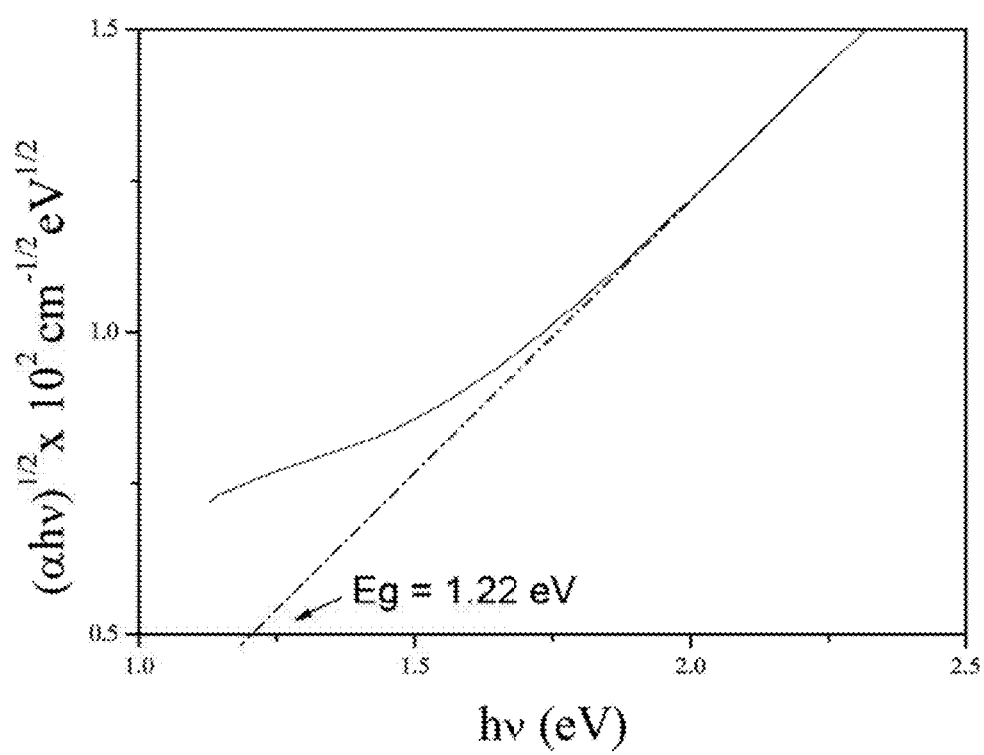
FIG. 63 is a diagram of indirect band gap of a deposited $Cu_{2-x}Se$ thin film.

The equation for calculating Eg is:

$$\alpha h\nu = (h\nu - Eg)m \quad \text{(Eq.5-1)}$$

Wherein α is absorption coefficient of $-\ln(T/100)/t$, T is transmittance (%) and t is thickness of thin film (cm);
hν is photon energy of 1240/λ (nm);
m is ½ (for direct band gap) and 2 (for indirect band gap).
FIG. 62 and FIG. 63 show the results of Eg and photon energy. The direct band gap is about 2.35 eV and the indirect band gap is 1.22 eV, which is consistent with previous publications. From the absorption spectra, the assumption that more than a band gap exists in the $Cu_{2-x}Se$ material is proved.

Eighteenth Embodiment

The present embodiment relates to analyses of packing densities of deposited $Cu_{2-x}Se$ thin films.

Packing density is an important parameter for determining the quality of thin films. With reference to Shionoya, S. et al. *Phosphor Handbook* (CRC Press, Boca Raton, 2006), the equation for calculating packing density is:

$$P = M/At\rho \quad \text{(Eq.5-2)}$$

Wherein
M is the powder weight for making the deposited thin film, A is the area of the deposited thin film, t is the thickness of the deposited thin film and ρ is the density of the powder.

The results obtained from calculation are tabulated in Table 7. Table 7 shows packing densities of different deposited $Cu_{2-x}Se$ thin films made from $Cu_{2-x}Se$ nanoparticles of different grain sizes and made by different deposition voltages and currents.

TABLE 7

| Grain size of $Cu_{2-x}Se$ nanoparticles (nm) | Deposition voltage (V) | Current (mA) | The number of deposition cycles | Packing density (%) |
|---|---|---|---|---|
| 900 nm | 30 V | 4 mA | 55 | 52.4% |
| | 50 V | 8 mA | 45 | 30.7% |
| | 60 V | 10 mA | 36 | 27.2% |
| | 70 V | 13 mA | 30 | 26.1% |
| 200 nm | 30 V | 11 mA | 23 | 62.2% |
| | 50 V | 16 mA | 17 | 46.3% |
| | 70 V | 22 mA | 10 | 26.6% |

Figure 64:
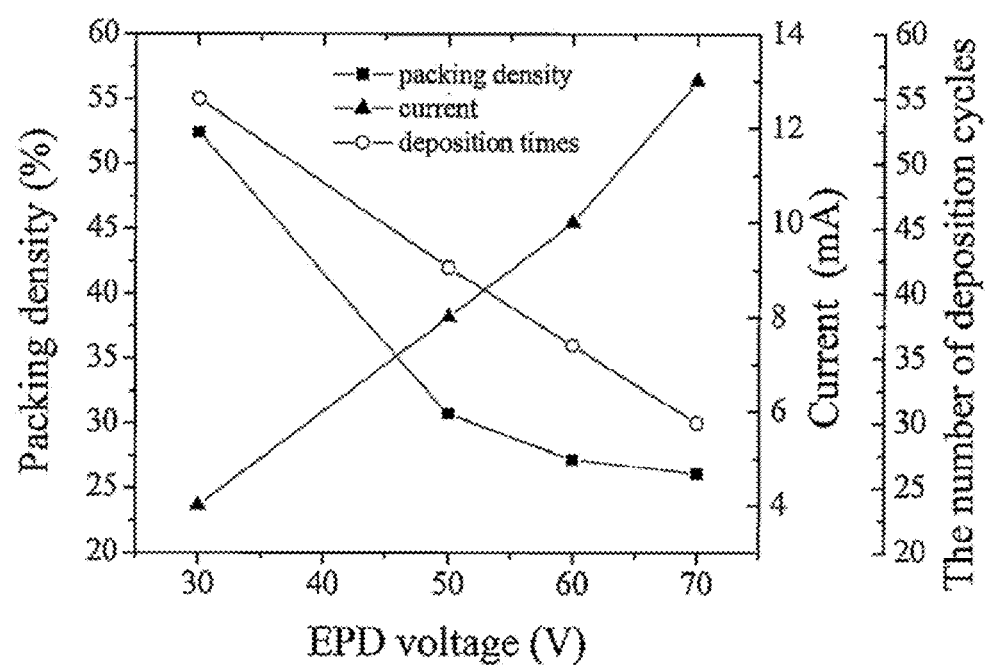
FIG. 64 is a chart of the number of deposition cycles versus current-voltage-packing density of a deposited $Cu_{2-x}Se$ thin film made from $Cu_{2-x}Se$ nanoparticles with grain size of 900 nm.
Figure 65:
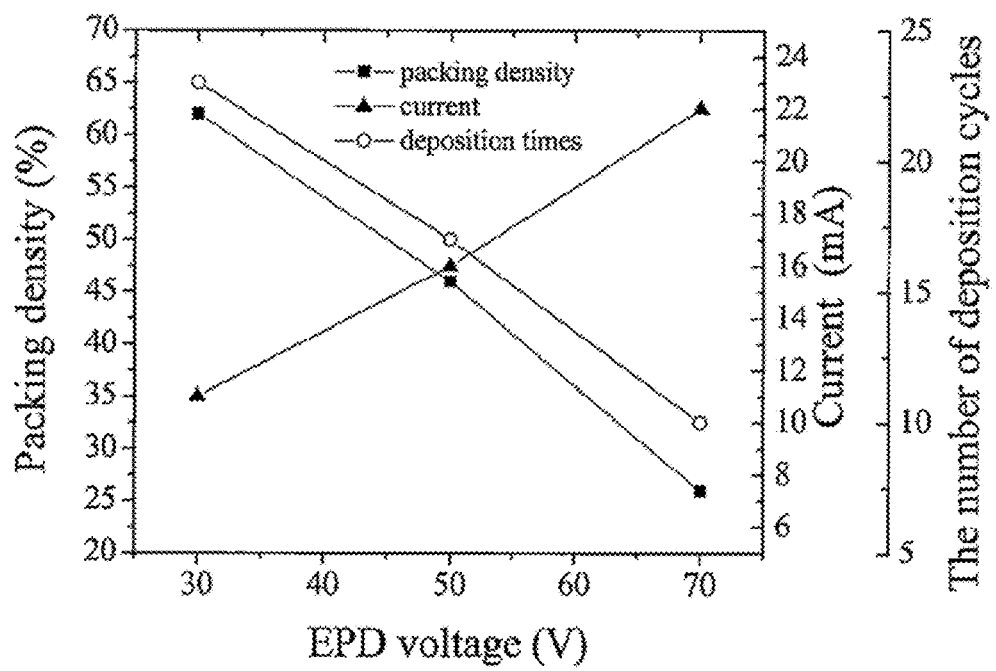
FIG. 65 is a chart of the number of deposition cycles versus current-voltage-packing density of a deposited $Cu_{2-x}Se$ thin film made from $Cu_{2-x}Se$ nanoparticles with grain size of 200 nm.

Current increases with increasing electrophoretical deposition (EPD) voltage, and the packing density decreases, as shown in FIG. 64 and FIG. 65, with reference to Ma, J. et al. *Mater. Lett.* 56, 721 (2002). That is, the rate of EPD directly affects the packing density. A high rate of EPD makes the packing uniform, so defects exist in the thin film, resulting in decreasing quality of the thin film. A low rate of EPD prolongs the deposition time and thus is not efficient.

Comparing FIG. 64 with FIG. 65, the packing density of deposited $Cu_{2-x}Se$ thin films made from $Cu_{2-x}Se$ nanoparticles of smaller grain size by electrophoretical deposition is higher, and the rate of EPD is faster. Under the condition of the same concentration of solution and the same pH value, the zeta potential of $Cu_{2-x}Se$ nanoparticles of smaller grain size is higher and the current is higher as well, so the rate of EPD is faster. In addition, because the grain size of $Cu_{2-x}Se$ nanoparticles is smaller, the packing situation is better and the defects in the thin film are less. In conclusion, the grain size is also an important parameter affecting packing density.

Nineteenth Embodiment

The present embodiment relates to Hall measurements of deposited $Cu_{2-x}Se$ thin films.

The Hall measurements of deposited $Cu_{2-x}Se$ thin films made from $Cu_{2-x}Se$ nanoparticles of different grain sizes by electrophoretical deposition are obtained and the results are tabulated in Table 8. Hall measurements are obtained by applying different deposition voltages.

TABLE 8

| Grain size of $Cu_{2-x}Se$ nanoparticles (nm) | Deposition voltage (V) | Resistivity (Ω-cm) | Carrier concentration (cm$^{-3}$) | Mobility (cm$^2$V$^{-1}$S$^{-1}$) |
|---|---|---|---|---|
| 900 nm | 30 V | 7.64 × 10$^{-3}$ | 1.07 × 10$^{20}$ | 7.62 |
|  | 50 V | 8.26 × 10$^{-2}$ | 1.04 × 10$^{19}$ | 7.22 |
|  | 60 V | 2.08 × 10$^{-1}$ | 6.1 × 10$^{18}$ | 6.75 |
|  | 70 V | 8.41 × 10$^{-1}$ | 1.2 × 10$^{18}$ | 6.05 |
| 200 nm | 30 V | 2.52 × 10$^{-3}$ | 3 × 10$^{20}$ | 7.56 |
|  | 50 V | 9.59 × 10$^{-3}$ | 9.63 × 10$^{19}$ | 6.75 |
|  | 70 V | 7.58 × 10$^{-2}$ | 1.92 × 10$^{19}$ | 4.27 |

Figure 66:
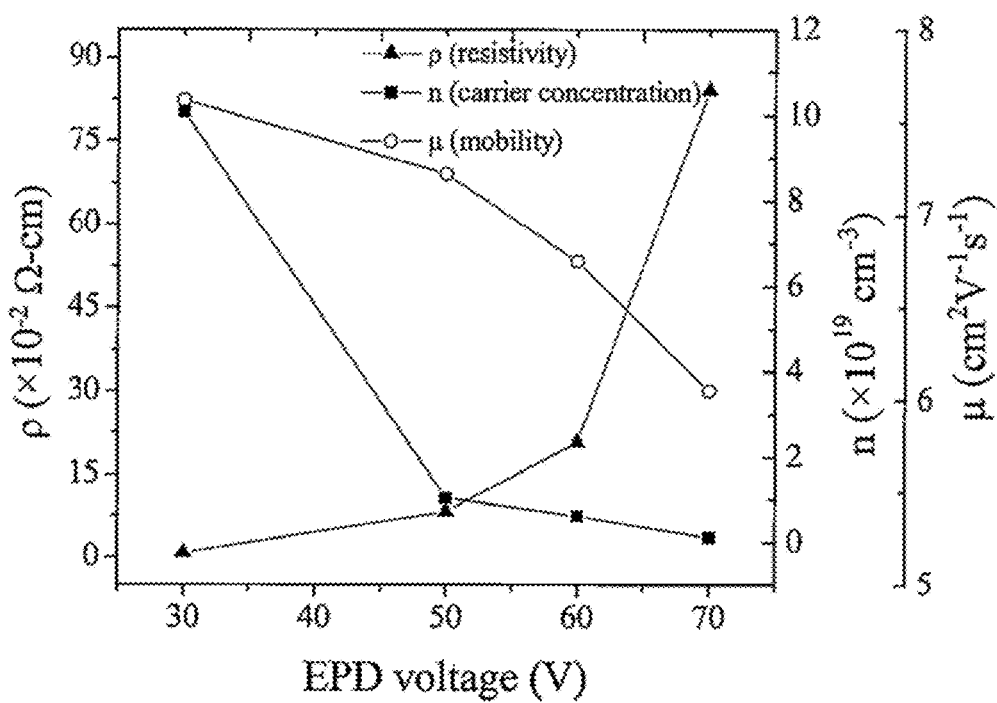
FIG. 66 is a chart of voltage versus properties of a deposited $Cu_{2-x}Se$ thin film measured by Hall measurement, wherein the $Cu_{2-x}Se$ thin film is made from $Cu_{2-x}Se$ nanoparticles with grain size of 900 nm.
Figure 67:
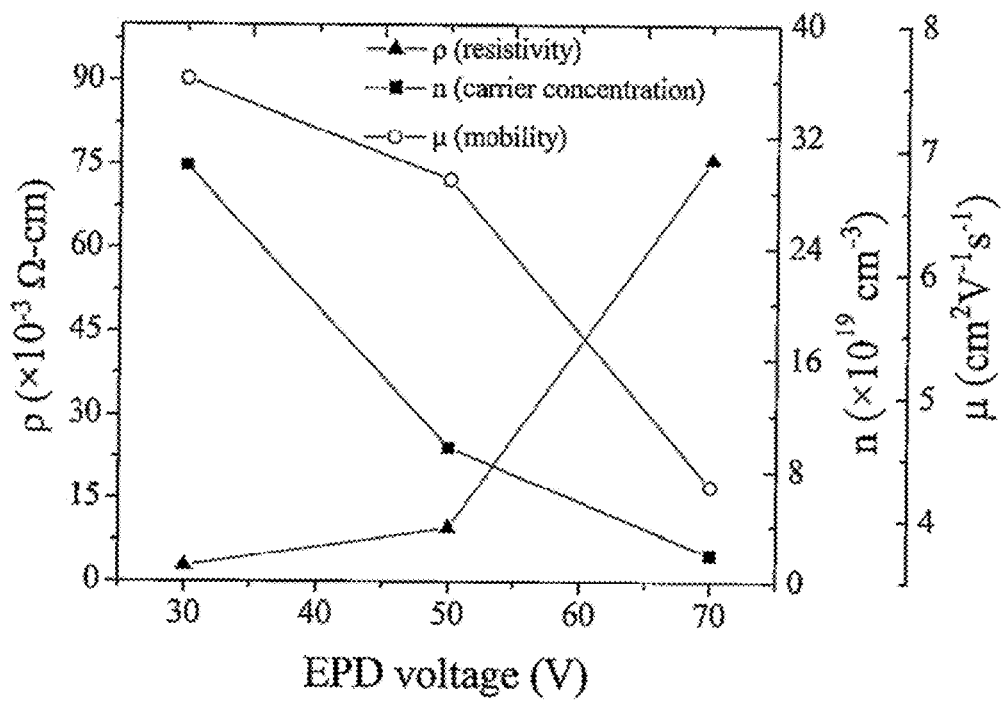
FIG. 67 is a chart of voltage versus properties of a deposited $Cu_{2-x}Se$ thin film measured by Hall measurement, wherein the deposited $Cu_{2-x}Se$ thin film is made from $Cu_{2-x}Se$ nanoparticles with grain size of 200 nm.

FIG. 66 and FIG. 67 show that the lower the deposition voltage, the better the electrical conductivity and the higher the mobility due to the low resistivity. Besides, mobility (μ) decreases with increasing resistivity due to the effect of lattice scattering. FIG. 66 shows that when deposition voltage is 30 V, the resistivity is 8×10$^{-3}$ Ω-cm, the carrier concentration is 10$^{21}$ cm$^{-3}$ and the mobility is 7.5 cm$^2$ V$^{-1}$ s$^{-1}$.

FIG. 67 shows the result of the deposited $Cu_{2-x}Se$ thin film made from $Cu_{2-x}Se$ nanoparticles of smaller grain size by electrophoretical deposition, compared to the previous result, no such big difference in carrier concentration and mobility exists, however, the resistivity is 2.5×10$^3$ Ω-cm, which almost reaches the results of 10$^{-4}$ Ω-cm disclosed in the publication Hiramatsu, H. et al. *J. Appl. Phys.* 104, 113723 (2008). In conclusion, under the same deposition voltage and the same electrophoresis conditions, a deposited $Cu_{2-x}Se$ thin film made from $Cu_{2-x}Se$ nanoparticles of smaller grain size is more compact, the defects in the deposited $Cu_{2-x}Se$ thin film decreases and the electrical conductivity is better.

Twentieth Embodiment

The present embodiment is the comparison between deposited $Cu_{2-x}Se$ thin films of the present invention and deposited $Cu_{2-x}Se$ thin films made by the conventional methods.

TABLE 9

| $Cu_{2-x}Se$ | Manufacturing process; Temperature | resistivity (Ω-cm) | Carrier concentration (cm$^{-3}$) |
|---|---|---|---|
| $Cu_{1.87}Se$ | Sputtering; room temperature | 1.4 × 10$^{-3}$ | 4 × 10$^{20}$ |
| $Cu_{1.84}Se$ | Not mentioned | 1.08 × 10$^{-3}$ | 1.3 × 10$^{21}$ |
| $Cu_{1.83}Se$ | Not mentioned | 4.75 × 10$^{-4}$ | 2.3 × 10$^{21}$ |
| $Cu_{1.76}Se$ | Not mentioned | 3.94 × 10$^{-4}$ | 5 × 10$^{21}$ |
| $Cu_{1.9}Se$ | Evaporation; 40° C. | 2 × 10$^{-4}$ | 1.4 × 10$^{22}$ |
| $Cu_{1.85}Se$ | Evaporation; 200° C. | 5 × 10$^{-4}$ | 1.6 × 10$^{21}$ |
| $Cu_{1.7}Se$ | pulsed laser deposition (PLD); room temperature | 2.22 × 10$^{-4}$ | 1.4 × 10$^{22}$ |
| $Cu_{1.81}Se$ | aerosol-assisted chemical vapor deposition, AACVD; 400° C. | 12.3 | Not mentioned |
| $Cu_{1.68}Se$ | Not mentioned | 1.7 | Not mentioned |
| $Cu_2Se$ | chemical bath deposition (CBD); 95° C. | Not mentioned | 6.68 × 10$^{19}$ |
| $Cu_2Se$ | CBD; room temperature | 10$^{-1}$ | Not mentioned |
| $Cu_{1.9}Se$ | CBD; 90° C. | 2 × 10$^{-2}$ | Not mentioned |
| $Cu_{1.85}Se$ | CBD; room temperature | 2.38 × 10$^{-4}$ | Not mentioned |
| $Cu_{1.8}Se$ | CBD; 20° C. | 5.5 × 10$^{-3}$ | Not mentioned |
| $Cu_{1.95}Se$ | electrophoretical deposition; room temperature | 7.64 × 10$^{-3}$ | 1.07 × 10$^{20}$ |

TABLE 9-continued

| $Cu_{2-x}Se$ | μ (cm$^2$/vs) | References |
|---|---|---|
| $Cu_{1.87}Se$ | 3.3 | Li, Y. Z. et al. *J Alloys Compd.* 505, 623 (2010) |
| $Cu_{1.84}Se$ | 4.5 | |
| $Cu_{1.83}Se$ | 5.5 | |
| $Cu_{1.76}Se$ | 2.5 | |
| $Cu_{1.9}Se$ | 2.6 | Okimura, H. et al. *Thin Solid Films.* 71, 53 (1980) |
| $Cu_{1.85}Se$ | 9.4 | |
| $Cu_{1.7}Se$ | 2.1 | Hiramatsu, H. et al. *J Appl Phys*, 104, 113723 (2008) |
| $Cu_{1.81}Se$ | Not mentioned | Hu, Y. et al. *J Cryst Growth*, 297, 61 (2006) |
| $Cu_{1.68}Se$ | Not mentioned | |
| $Cu_2Se$ | Not mentioned | Mane, R. S. et al. *Vacuum*, 80, 631 (2006) |
| $Cu_2Se$ | Not mentioned | Pathan, H. M. et al. *Appl Surf Sci*, 211, 48 (2003) |
| $Cu_{1.9}Se$ | Not mentioned | Padam, G. K. *Thin Solid Films*, 150, L89 (1987) |
| $Cu_{1.85}Se$ | Not mentioned | Garcia, V. M. et al. *J Cryst Growth*, 203, 113 (1999) |
| $Cu_{1.8}Se$ | Not mentioned | Bhuse, V. M. et al. *Mater Chem Phys*, 80, 82 (2003) |
| $Cu_{1.95}Se$ | 7.62 | The present invention |

Table 9 shows comparisons between resistivity, carrier concentration and mobility of the deposited $Cu_{2-x}Se$ thin film of the present invention and resistivity, carrier concentration and mobility of deposited $Cu_{2-x}Se$ thin films made by the conventional methods. The deposited $Cu_{2-x}Se$ thin films made by vacuum deposition techniques such as evaporation, sputtering and pulsed laser deposition have the lowest resistivity, which is smaller than 10$^{-4}$-cm. On the other hand, the resistivity of the deposited $Cu_{2-x}Se$ thin films made by non-vacuum deposition techniques such as chemical bath deposition is at least one order larger than the resistivity of the deposited $Cu_{2-x}Se$ thin films made by vacuum deposition techniques. The resistivity of $Cu_{1.95}Se$ thin films made by the method of the present invention approaches close to the resistivity of deposited $Cu_{2-x}Se$ thin film made by the chemical bath deposition, but is still higher than the resistivity of deposited $Cu_{2-x}Se$ thin film made by sputtering.

In conclusion, the present invention successfully synthesizes $Cu_{2-x}Se$ nanoparticles by pyrolysis, and reaction time, reaction temperature, ratio of TOP/Se and ratio of Cu/Se are changed to study the crystalline phase and grain size of the $Cu_{2-x}Se$ nanoparticles. When the ratio of Cu/Se is 2/1.1, the ratio of TOP/Se is 4/1, the reaction temperature is 210° C. and the reaction time is 8 hours, an optimum $Cu_{2-x}Se$ nanoparticle is obtained. An indirect method such as using ultrasonicator to break a $Cu_{2-x}Se$ nanoparticle into pieces is used. In the present invention, the $Cu_{2-x}Se$ nanoparticle made by the aforementioned method is also used to deposit a $Cu_{2-x}Se$ thin film by electrophoretical deposition, and parameters such as pH value and voltage are changed and measurements such as SEM and Hall measurements are taken to optimize the deposited $Cu_{2-x}Se$ thin film made by electrophoretical deposition, and the best condition of pH value is 1 and voltage is 3 V.

The special technical feature of the present invention is to obtain dispersive nanoparticles of small grain size made by injection at high temperature over 300° C. and with a short reaction time, and the deposited $Cu_{2-x}Se$ thin film made from the nanoparticles by electrophoretical deposition is also within the scope of the present invention.

Moreover, applying high temperature sintering to the deposited $Cu_{2-x}Se$ thin films to decrease defects and improve electrical conductivity is also within the scope of the present invention.

Similarly, depositing a buffer layer such as Cds or $In_2S_3$, a window layer such as ZnO and an upper electrode such as Al:ZnO (AZO) on the deposited $Cu_{2-x}Se$ thin films to fabricate copper selenide solar cell devices and adjust the manufacturing parameters to fabricate a high efficiency and low-cost copper selenide solar cell is also within the scope of the present invention.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A method for making a deposited $Cu_{2-x}Se$ thin film by electrophoresis comprising steps of:
    preparing an ethanol solution containing $Cu_{2-x}Se$ nanoparticles;
    sonicating the ethanol solution containing $Cu_{2-x}Se$ nanoparticles for a predetermined period and adjusting a pH value of the ethanol solution containing $Cu_{2-x}Se$ nanoparticles;
    preparing a steel substrate and an indium tin oxide (ITO) substrate wherein the two substrates are of the same size, followed by washing the steel substrate with acetone and deionized (DI) water and washing the ITO substrate with DI water, and then drying the two substrates;
    in an inert atmosphere, connecting a power supply with a positive electrode and a negative electrode to the ethanol solution containing $Cu_{2-x}Se$ nanoparticles, which has been sonicated for the predetermined period, wherein the positive electrode is connected to the steel substrate and the negative electrode is connected to the ITO substrate and a predetermined distance exists between the steel substrate and the ITO substrate to facilitate depositing a $Cu_{2-x}Se$ thin film by electrophoretical deposition; and
    drying the depositing $Cu_{2-x}Se$ thin film after the electrophoretical deposition to obtain the deposited $Cu_{2-x}Se$ thin film.

2. The method for making a deposited $Cu_{2-x}Se$ thin film by electrophoresis according to claim 1, wherein depositing a $Cu_{2-x}Se$ thin film by electrophoretical deposition lasts three minutes and is carried out for one time or multiple times, and after the electrophoretical deposition, the ethanol solution containing $Cu_{2-x}Se$ nanoparticles is sonicated for 5 minutes and is followed by drying to obtain the deposited $Cu_{2-x}Se$ thin film.

3. The method for making a deposited $Cu_{2-x}Se$ thin film by electrophoresis according to claim 1, wherein the predetermined period is 3 days.

4. The method for making a deposited $Cu_{2-x}Se$ thin film by electrophoresis according to claim 1, wherein the $Cu_{2-x}Se$ nanoparticles are made by a method for making $Cu_{2-x}Se$ nanoparticles comprising steps of:
    in an inert atmosphere and at a ratio of 3 mmol of copper (I) chloride/per 6 mL of 1-Dodecanethiol and 12 mL of 1-Octadecene, dissolving copper (I) chloride in 1-Dodecanethiol and then adding 1-Octadecene into the 1-Dodecanethiol to form a resulting solution, followed by stirring the resulting solution and heating the resulting solution to 180° C. to obtain a copper (I) chloride solution;
    adding selenium powder into Tri-n-octylphosphine and then heating the resulting solution to 50° C. and stirring the resulting solution 50° C. to obtain a selenium solution;
    when the copper (I) chloride solution is heated to 180° C., adding the selenium solution rapidly into the copper (I) chloride solution at 180° C. to obtain a solution containing copper (I) chloride and selenium;
    stirring and heating the solution containing copper (I) chloride and selenium at a predetermined temperature to 180° C. for a predetermined time;
    after the reaction is completed, cooling down the solution containing copper (I) chloride and selenium rapidly to 45° C., followed by adding acetone into the solution containing copper (I) chloride and selenium to precipitate $Cu_{2-x}Se$, stirring the solution containing copper (I) chloride and selenium at 45° C. for 10 minutes and then obtaining a supernatant liquor and particles by centrifugation;
    removing the supernatant liquor to keep the particles, adding chloroform and methanol to the particles at a ratio of chloroform to methanol of 1:3 to obtain a mixed solution; sonicating the mixed solution for 10 minutes and operating centrifugation to obtain particles; and
    drying the obtained particles to obtain $Cu_{2-x}Se$ nanoparticles.

5. The method for making a deposited $Cu_{2-x}Se$ thin film by electrophoresis according to claim 4, wherein the predetermined temperature is 180° C. or 210° C.

6. The method for making a deposited $Cu_{2-x}Se$ thin film by electrophoresis according to claim 4, wherein the step of adding chloroform and methanol to the particles at a ratio of chloroform to methanol of 1:3 to obtain a mixed solution and operating centrifugation to obtain particle after sonicating the mixed solution for 10 minutes is repeated three times.

7. The method for making a deposited $Cu_{2-x}Se$ thin film by electrophoresis according to claim 4, wherein the ratio of copper/Selenium is 2/1.1, the ratio of Tri-n-octylphosphine/selenium is 4/1, the predetermined temperature is 210° C. and the predetermined time is 18 hours.

8. The method for making a deposited $Cu_{2-x}Se$ thin film by electrophoresis according to claim 4, wherein the amount of Copper (I) Chloride is 3 mmol, the amount of 1-Dodecanethiol is 6 mL, the amount of 1-Octadecene is 12 mL, the amount of Selenium is 1.64 mmol and the amount of Tri-n-octylphosphine is 2.7 mmol.

9. The method for making a deposited $Cu_{2-x}Se$ thin film by electrophoresis according to claim 4, wherein the adjusted ph value of the ethanol solution containing $Cu_{2-x}Se$ nanoparticles is 1 and the voltage of depositing a $Cu_{2-x}Se$ thin film by electrophoretical deposition is 30 V.

* * * * *